(12) United States Patent
Haigh

(10) Patent No.: US 9,595,536 B1
(45) Date of Patent: *Mar. 14, 2017

(54) STANDARD CELL LIBRARY THAT INCLUDES 13-CPP AND 17-CPP D FLIP-FLOP CELLS, WITH DFM-OPTIMIZED M0 CUTS AND V0 ADJACENCIES

(71) Applicant: PDF Solutions, Inc., San Jose, CA (US)

(72) Inventor: Jonathan Haigh, Pittsburgh, PA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/134,420

(22) Filed: Apr. 21, 2016

Related U.S. Application Data

(63) Continuation of application No. 15/131,020, filed on Apr. 17, 2016, which is a continuation-in-part of application No. 15/067,252, filed on Mar. 11, 2016.

(51) Int. Cl.
*H01L 27/088* (2006.01)
*H01L 27/118* (2006.01)
*G06F 17/50* (2006.01)
*H01L 23/528* (2006.01)
*H01L 27/02* (2006.01)
*H01L 23/522* (2006.01)

(52) U.S. Cl.
CPC .... *H01L 27/11807* (2013.01); *G06F 17/5068* (2013.01); *H01L 23/528* (2013.01); *H01L 23/5226* (2013.01); *H01L 27/0207* (2013.01); *H01L 2027/11837* (2013.01)

(58) Field of Classification Search
CPC ........... H01L 27/11807; H01L 27/0207; H01L 23/5226; H01L 23/528; H01L 2027/11837; G06F 17/5068
See application file for complete search history.

(56) References Cited

U.S. PATENT DOCUMENTS

| | | | | |
|---|---|---|---|---|
| 7,487,474 B2 * | 2/2009 | Ciplickas | ............ | G06F 17/5045 716/112 |
| 7,919,792 B2 * | 4/2011 | Law | ..................... | H01L 27/0207 257/202 |
| 8,726,217 B2 * | 5/2014 | Gullette | .............. | G06F 17/5081 716/126 |
| 9,202,820 B1 * | 12/2015 | Haigh | ................ | H01L 27/11807 |
| 2016/0111421 A1 * | 4/2016 | Rodder | ............... | H01L 27/0886 257/401 |

OTHER PUBLICATIONS

V. Timoshkov, et al., "Imaging challenges in 20nm and 14nm logic nodes: hot spots performance in Metal1 layer," 29th European Mask and Lithography Conference, Jun. 30, 2013.
P. Mishra, et al., "FinFET Circuit Design," Springer Science+Business Media, LLC, 2011.

(Continued)

*Primary Examiner* — Naum B Levin

(57) ABSTRACT

A library of a DFM-improved standard logic cells that avoid pattern-degrading configurations in the M0 and/or V0 layer(s), and includes 13-CPP and 17-CPP D flip-flop cells, is disclosed, along with wafers, chips and systems constructed from such cells.

27 Claims, 372 Drawing Sheets an2x2

(56) References Cited

OTHER PUBLICATIONS

A. B. Kahng, "Lithography-Induced Limits to Scaling of Design Quality," Proc. SPIE 9053, Design-Process-Technology Co-optimization for Manufacturability VIII, Mar. 28, 2014.
C. Piguet, "Microelectronics for Systems on Chips," Lecture notes for Chapter 1, Part 1, 2014.
C. Piguet, "Microelectronics for Systems on Chips," Lecture notes for Chapter 1, Part 2, 2014.
C. Piguet, "Microelectronics for Systems on Chips," Lecture notes for Chapter 2, Part 1, 2014.
C. Piguet, "Microelectronics for Systems on Chips," Lecture notes for Chapter 2, Part 2, 2014.
J. Baker, "CMOS: circuit design, layout, and simulation (3rd ed.)," John Wiley & Sons, 2010.
J. Wright, "Standard Cell Libraries for use in Mixed Signal Circuits," EE Times, Nov. 7, 2000.
E. N. Shauly, "CMOS Leakage and Power Reduction in Transistors and Circuits: Process and Layout Considerations," Journal of Low Power Electronics and Applications, Jan. 27, 2012.
K. Vaidyanathan, et al., "Design implications of extremely restricted patterning," Journal of Micro/Nanolithography, MEMS, and MOEMS, Oct. 3, 2014.
R. Aitken, "Physical design and FinFETs," Keynote address, Proceedings of the 2014 on International symposium on physical design, Mar. 30, 2014.
T.-J. K. Liu, "Bulk CMOS Scaling to the End of the Roadmap," Symposium on VLSI Circuits Short Course, Jun. 13, 2012.
A. J. Al-Khalili, "ASIC Design," Lecture notes from Concordia University course, date unknown.
J. Warnock, "Circuit and PD Challenges at the 14nm Technology Node," Advanced Technologies and Design for Manufacturability, ISPD 2013, Mar. 24, 2013.
J. Sulistyo, "Development of CMOS Standard Cell Library," VTVT Group, Virginia Information Systems Center, Oct. 31, 2014.
No author, no title, slides from Concordia VLSI Design Lab, pp. 1-90, date unknown.
A. Biddle, "Design Solutions for 20nm and Beyond," White Paper, Synopsys, pp. 1-10, Jun. 2012.
P. De Bisschop, et al., "Joint-Optimization of Layout and Litho for SRAM and Logic towards the 20 nm node, using 193i," Proc. SPIE 7973, Optical Microlithography, Mar. 23, 2011.
B. Yu, "Design for Manufacturability: From Ad Hoc Solution to Extreme Regular Design," VLSI Circuits and Systems Letter, Oct. 18, 2015.
R. S. Ghaida, et al., "Single-Mask Double-Patterning Lithography for Reduced Cost and Improved Overlay Control," IEEE Transactions on Semiconductor Manufacturing, pp. 93-103, Feb. 2011.
A. B. Kahng, "Futures at the IC Design-Manufacturing Interface," UCSD VLSI CAD Laboratory, date unknown.
Guc, "The Challenge and Experience Sharing on 16nm Chip Implementation," 2014.
M. Smayling, "Gridded Design Rules: 1-D Approach Enables Scaling of CMOS Logic," Nanochip Technology Journal, pp. 33-37, 2008.
M. P. Sole, "Layout Regularity for Design and Manufacturability,"Ph.D. Thesis, Universitat Politecnica de Catalunya, Jul. 8, 2012.

* cited by examiner sdffqx1_alt mux2x1_alt

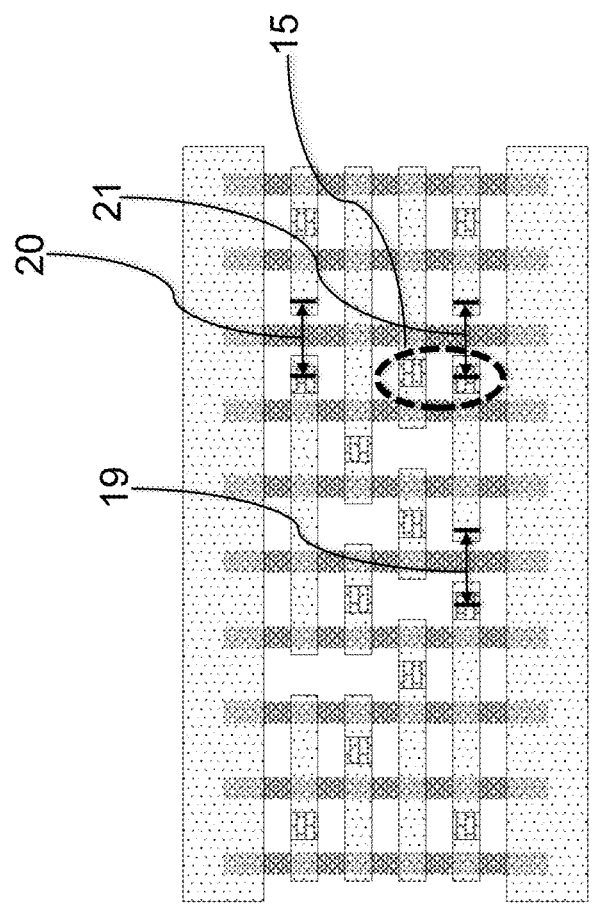

an2x1 an2x1 an2x1 an2x1 an2x2 an2x2 an2x2 an2x2 an3x1 an3x1 an3x1 an3x1 an3x2 an3x2 an3x2 an3x2 an4x1 an4x1 an4x1 an4x2 an4x2 an4x2 an4x2 ao21x1 ao21x1 ao21x1 ao21x1 ao31x1 ao31x1 ao31x1 ao31x1 ao211x1 ao211x1 ao211x1 ao211x1 aoi21x1 aoi21x1 aoi21x1 aoi21x1 aoi21x2 aoi21x2 aoi21x2 aoi21x2 aoi22x1 aoi22x1 aoi22x1 aoi22x1 aoi22x2 aoi22x2 aoi22x2 aoi22x2 aoi31x1 aoi31x1 aoi31x1 aoi31x1 aoi31x2 aoi31x2 aoi31x2 aoi31x2 aoi211x1 aoi211x1 aoi211x1 aoi211x1 aoi222x1 aoi222x1 aoi222x1 aoi222x1 bufhx6 bufhx6 bufhx6 bufx1 bufx1 bufx1 bufx1 bufx2 bufx2 bufx2 bufx2 bufx3 bufx3 bufx3 bufx3 bufx4 bufx4 bufx4 bufx6 bufx6 bufx6 bufx6 bufx8

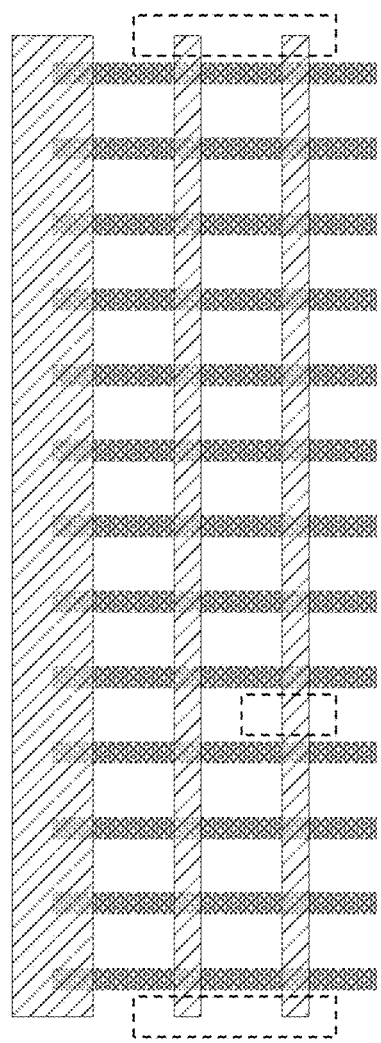

bufx8 bufx8 ckor2lban2x1 ckor2lban2x1 ckor2lban2x1 dlyx1 dlyx1 dlyx1 fax1 fax1 iaoi21x1 iaoi21x1 iaoi21x1 iaoi21x1 ind2x1 ind2x1 ind2x1 ind2x2 ind2x2 ind2x2 ind2x2 ind3x1 ind3x1 ind3x1 ind3x2 ind3x2 ind3x2 inr2x1 inr2x1 inr2x1 inr2x1 inr2x2 inr2x2 inr2x2 inr3x1 inr3x1 inr3x1 inr3x1 inr3x2 inr3x2 inr3x2 inr3x2 invx1 invx1 invx1 invx1 invx2 invx2 invx2 invx2 invx4 invx4 invx4 invx4 invx6 invx6 invx6 invx6 invx8 invx8 invx8 invx8 ioai21x1 ioai21x1 ioai21x1 ioai21x1 latqx1 latqx1 latqx1 mux2x1 mux2x1 mux2x2 mux2x2

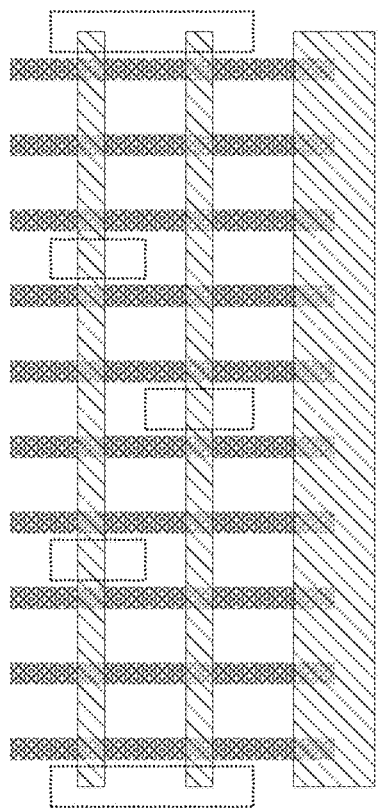
FIG. 48C — mux2x2 mux2x2 muxi2x1 mux2x1 nd2x1 nd2x1 nd2x1 nd2x2 nd2x2 nd2x2 nd2x2 nd2x3 nd2x3 nd2x3 nd2x3 nd2x4 nd2x4 nd2x4 nd2x4 nd3x1 nd3x1 nd3x1 nd3x1

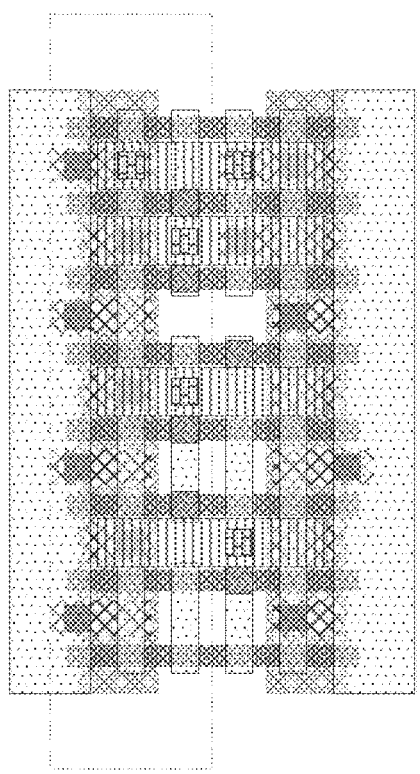
FIG. 55A  nd3x2 nd3x2 nd3x2 nd3x3 nd3x3 nd3x3 nd3x4 nd3x4 nd3x4 nd4x1 nd4x1 nd4x1 nd4x1 nd4x2 nd4x2 nd4x2 nd4x2 nr2x1 nr2x1 nr2x1 nr2x1 nr2x2 nr2x2 nr2x2 nr2x2

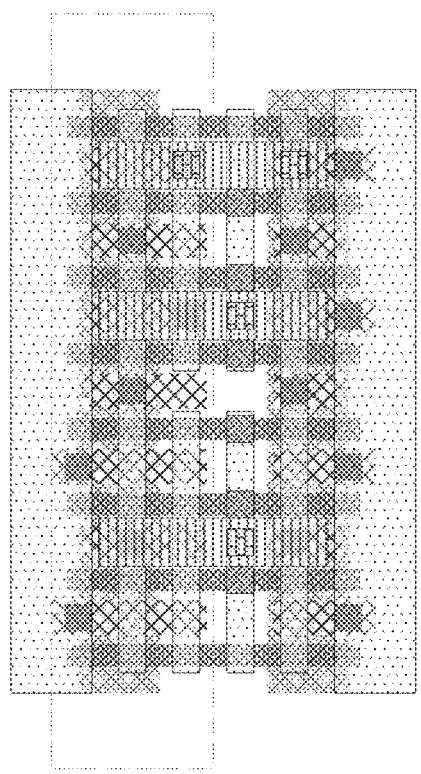
nr2x3
FIG. 61.1A

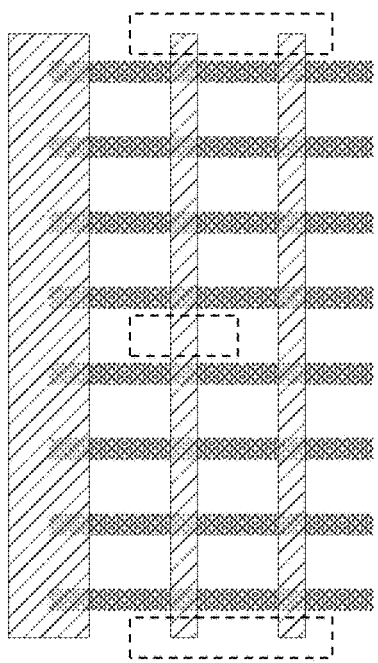
FIG. 61.1B

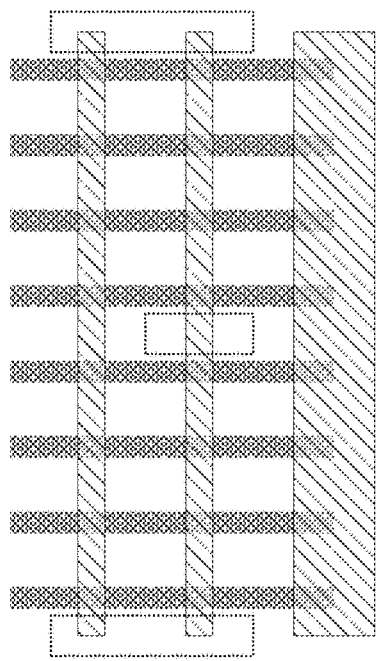
nr2x3
FIG. 61.1C

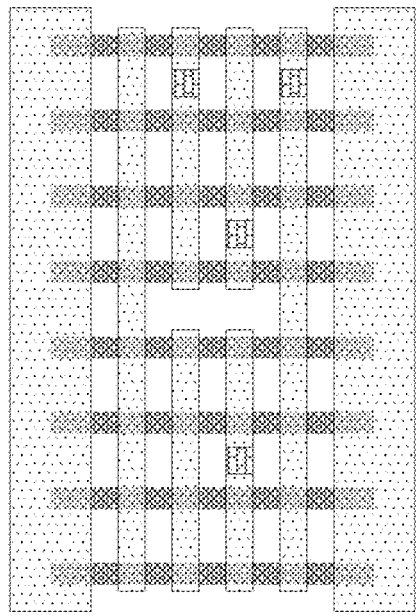
nr2x3
FIG. 61.1D nr2x4 nr2x4 nr2x4 nr3x1 nr3x1 nr3x1 nr3x1 nr3x2 nr3x2 nr3x2 nr3x2 nr3x3 nr3x3 nr3x4 nr3x4 nr3x4 nr4x1 nr4x1 nr4x1 nr4x1 nr4x2 nr4x2 nr4x2 nr4x2 oa21x1 oa21x1 oa21x1 oa21x1 oa31x1 oa31x1 oa31x1 oa31x1 oa211x1 oa211x1 oa211x1 oai21x1 oai21x1 oai21x1 oai21x1 oai21x2 oai21x2 oai21x2 oai21x2 oai22x1 oai22x1 oai22x1 oai22x1 oai22x2 oai22x2 oai22x2 oai22x2 oai31x1 oai31x1 oai31x1 oai31x1 oai31x2 oai31x2 oai31x2 oai31x2 oai211x1 oai211x1 oai211x1 oai211x1 oai222x1 oai222x1 oai222x1 oai222x1 or2x1 or2x1 or2x1 or2x2 or2x2 or2x2 or2x2 or3x1 or3x1 or3x1 or3x1 or3x2 or3x2 or3x2 or3x2 or4x1 or4x1 or4x1 or4x1 or4x2 or4x2 or4x2 or4x2 sdffrsqx1 sdffrsqx1 tiehix1 tiehix1 tiehix1 tielox1 tielox1 tielox1 xnr2x1 xnr2x1 xnr2x1 xnr2x1 xor2x1 xor2x1 xor2x1 xor2x1

PC

M0_color2

M0CUT2

STANDARD CELL LIBRARY THAT INCLUDES 13-CPP AND 17-CPP D FLIP-FLOP CELLS, WITH DFM-OPTIMIZED M0 CUTS AND V0 ADJACENCIES

CROSS-REFERENCE TO RELATED APPLICATION(S)

This application is a continuation of U.S. patent application Ser. No. 15/131,020, filed Apr. 17, 2016, and entitled "Standard Cell Library with DFM-Optimized M0 Cuts and V0 Adjacencies," which '020 application is a continuation-in-part of U.S. patent application Ser. No. 15/067,252, filed Mar. 11, 2016, and entitled "Standard Cell Library with DFM-Optimized M0 Cuts." Both the '020 and '252 applications are owned by the present applicant (PDF Solutions, Inc.), and both are incorporated by reference herein.

MASK WORK NOTICE

A portion of the disclosure of this patent document contains material which is subject to mask work protection, *M*, PDF Solutions, Inc. The mask work owner (PDF Solutions, Inc.) has no objection to the facsimile reproduction by anyone of the patent document or the patent disclosure, as it appears in the Patent and Trademark Office patent file or records, but otherwise reserves all mask work rights whatsoever.

FIELD OF THE INVENTION

This invention relates to design for manufacturability (DFM) of standard cells for advanced semiconductor processes (e.g., 10 nm, 7 nm), to libraries containing such cells, and to wafers/chips that contain instances of such cells.

BACKGROUND OF THE INVENTION

As semiconductor processes advance to render increasingly smaller features, the design of dense, high-yielding (manufacturable) cells becomes increasingly challenging. See, e.g., U.S. Pat. No. 9,202,820, "Flip-flop, latch, and mux cells for use in a standard cell library and integrated circuits made therefrom," to the inventor herein.

In the most advanced processes, patterning of critical layers is typically restricted to one direction (unidirectional) in each layer, delimited by cut masks, with the cut masks increasingly multi-patterned. In such technologies, careful attention to often non-obvious potential manufacturability problems is critical to successful implementation of a standard cell library. The invention, as described in detail below, provides an example of a DFM-optimized standard cell library for use in such advanced semiconductor processes.

SUMMARY OF THE INVENTION

One aspect of the invention relates to a library of DFM-improved standard cells, optimized for use in advanced semiconductor processes that include multi-patterned M0 cut masks.

Another aspect of the invention relates to wafers, chips, and systems that include such DFM-improved cells.

Applicant has discovered that, with very careful design, seemingly incompatible demands for cell density and avoidance of certain difficult-to-manufacture features can be simultaneously achieved. In particular, as exemplified by the depicted cells herein, the present invention provides a library of competitively dense logic cells with highly-optimized patterning in the first-level metal (M0) and/or via to interconnect (V0) layer(s). As described in greater detail below, such patterning avoids one or more of: (i) spacing M0 cuts so close to each other that they increase the risk of manufacturing failure; (ii) spacing V0 vias so close to each other that they increase the risk of manufacturing failure; and/or (iii) spacing V0 vias and M0 cuts so close to each other that they increase the risk of manufacturing failure.

Accordingly, generally speaking, and without intending to be limiting, certain aspects of the invention relate to collections of standard logic cells, implementing a plurality of logic functions, wherein each standard cell comprises, for example, at least the following: two elongated supply rails, each formed in a first metal (M0) layer, each supply rail having a width at least twice a minimum permitted width for M0 features, and each supply rail extending horizontally across the entire width of the standard cell; at least three elongated gate stripes, each formed in a gate (PC) layer, and each extending vertically between at least two of the supply rails, with adjacent gate stripes spaced at a minimum contacted poly pitch (CPP); positioned vertically between the supply rails, at least two, first-exposure M0 tracks, each of the first-exposure M0 tracks having the minimum permitted width and extending horizontally across the cell, the first-exposure M0 tracks patterned, in part, by portion(s) of a first-exposure M0 mask (M0_color1) and, in part, by portion(s) of a first-exposure M0 cut mask (M0CUT1); positioned vertically between the supply rails, at least two, second-exposure M0 tracks, each of the second-exposure M0 tracks having the minimum permitted width and extending horizontally across the cell, the second-exposure M0 tracks patterned, in part, by portion(s) of a second-exposure M0 mask (M0_color2) and, in part, by portion(s) of a second-exposure M0 cut mask (M0CUT2); and additional patterned features, in NW (N-well), TS (trench silicide), RX (active), CA (contact to active), GO (gate open, a/k/a CB), V0 (via to interconnect), and M1 (first-level interconnect) layers, configured to realize a logical function or behavior of the standard cell; wherein within the cell: all M0CUT1 features are rectangular in shape, with a left edge, right edge, top edge, and bottom edge, and as between any two first and second M0CUT1 features within the cell, there is at least 2×CPP of spacing between all points at which the left edge of the first M0CUT1 feature intersects an M0color1 feature and all points at which the left edge of the second M0CUT1 feature intersects an M0color1 feature, and there is at least 2×CPP of spacing between all points at which the right edge of the first M0CUT1 feature intersects an M0color1 feature and all points at which the right edge of the second M0CUT1 feature intersects an M0color1 feature; and all M0CUT2 features are rectangular in shape, with a left edge, right edge, top edge, and bottom edge, and as between any two first and second M0CUT2 features within the cell, there is at least 2×CPP of spacing between all points at which the left edge of the first M0CUT2 feature intersects an M0color2 feature and all points at which the left edge of the second M0CUT2 feature intersects an M0color2 feature, and there is at least 2×CPP of spacing between all points at which the right edge of the first M0CUT2 feature intersects an M0color2 feature and all points at which the right edge of the second M0CUT2 feature intersects an M0color2 feature. Such collections may be embodied on silicon wafers, chips, or systems, or as instructions for patterning such cells, where such instruction are contained in a non-transient, computer-readable mediums, in data formats such as GDSII. Such collections preferably include cells implementing at least four, six, eight, ten, twelve, fourteen, sixteen, eighteen, twenty or more logical functions selected from the following list, each of which may be provided in multiple drive strength variants:

1. the logic function of a 2-input AND;
2. the logic function of a 3-input AND;
3. the logic function of a 4-input AND;
4. the logic function OR(AND(a,b),c);
5. the logic function OR(AND(a,b,c),d);
6. the logic function OR(AND(a,b),c,d);
7. the logic function NOT(OR(AND(a,b),c));
8. the logic function NOT(OR(AND(a,b),AND(c,d)));
9. the logic function NOT(OR(AND(a,b,c),d));
10. the logic function NOT(OR(AND(a,b),c,d));
11. the logic function NOT(OR(AND(a,b),AND(c,d), AND(e,f)));
12. the logic function of a buffer;
13. the logic function of a clock-gating latch;
14. the logic function of a delay gate;
15. the logic function of a full adder;
16. the logic function of a half adder;
17. the logic function NOT(OR(AND(a,b),c)), with one of its inputs inverted;
18. the logic function of a 2-input NAND, with one of its inputs inverted;
19. the logic function of a 3-input NAND, with one of its inputs inverted;
20. the logic function of a 2-input NOR, with one of its inputs inverted;
21. the logic function of a 3-input NOR, with one of its inputs inverted;
22. the logic function of an inverter;
23. the logic function NOT(AND(OR(a,b),c)), with one of its inputs inverted;
24. the logic function of a latch;
25. the logic function of a 2-input MUX;
26. the logic function of a 2-input MUX, with one of its inputs inverted;
27. the logic function of a 2-input NAND;
28. the logic function of a 3-input NAND;
29. the logic function of a 4-input NAND;
30. the logic function of a 2-input NOR;
31. the logic function of a 3-input NOR;
32. the logic function of a 4-input NOR;
33. the logic function AND(OR(a,b),c);
34. the logic function AND(OR(a,b,c),d);
35. the logic function AND(OR(a,b),c,d);
36. the logic function NOT(AND(OR(a,b),c));
37. the logic function NOT(AND(OR(a,b),OR(c,d));
38. the logic function NOT(AND(OR(a,b,c),d));
39. the logic function NOT(AND(OR(a,b),c,d));
40. the logic function NOT(AND(OR(a,b),OR(c,d),OR(e,f)));
41. the logic function of a 2-input OR;
42. the logic function of a 3-input OR;
43. the logic function of a 4-input OR;
44. the logic function of a scan-enabled D flip-flop;
45. the logic function of a scan-enabled D flip-flop, with set and reset;
46. the logic function 1;
47. the logic function 0;
48. the logic function of a 2-input XNOR; and,
49. the logic function of a 2-input XOR.

Again, generally speaking, and without intending to be limiting, other aspects of the invention relate to collections of standard logic cells, implementing a plurality of logic functions, wherein each standard cell comprises, for example, at least the following: at least two elongated supply rails, extending horizontally across the standard cell; at least three elongated gate stripes, each extending vertically between at least two of said supply rails, adjacent gate stripes spaced at a minimum contacted poly pitch (CPP); positioned vertically between the supply rails, one or more first-exposure M0 tracks, each of the first-exposure M0 tracks having a minimum permitted width for M0 patterning and extending horizontally across the cell, the first-exposure M0 tracks patterned, in part, by feature(s) of a first-exposure M0 mask (M0_color1) and, in part, by feature(s) of a first-exposure M0 cut mask (M0CUT1); positioned vertically between the supply rails, one or more second-exposure M0 tracks, each of the second-exposure M0 tracks having the minimum permitted width and extending horizontally across the cell, the second-exposure M0 tracks patterned, in part, by feature(s) of a second-exposure M0 mask (M0_color2) and, in part, by feature(s) of a second-exposure M0 cut mask (M0CUT2); and means, including additional patterned features in NW (N-well), TS (trench silicide), RX (active), CA (contact to active), GO (gate open), V0 (via to interconnect), and M1 (first-level interconnect) layers, configured to realize a logical function or behavior of the standard cell; and wherein within the cell: all M0CUT1 features are rectangular in shape, with a left edge, right edge, top edge, and bottom edge, and as between any two first and second M0CUT1 features within the cell, there is at least 2×CPP of spacing between all points at which the left edge of the first M0CUT1 feature intersects an M0color1 feature and all points at which the left edge of the second M0CUT1 feature intersects an M0color1 feature, and there is at least 2×CPP of spacing between all points at which the right edge of the first M0CUT1 feature intersects an M0color1 feature and all points at which the right edge of the second M0CUT1 feature intersects an M0color1 feature; and all M0CUT2 features are rectangular in shape, with a left edge, right edge, top edge, and bottom edge, and as between any two first and second M0CUT2 features within the cell, there is at least 2×CPP of spacing between all points at which the left edge of the first M0CUT2 feature intersects an M0color2 feature and all points at which the left edge of the second M0CUT2 feature intersects an M0color2 feature, and there is at least 2×CPP of spacing between all points at which the right edge of the first M0CUT2 feature intersects an M0color2 feature and all points at which the right edge of the second M0CUT2 feature intersects an M0color2 feature.

Again, generally speaking, and without intending to be limiting, another aspect of the invention relates to collections of standard logic cells, implementing a plurality of logic functions, wherein each standard cell comprises, for example, at least the following: two elongated supply rails, each formed in a first metal (M0) layer, each supply rail having a width at least twice a minimum permitted width for M0 features, each supply rail extending horizontally across the entire width of the standard cell; at least three elongated gate stripes, each formed in a gate (PC) layer, and each extending vertically between at least two of the supply rails, adjacent gate stripes spaced at a minimum contacted poly pitch (CPP); positioned vertically between the supply rails, at least two, first-exposure M0 tracks, each of the first-exposure M0 tracks having the minimum permitted width and extending horizontally across the cell, the first-exposure M0 tracks patterned, in part, by portion(s) of a first-exposure M0 mask (M0_color1) and, in part, by portion(s) of a first-exposure M0 cut mask (M0CUT1); positioned vertically between the supply rails, at least two, second-exposure M0 tracks, each of the second-exposure M0 tracks having the minimum permitted width and extending horizontally across the cell, the second-exposure M0 tracks patterned, in part, by portion(s) of a second-exposure M0 mask (M0_color2) and, in part, by portion(s) of a second-exposure M0 cut mask (M0CUT2); a plurality of vias, patterned in a V0 (via to interconnect) layer, each of the plurality of vias instantiated on an M0 track; additional patterned features, in NW (N-well), TS (trench silicide), RX (active), CA (contact to active), GO (gate open), and M1 (first-level interconnect) layers, configured to realize a logical function or behavior of the standard cell; wherein within the cell: all M0CUT1 features are rectangular in shape, with a left edge, right edge, top edge, and bottom edge, and as between any two first and second M0CUT1 features within the cell, there is at least 1.3 (or 1.4, 1.5, 1.6, 1.7, 1.8, 1.9 or 2.0)×CPP of spacing between all points at which the left edge of the first M0CUT1 feature intersects an M0color1 feature and all points at which the left edge of the second M0CUT1 feature intersects an M0color1 feature, and there is at least 1.3 (or 1.4, 1.5, 1.6, 1.7, 1.8, 1.9 or 2.0)×CPP of spacing between all points at which the right edge of the first M0CUT1 feature intersects an M0color1 feature and all points at which the right edge of the second M0CUT1 feature intersects an M0color1 feature; all M0CUT2 features are rectangular in shape, with a left edge, right edge, top edge, and bottom edge, and as between any two first and second M0CUT2 features within the cell, there is at least 1.3 (or 1.4, 1.5, 1.6, 1.7, 1.8, 1.9 or 2.0)×CPP of spacing between all points at which the left edge of the first M0CUT2 feature intersects an M0color2 feature and all points at which the left edge of the second M0CUT2 feature intersects an M0color2 feature, and there is at least 1.3 (or 1.4, 1.5, 1.6, 1.7, 1.8, 1.9 or 2.0)×CPP of spacing between all points at which the right edge of the first M0CUT2 feature intersects an M0color2 feature and all points at which the right edge of the second M0CUT2 feature intersects an M0color2 feature; and, among the plurality of vias, each is spaced from its nearest neighbor by more than the edge-to-edge distance between adjacent M0 tracks. In some embodiments, each of the plurality of vias is also spaced at least 0.7 (or 0.8, 0.9 or 1.0)×CPP from the nearest cut in the M0 track in which said via is instantiated, with the spacing measured as the horizontal distance between the center of the via and the center of the cut.

Again, generally speaking, and without intending to be limiting, another aspect of the invention relates to collections of at least five (or six, seven, eight, ten, twelve, fifteen or more) standard logic cells, each implementing a different logic function, wherein each standard cell comprises, for example, at least the following: at least two elongated supply rails, extending horizontally across the standard cell; at least three elongated gate stripes, each extending vertically between at least two of said supply rails, adjacent gate stripes spaced at a minimum contacted poly pitch (CPP); positioned vertically between the supply rails, a plurality of M0 tracks, including one or more first-exposure M0 tracks, each of the first-exposure M0 tracks having a minimum permitted width for M0 patterning and extending horizontally across the cell, and one or more second-exposure M0 tracks, each of the second-exposure M0 tracks having the minimum permitted width and extending horizontally across the cell; a plurality of vias, patterned in a V0 (via to interconnect) layer, each of the plurality of vias instantiated on an M0 track; and, means, including additional patterned features in NW (N-well), TS (trench silicide), RX (active), CA (contact to active), GO (gate open), and M1 (first-level interconnect) layers, configured to realize a logical function or behavior of the standard cell; wherein within the cell, among the plurality of vias, each is spaced from its nearest neighbor by more than the edge-to-edge distance between adjacent M0 tracks. In some embodiments, each of the plurality of vias is spaced at least 0.8 (or 0.7, 0.9 or 1.0)×CPP from the nearest cut in the M0 track in which the via is instantiated, with the spacing measured as the horizontal distance between the center of the via and the center of the cut. In some embodiments, the first-exposure M0 tracks are patterned, in part, by feature(s) of a first-exposure M0 mask (M0_color1) and, in part, by feature(s) of a first-exposure M0 cut mask (M0CUT1); the second-exposure M0 tracks are patterned, in part, by feature(s) of a second-exposure M0 mask (M0_color2) and, in part, by feature(s) of a second-exposure M0 cut mask (M0CUT2); all M0CUT1 features are rectangular in shape, with a left edge, right edge, top edge, and bottom edge, and as between any two first and second M0CUT1 features within the cell, there is at least 1.3 (or 1.4, 1.5, 1.6, 1.7, 1.8, 1.9 or 2.0)×CPP of spacing between all points at which the left edge of the first M0CUT1 feature intersects an M0color1 feature and all points at which the left edge of the second M0CUT1 feature intersects an M0color1 feature, and there is at least 1.3 (or 1.4, 1.5, 1.6, 1.7, 1.8, 1.9 or 2.0)×CPP of spacing between all points at which the right edge of the first M0CUT1 feature intersects an M0color1 feature and all points at which the right edge of the second M0CUT1 feature intersects an M0color1 feature; and, all M0CUT2 features are rectangular in shape, with a left edge, right edge, top edge, and bottom edge, and as between any two first and second M0CUT2 features within the cell, there is at least 1.3 (or 1.4, 1.5, 1.6, 1.7, 1.8, 1.9 or 2.0)×CPP of spacing between all points at which the left edge of the first M0CUT2 feature intersects an M0color2 feature and all points at which the left edge of the second M0CUT2 feature intersects an M0color2 feature, and there is at least 1.3 (or 1.4, 1.5, 1.6, 1.7, 1.8, 1.9 or 2.0)×CPP of spacing between all points at which the right edge of the first M0CUT2 feature intersects an M0color2 feature and all points at which the right edge of the second M0CUT2 feature intersects an M0color2 feature.

Again, generally speaking, and without intending to be limiting, another aspect of the invention relates to scan-enabled, D flip-flop cells, implemented in a double-height standard cell form, comprising, for example: three rectangular power rails, including a top rail, middle rail, and bottom rail, each of the rails formed in a first metal (M0) layer, with the top and bottom rails patterned using a different M0 mask than the middle rail, each of the rails extending uncut, horizontally across the entire cell, each of the rails having a vertical width at least twice a minimum permitted width for M0 patterning; a plurality of at least thirteen parallel, evenly-spaced, minimum width gate stripes, each formed in a gate (PC) layer, and each extending vertically between the top and bottom rails, adjacent gate stripes separated by a center-to-center spacing CPP; positioned vertically between the top and middle rails, two first-exposure M0 tracks, each of the first-exposure M0 tracks having the minimum permitted M0 width and extending horizontally across the cell, said first-exposure M0 tracks patterned, in part, by portion(s) of a first-exposure M0 mask (M0_color1) and, in part, by portion(s) of a first-exposure M0 cut mask (M0CUT1); positioned vertically between the top and middle rails, two second-exposure M0 tracks, each of the second-exposure M0 tracks having the minimum permitted M0 width and extending horizontally across the cell, said second-exposure M0 tracks patterned, in part, by portion(s) of a second-exposure M0 mask (M0_color2) and, in part, by portion(s) of a second-exposure M0 cut mask (M0CUT2); positioned vertically between the bottom and middle rails, two first-exposure M0 tracks, each of the first-exposure M0 tracks having the minimum permitted M0 width and extending horizontally across the cell, said first-exposure M0 tracks patterned, in part, by portion(s) of the M0_color1 mask and, in part, by portion(s) of the M0CUT1 mask; positioned vertically between the bottom and middle rails, two second-exposure M0 tracks, each of the second-exposure M0 tracks having the minimum permitted M0 width and extending horizontally across the cell, said second-exposure M0 tracks patterned, in part, by portion(s) of the M0_color2 mask and, in part, by portion(s) of the M0CUT2 mask; a plurality of vias, patterned in a V0 (via to interconnect) layer, each of said plurality of vias instantiated on an M0 track; additional patterned features, in NW (N-well), TS (trench silicide), RX (active), CA (contact to active), GO (gate open), and M1 (first-level interconnect) layers, configured to realize the D flip-flop logical behavior of the cell; and characterized in that: none of the M0 cuts overlaps a gate stripe; and, the separation between the V0 vias is greater than the gap between adjacent M0 tracks. Such flip-flop cells may be thirteen or seventeen CPP wide. In some embodiments, all M0CUT1 features are rectangular in shape, with a left edge, right edge, top edge, and bottom edge, and as between any two first and second M0CUT1 features within the cell, there is at least 1.7×CPP of spacing between all points at which the left edge of the first M0CUT1 feature intersects an M0color1 feature and all points at which the left edge of the second M0CUT1 feature intersects an M0color1 feature, and there is at least 1.7×CPP of spacing between all points at which the right edge of the first M0CUT1 feature intersects an M0color1 feature and all points at which the right edge of the second M0CUT1 feature intersects an M0color1 feature; and, all M0CUT2 features are rectangular in shape, with a left edge, right edge, top edge, and bottom edge, and as between any two first and second M0CUT2 features within the cell, there is at least 1.7×CPP of spacing between all points at which the left edge of the first M0CUT2 feature intersects an M0color2 feature and all points at which the left edge of the second M0CUT2 feature intersects an M0color2 feature, and there is at least 1.7×CPP of spacing between all points at which the right edge of the first M0CUT2 feature intersects an M0color2 feature and all points at which the right edge of the second M0CUT2 feature intersects an M0color2 feature. In some embodiments, each of said plurality of vias is spaced at least 0.8 (or 0.9)×CPP from the nearest cut in the M0 track in which said via is instantiated, where said spacing is measured as the horizontal distance between the center of the via and the center of the cut. Such cells may be instantiated on a silicon chip, or instantiated as instructions for patterning features on a silicon wafer, in GDSII format.

Again, generally speaking, and without intending to be limiting, another aspect of the invention relates to flip-flop cells that comprise, for example: means for implementing the logical behavior of scan-enabled D flip-flop, using: three rectangular power rails, including a top rail, middle rail, and bottom rail, each of the rails formed in a first metal (M0) layer; exactly thirteen parallel, evenly-spaced, minimum width gate stripes, each formed in a gate (PC) layer, and each extending vertically between the top and bottom rails, adjacent gate stripes separated by a center-to-center spacing CPP; positioned vertically between the top and middle rails, exactly two first-exposure M0 tracks, each of the first-exposure M0 tracks having a minimum permitted M0 width and extending horizontally across the cell, said first-exposure M0 tracks patterned, in part, by portion(s) of a first-exposure M0 mask (M0_color1) and, in part, by portion(s) of a first-exposure M0 cut mask (M0CUT1); positioned vertically between the top and middle rails, exactly two second-exposure M0 tracks, each of the second-exposure M0 tracks having the minimum permitted M0 width and extending horizontally across the cell, said second-exposure M0 tracks patterned, in part, by portion(s) of a second-exposure M0 mask (M0_color2) and, in part, by portion(s) of a second-exposure M0 cut mask (M0CUT2); positioned vertically between the bottom and middle rails, exactly two first-exposure M0 tracks, each of the first-exposure M0 tracks having the minimum permitted M0 width and extending horizontally across the cell, said first-exposure M0 tracks patterned, in part, by portion(s) of the M0_color1 mask and, in part, by portion(s) of the M0CUT1 mask; positioned vertically between the bottom and middle rails, exactly two second-exposure M0 tracks, each of the second-exposure M0 tracks having the minimum permitted M0 width and extending horizontally across the cell, said second-exposure M0 tracks patterned, in part, by portion(s) of the M0_color2 mask and, in part, by portion(s) of the M0CUT2 mask; a plurality of vias, patterned in a V0 (via to interconnect) layer, each of said plurality of vias instantiated on an M0 track; and, additional patterned features, in NW (N-well), TS (trench silicide), RX (active), CA (contact to active), GO (gate open), and M1 (first-level interconnect) layers, configured to realize the D flip-flop logical behavior of the cell; characterized in that: none of the M0 cuts overlaps a gate stripe; and, the separation between the V0 vias is greater than the gap between adjacent M0 tracks. In some embodiments, the top and bottom rails are patterned using a different M0 mask than the middle rail, and each of the rails extends uncut, horizontally across the entire cell. In some embodiments, each of the rails has a vertical width exactly three times the vertical width of the M0 tracks. In some embodiments, all M0CUT1 features are rectangular in shape, with a left edge, right edge, top edge, and bottom edge, and as between any two first and second M0CUT1 features within the cell, there is at least 1.7×CPP of spacing between all points at which the left edge of the first M0CUT1 feature intersects an M0color1 feature and all points at which the left edge of the second M0CUT1 feature intersects an M0color1 feature, and there is at least 1.7×CPP of spacing between all points at which the right edge of the first M0CUT1 feature intersects an M0color1 feature and all points at which the right edge of the second M0CUT1 feature intersects an M0color1 feature; and, all M0CUT2 features are rectangular in shape, with a left edge, right edge, top edge, and bottom edge, and as between any two first and second M0CUT2 features within the cell, there is at least 1.7×CPP of spacing between all points at which the left edge of the first M0CUT2 feature intersects an M0color2 feature and all points at which the left edge of the second M0CUT2 feature intersects an M0color2 feature, and there is at least 1.7×CPP of spacing between all points at which the right edge of the first M0CUT2 feature intersects an M0color2 feature and all points at which the right edge of the second M0CUT2 feature intersects an M0color2 feature. In some embodiments, each of said plurality of vias is spaced at least 0.8 (or 0.9)×CPP from the nearest cut in the M0 track in which said via is instantiated, where said spacing is measured as the horizontal distance between the center of the via and the center of the cut. Such cells may be instantiated on a silicon chip, or instantiated as instructions for patterning features on a silicon wafer, in GDSII format.

Again, generally speaking, and without intending to be limiting, another aspect of the invention relates to flip-flop cells, comprising, for example: means for implementing the logical behavior of scan-enabled D flip-flop, with set and reset, using: three rectangular power rails, including a top rail, middle rail, and bottom rail, each of the rails formed in a first metal (M0) layer; exactly seventeen parallel, evenly-spaced, minimum width gate stripes, each formed in a gate (PC) layer, and each extending vertically between the top and bottom rails, adjacent gate stripes separated by a center-to-center spacing CPP; positioned vertically between the top and middle rails, exactly two first-exposure M0 tracks, each of the first-exposure M0 tracks having a minimum permitted M0 width and extending horizontally across the cell, said first-exposure M0 tracks patterned, in part, by portion(s) of a first-exposure M0 mask (M0_color1) and, in part, by portion(s) of a first-exposure M0 cut mask (M0CUT1); positioned vertically between the top and middle rails, exactly two second-exposure M0 tracks, each of the second-exposure M0 tracks having the minimum permitted M0 width and extending horizontally across the cell, said second-exposure M0 tracks patterned, in part, by portion(s) of a second-exposure M0 mask (M0_color2) and, in part, by portion(s) of a second-exposure M0 cut mask (M0CUT2); positioned vertically between the bottom and middle rails, exactly two first-exposure M0 tracks, each of the first-exposure M0 tracks having the minimum permitted M0 width and extending horizontally across the cell, said first-exposure M0 tracks patterned, in part, by portion(s) of the M0_color1 mask and, in part, by portion(s) of the M0CUT1 mask; positioned vertically between the bottom and middle rails, exactly two second-exposure M0 tracks, each of the second-exposure M0 tracks having the minimum permitted M0 width and extending horizontally across the cell, said second-exposure M0 tracks patterned, in part, by portion(s) of the M0_color2 mask and, in part, by portion(s) of the M0CUT2 mask; a plurality of vias, patterned in a V0 (via to interconnect) layer, each of said plurality of vias instantiated on an M0 track; and, additional patterned features, in NW (N-well), TS (trench silicide), RX (active), CA (contact to active), GO (gate open), and M1 (first-level interconnect) layers, configured to realize the D flip-flop logical behavior of the cell; characterized in that: none of the M0 cuts overlaps a gate stripe; and, the separation between the V0 vias is greater than the gap between adjacent M0 tracks. In some embodiments, the top and bottom rails are patterned using a different M0 mask than the middle rail, and each of the rails extends uncut, horizontally across the entire cell. In some embodiments, each of the rails has a vertical width exactly three times the vertical width of the M0 tracks. In some embodiments, all M0CUT1 features are rectangular in shape, with a left edge, right edge, top edge, and bottom edge, and as between any two first and second M0CUT1 features within the cell, there is at least 1.7×CPP of spacing between all points at which the left edge of the first M0CUT1 feature intersects an M0color1 feature and all points at which the left edge of the second M0CUT1 feature intersects an M0color1 feature, and there is at least 1.7×CPP of spacing between all points at which the right edge of the first M0CUT1 feature intersects an M0color1 feature and all points at which the right edge of the second M0CUT1 feature intersects an M0color1 feature; and, all M0CUT2 features are rectangular in shape, with a left edge, right edge, top edge, and bottom edge, and as between any two first and second M0CUT2 features within the cell, there is at least 1.7×CPP of spacing between all points at which the left edge of the first M0CUT2 feature intersects an M0color2 feature and all points at which the left edge of the second M0CUT2 feature intersects an M0color2 feature, and there is at least 1.7×CPP of spacing between all points at which the right edge of the first M0CUT2 feature intersects an M0color2 feature and all points at which the right edge of the second M0CUT2 feature intersects an M0color2 feature. In some embodiments, each of said plurality of vias is spaced at least 0.8 (or 0.9)×CPP from the nearest cut in the M0 track in which said via is instantiated, where said spacing is measured as the horizontal distance between the center of the via and the center of the cut. Such cells may be instantiated on a silicon chip, or instantiated as instructions for patterning features on a silicon wafer, in GDSII format.

BRIEF DESCRIPTION OF THE DRAWINGS

The above, as well as other, aspects, features and advantages of the present invention are illustrated in the accompanying set of figures, which are rendered to relative scale, and in which:

FIGS. 2A-D depict a mux2x1 alt cell;
FIGS. 26A-D depict an bufx8 cell.

FIGS. 48A-D depict an mux2x2 cell;
FIGS. 55A-D depict an nd3x2 cell;
FIGS. 61.1A-D depict an nr2x3 cell.

DESCRIPTION OF EXEMPLARY EMBODIMENT(S)

Figure 92:
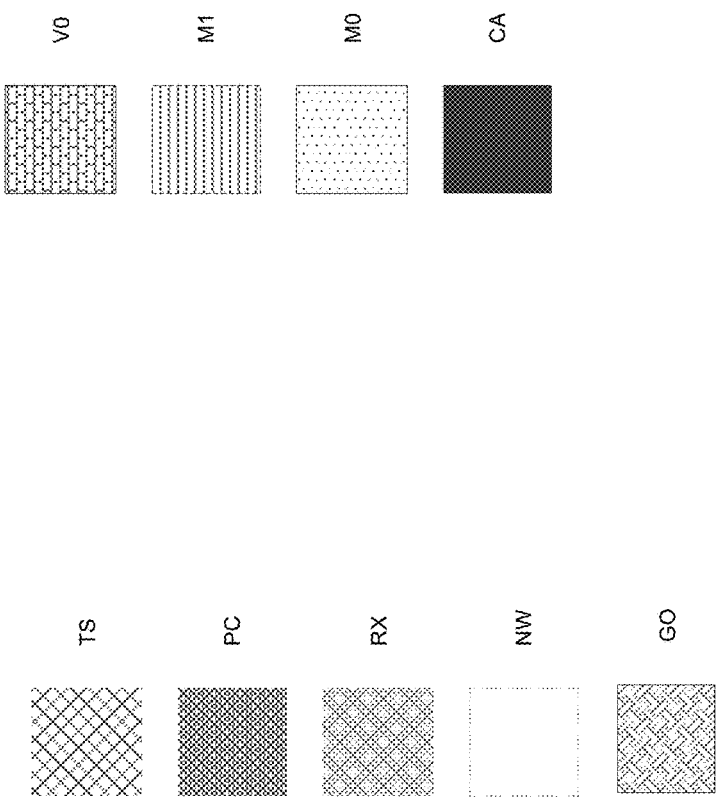

FIGS. 92-95 show layer maps for the respective A-labeled, B-labeled, C-labeled, and D-labeled figures that follow. With reference to FIG. 92, the full set of depicted layers includes: M0 (first metal), NW (N-well), TS (trench silicide), RX (active), CA (contact to active), PC (gate, a/k/a polysilicon or poly—although the gate material in advanced processes is typically metallic), GO (gate open, a/k/a CB), V0 (via to interconnect), and M1 (first-level interconnect). Persons skilled in the art will appreciate that any of these layers may be created through multiple exposure (e.g., double, triple or quadruple patterned) processes, and/or through use of cut masks, which themselves may be multi-patterned. The A-labeled figures in this application are intended to show the resulting complete cells as clearly as possible; thus, the details of multi-patterning and cut-masking have been eliminated from these figures.

Figure 93:
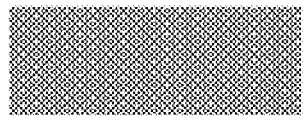
FIG. 93 contains a layer legend the B-labeled figures.
Figure 93:
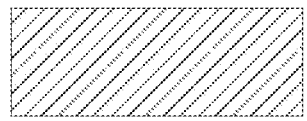
Figure 93:
Figure 94:
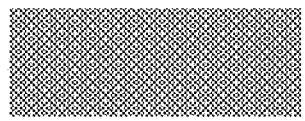
FIG. 94 contains a layer legend for the C-labeled figure;: and,
FIG. 95 contains a layer legend for the D-labeled figures.
Figure 94:
Figure 94:
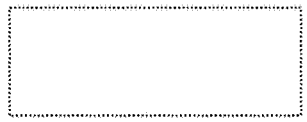

Referring now to FIGS. 93 and 94, these show the layer maps for the B-labeled and C-labeled figures, which depict the multi-patterning, cut-masked details of M0 patterning in the inventive cells. In particular, in the exemplary embodiment herein, M0 is patterned in two exposures (M0_color1 and M0_color2), each of which is patterned by its own cut mask (M0CUT1 and M0CUT2, respectively). PC is shown in both the A-labeled and B-labeled figures as a measurement reference. Persons skilled in the art will understand that variations on the M0 process are possible. For example, M0 may be triple patterned, with a separate cut mask for each exposure, and/or an additional cut mask may be provided that cuts both (or all) exposures of M0.

Figure 95:
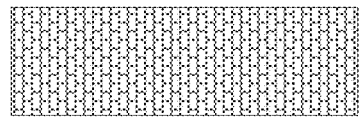
Figure 95:
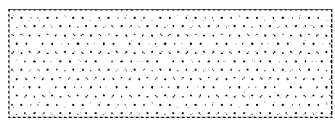
Figure 95:
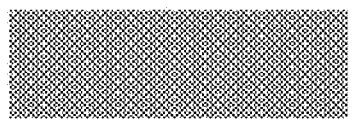

Referring now to FIG. 95, which shows a layer map for the D-labeled figures, these figures depict the V0 patterning details of the cells, with M0 and PC layers shown for reference. Persons skilled in the art will understand that variations on the V0 process are possible. For example, V0 may be double or triple patterned, with a separate cut mask for each exposure, and/or an additional cut mask may be provided that cuts all exposures.

Figure 1A:
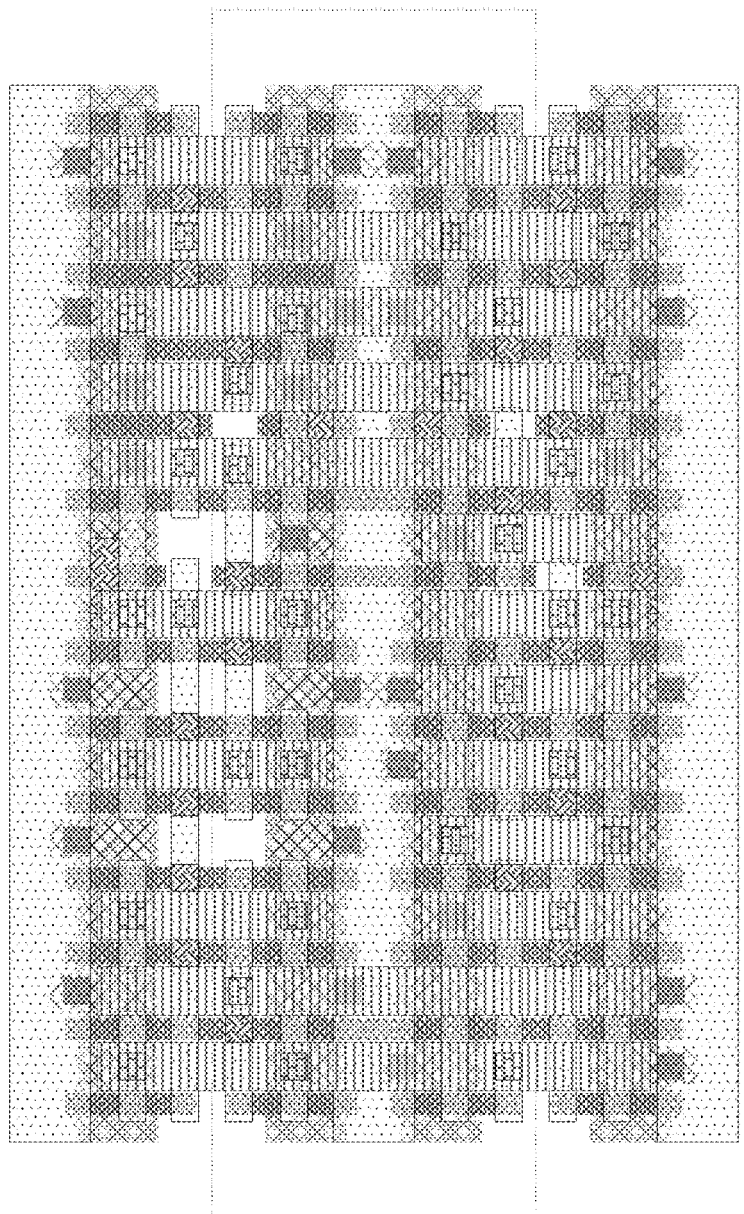
FIGS. 1A-D depict an sdffqx1_alt cell.
Figure 1B:
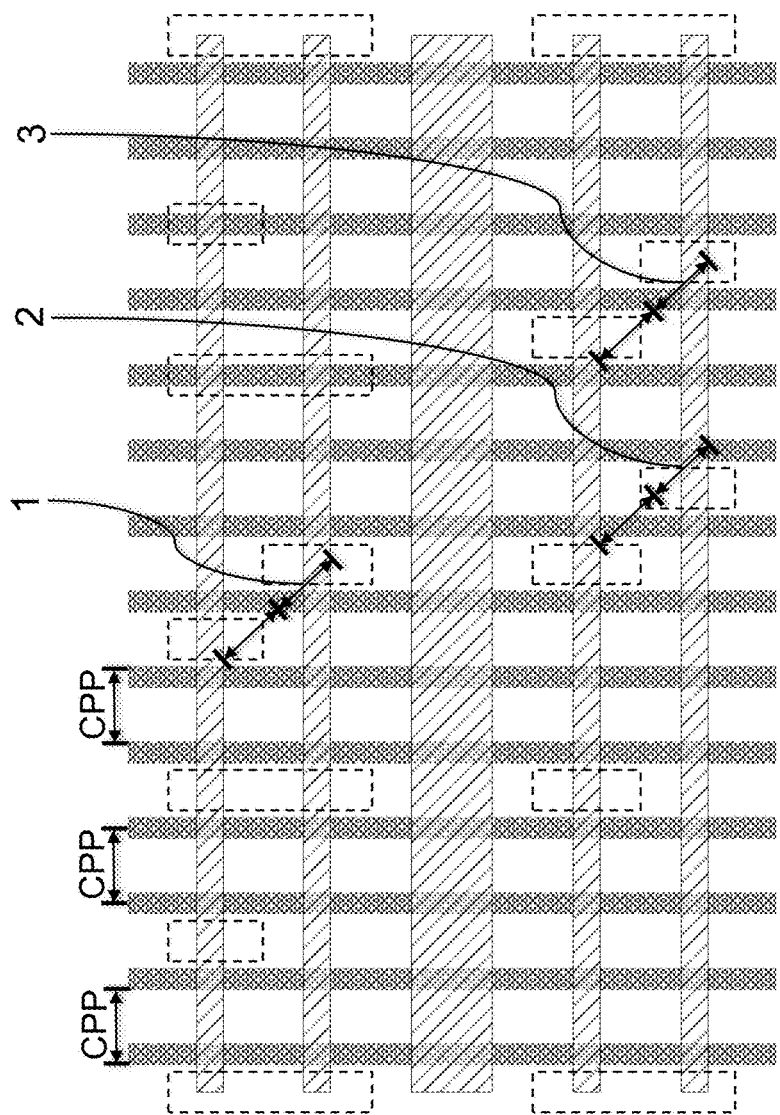
Figure 1C:
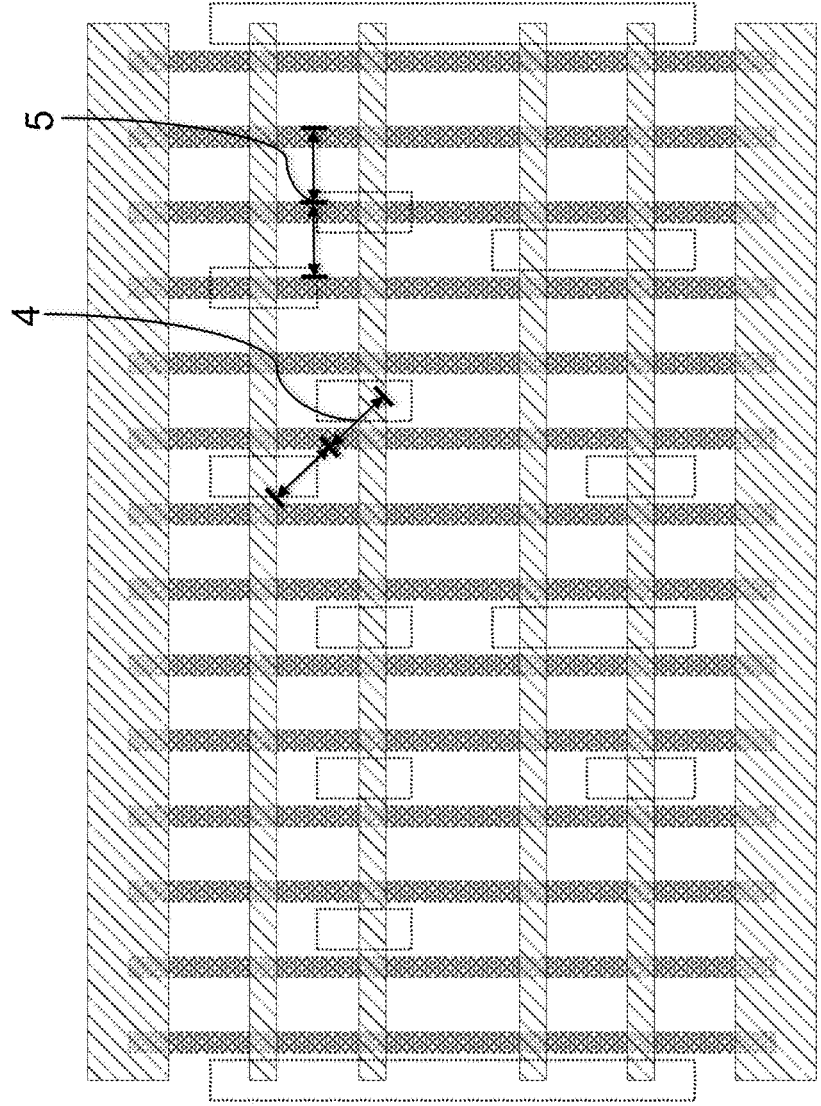
Figure 1D:
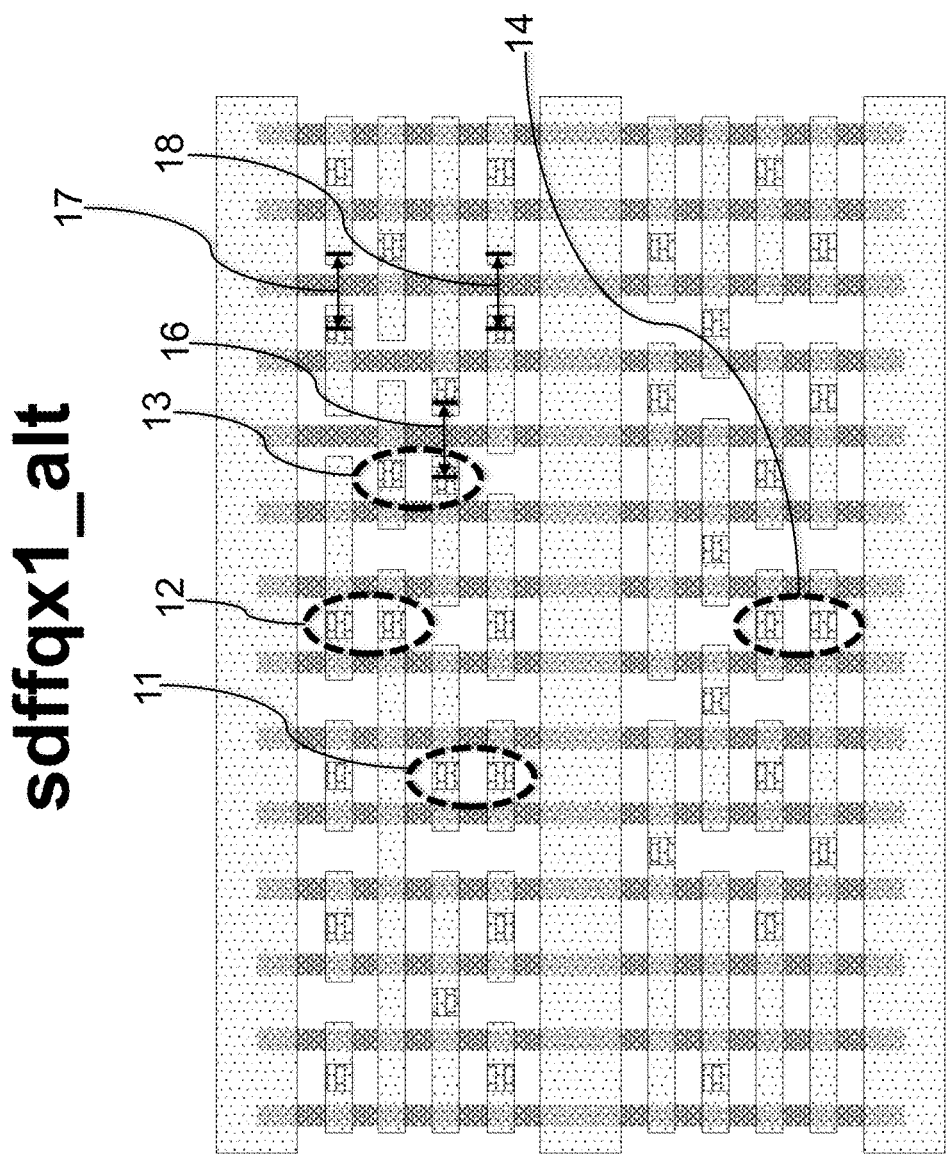

Reference is now made to FIGS. 1A-D, which depict an sdffqx1_alt cell. This cell implements the logic function of a scan-enabled, D flip-flop, in drive strength 1. This cell is an example of a state-of-the-art layout that, nevertheless, does not meet the objects of the present invention. Referring first to FIG. 1B, one can see that CPP (contacted poly pitch) can be equivalently measured as the left-edge-to-left-edge distance, center-to-center distance, or right-edge-to-right-edge distance between adjacent gate stripes. As further depicted in FIG. 1B, this cell contains several undesirable configurations in the first-exposure M0 layer: two instances of left-edge-to-left-edge first-exposure M0 cuts with spacing (1 and 3) of less than 2×CPP; and an instance of right-edge-to-right-edge first-exposure M0 cuts with a spacing (2) of less than 2×CPP. (Note, there may be additional violations on this layout, and others that follow in FIGS. 1C and 2B-C. The flagged examples are intended to be exemplary, not exhaustive.) Referring now to FIG. 1C, additional undesirable configurations in the second-exposure M0 layer are flagged: an instance of left-edge-to-left-edge second-exposure M0 cuts with a spacing (4) of less than 2×CPP; and an instance of right-edge-to-right-edge second-exposure M0 cuts with a spacing (5) of less than 2×CPP. Referring now to FIG. 1D, this cell also contains several undesirable configurations in the V0 layer: (i) four instances (11-14) of adjacent V0 vias in adjacent M0 tracks (i.e., V0 vias with a spacing less than or equal to the minimum spacing between adjacent M0 tracks); and (ii) two instances (17-18) of V0 vias in the same M0 track, separated by an M0 cut of less than one CPP.

Figure 2A:
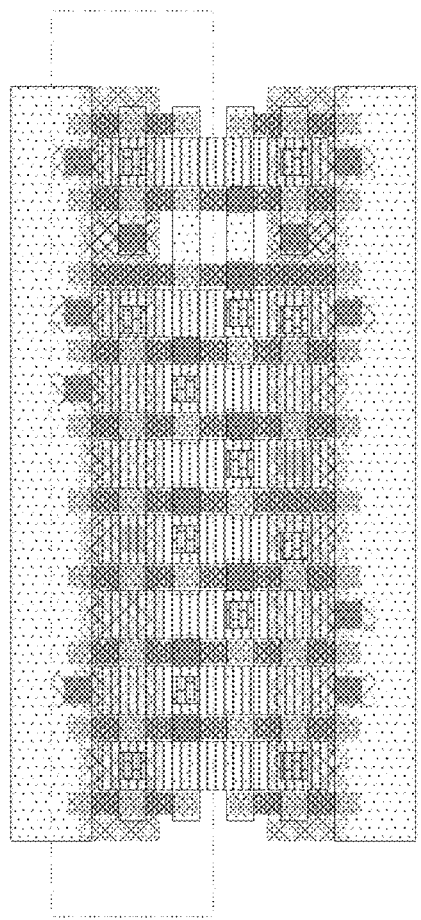
Figure 2B:
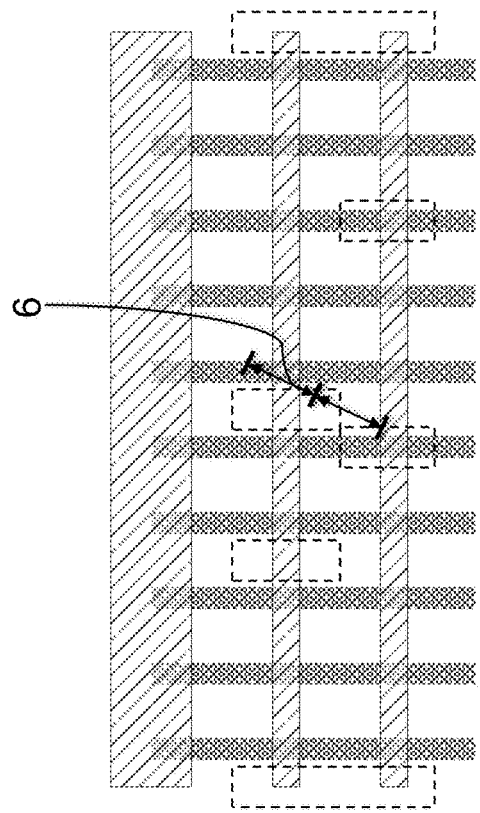
Figure 2C:
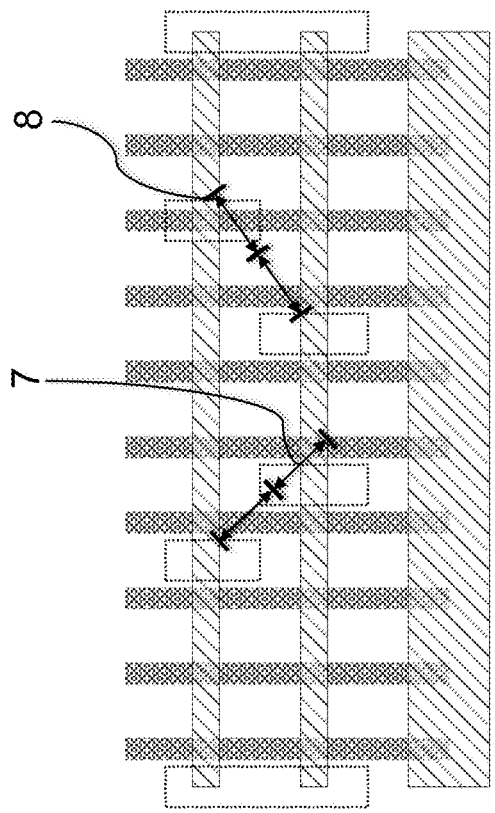
Figure 3A:
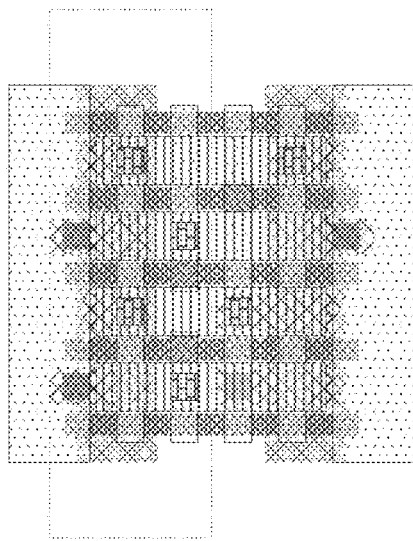
FIGS. 3A-D depict an an2x1 cell.
Figure 3B:
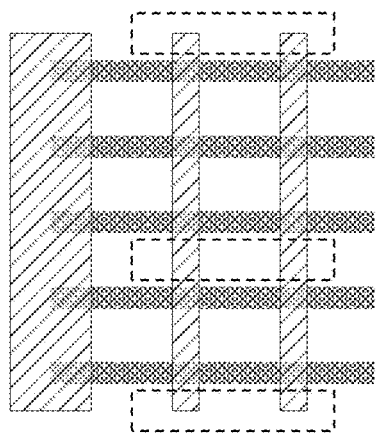
Figure 3C:
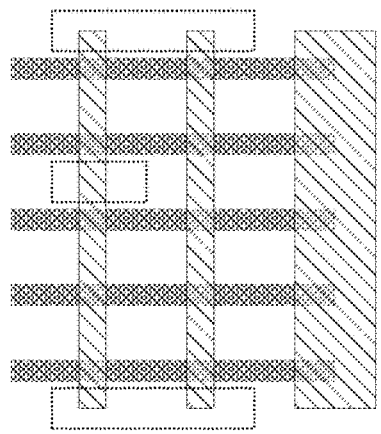
Figure 3D:
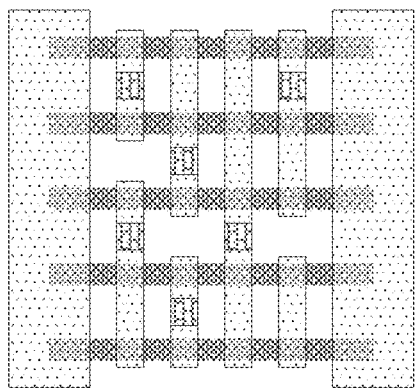
Figure 4A:
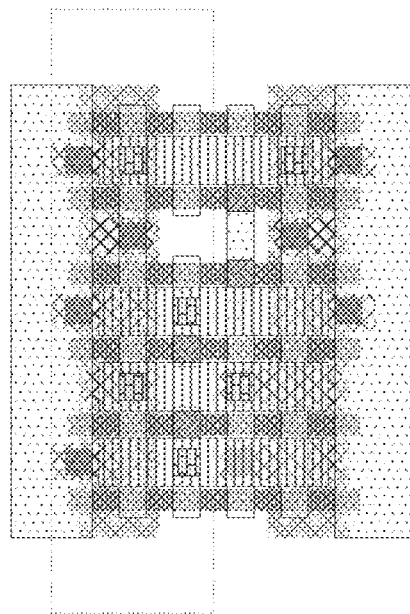
FIGS. 4A-D depict an an2x2 cell.
Figure 4B:
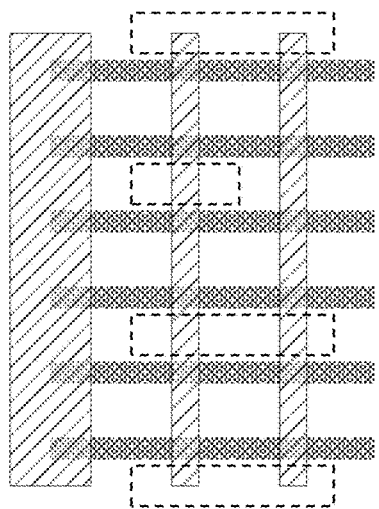
Figure 4C:
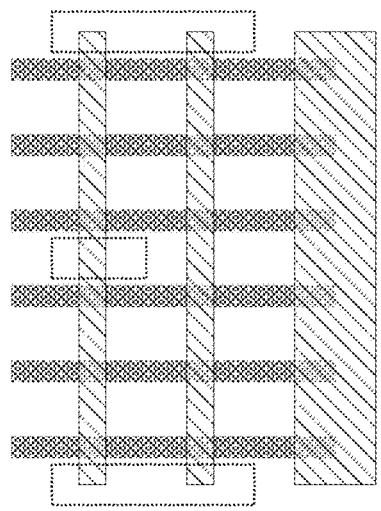
Figure 4D:
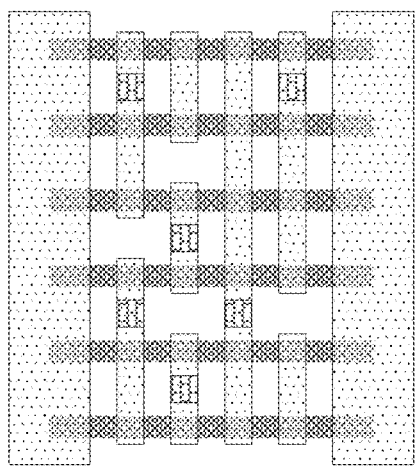
Figure 5A:
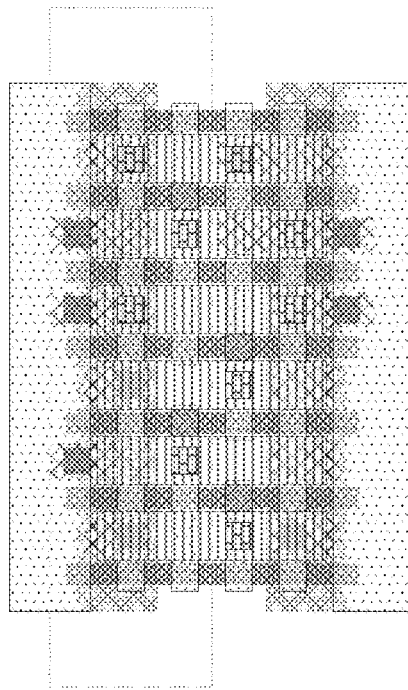
FIGS. 5A-D depict an an3x1 cell.
Figure 5B:
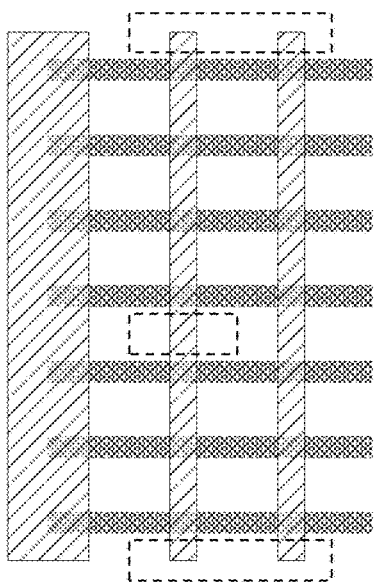
Figure 5C:
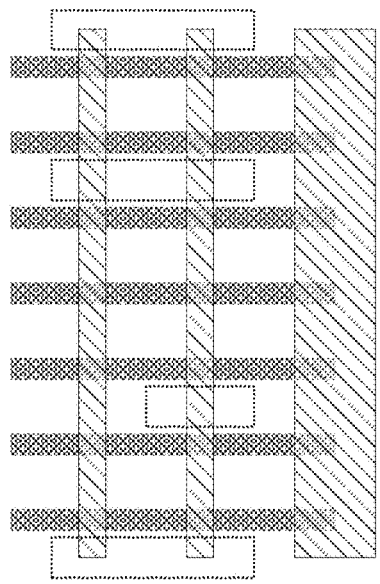
Figure 5D:
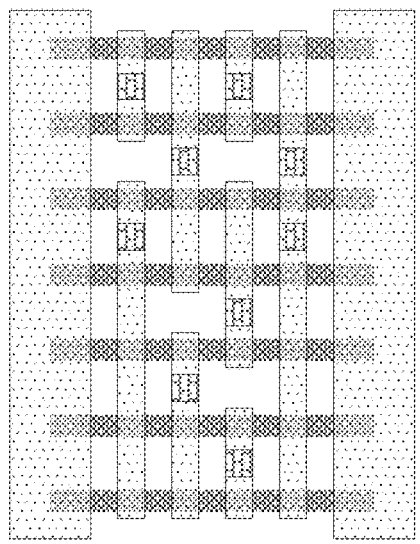
Figure 6A:
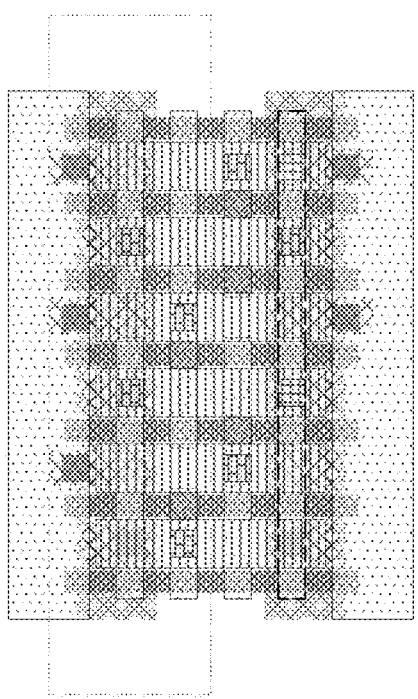
FIGS. 6A-D depict an an3x2 cell.
Figure 6B:
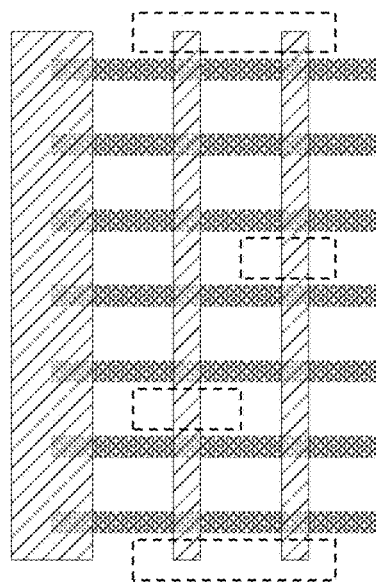
Figure 6C:
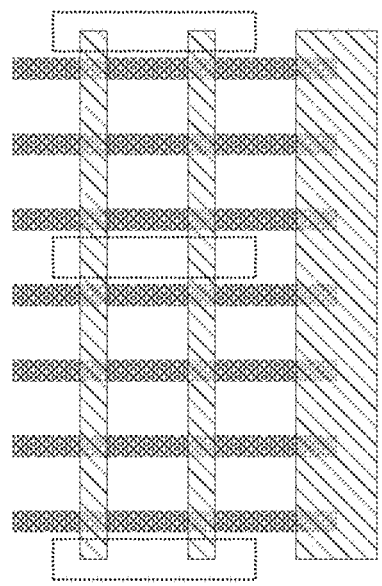
Figure 6D:
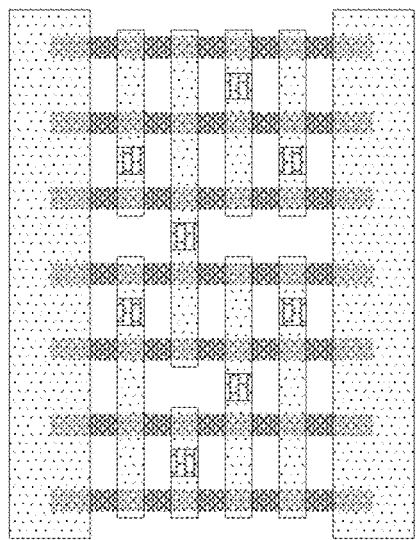
Figure 7A:
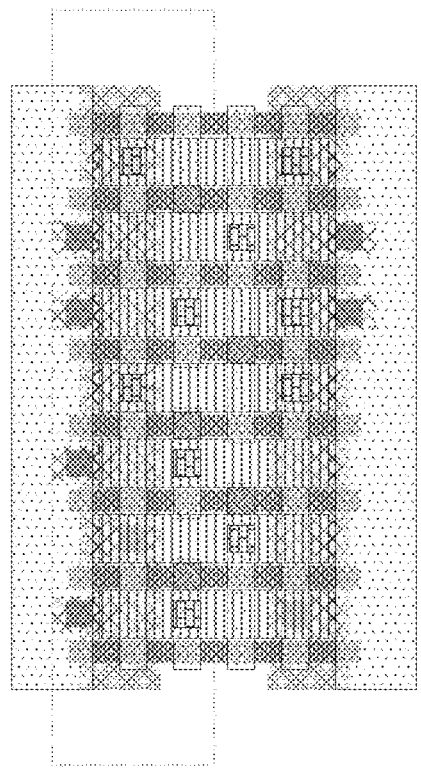
FIGS. 7A-D depict an an4x1 cell.
Figure 7B:
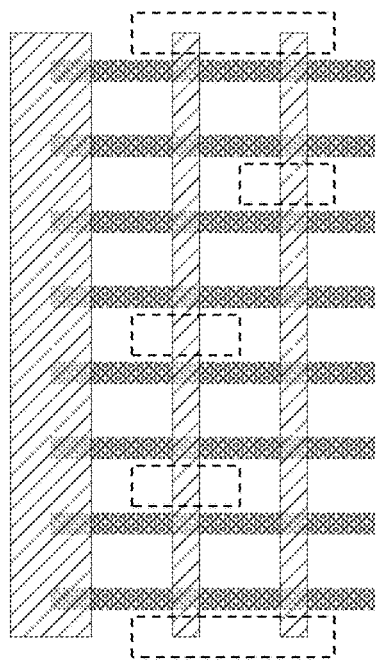
Figure 7C:
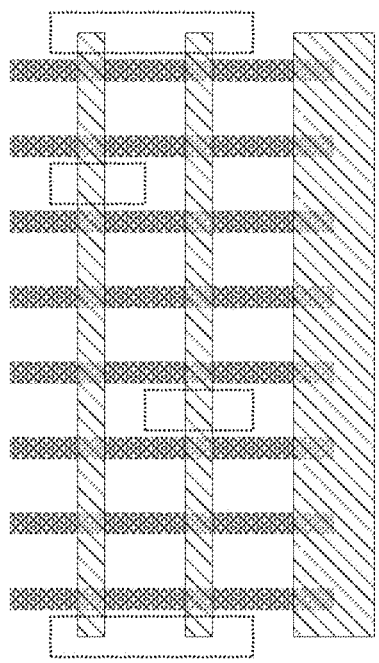
Figure 7D:
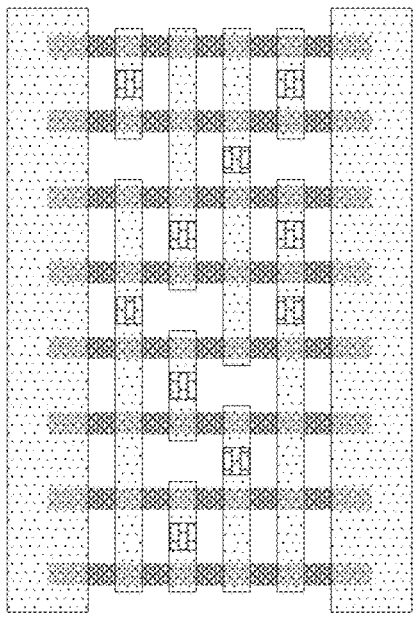
Figure 8A:
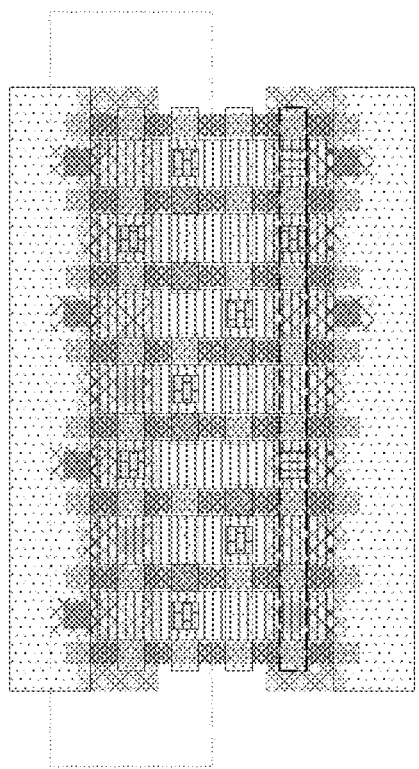
FIGS. 8A-D depict an an4x2 cell.
Figure 8B:
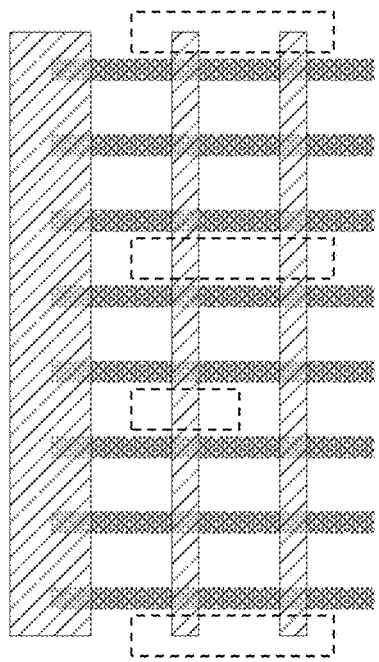
Figure 8C:
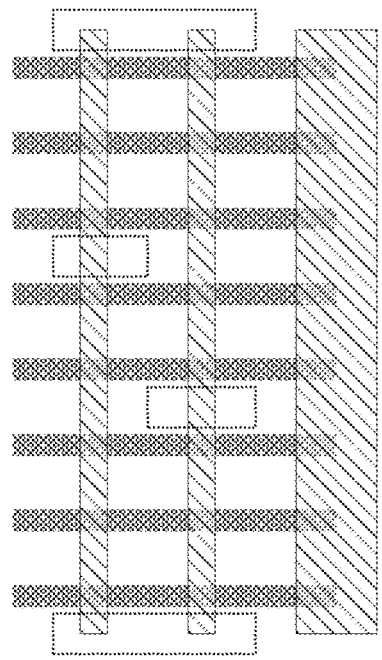
Figure 8D:
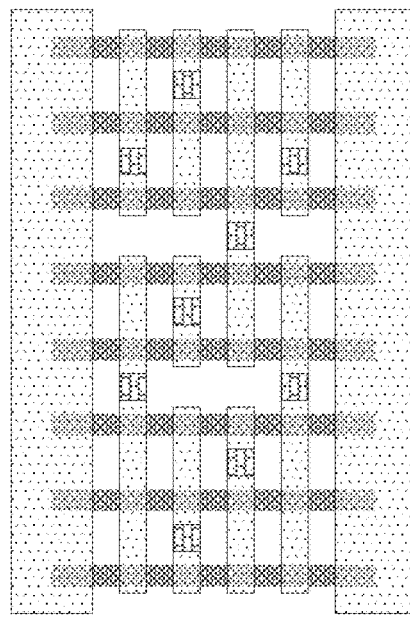
Figure 9A:
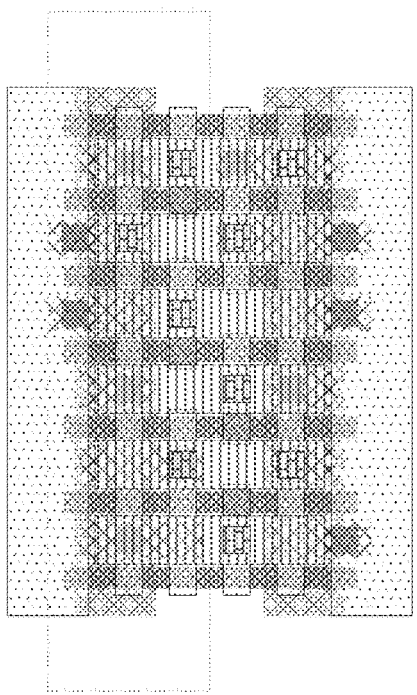
FIGS. 9A-D depict an ao21x1 cell.
Figure 9B:
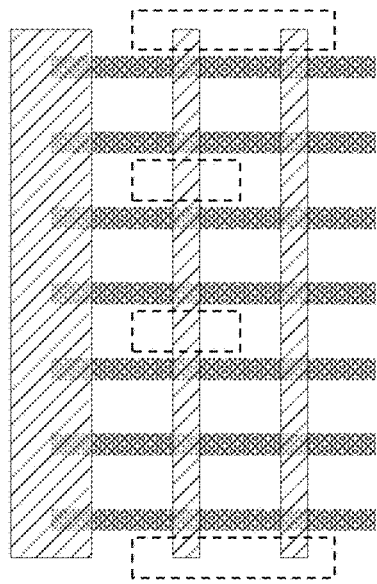
Figure 9C:
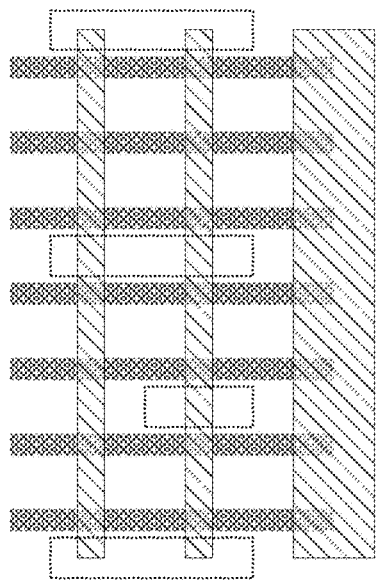
Figure 9D:
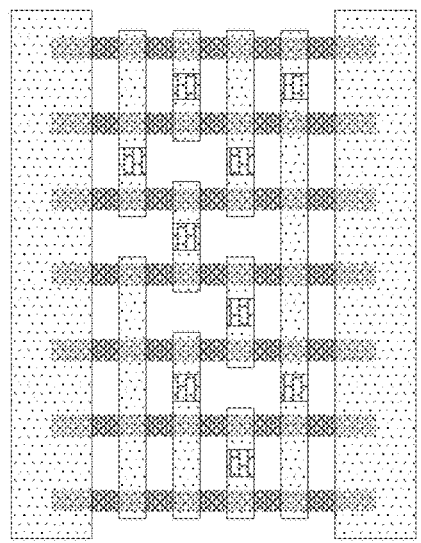
Figure 10A:
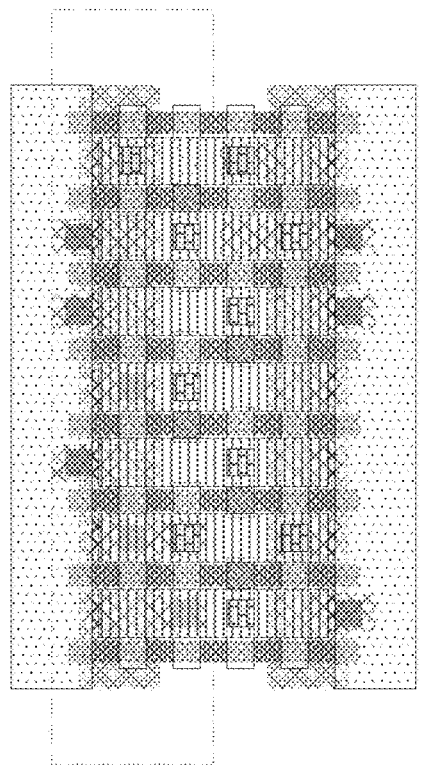
FIGS. 10A-D depict an ao31x1 cell.
Figure 10B:
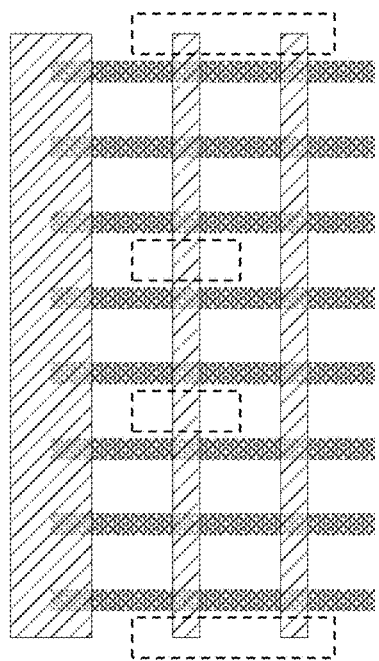
Figure 10C:
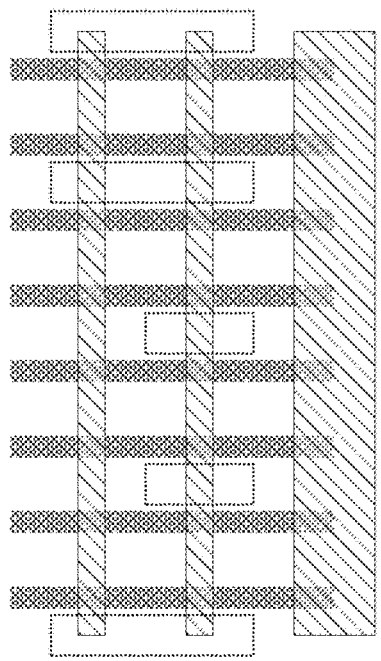
Figure 10D:
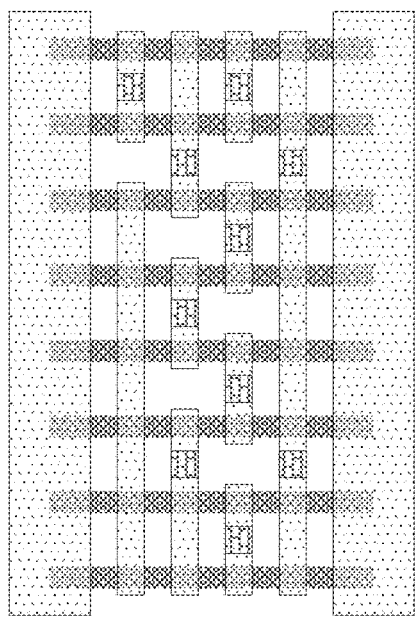
Figure 11A:
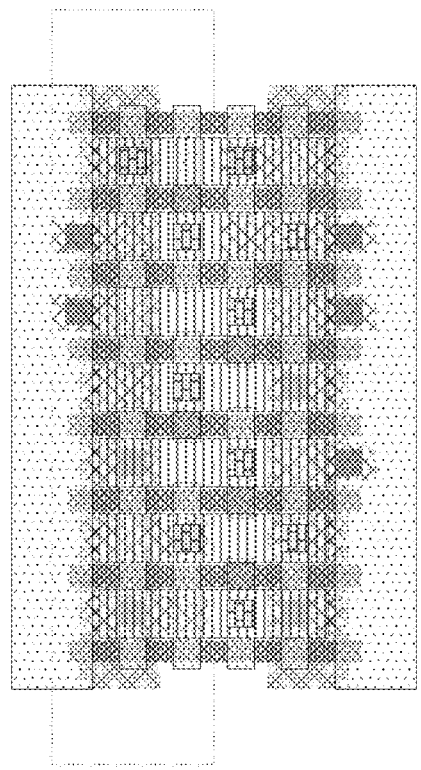
FIGS. 11A-D depict an ao211x1 cell.
Figure 11B:
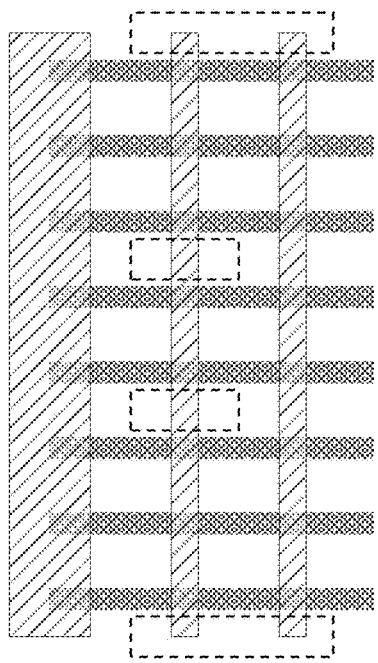
Figure 11C:
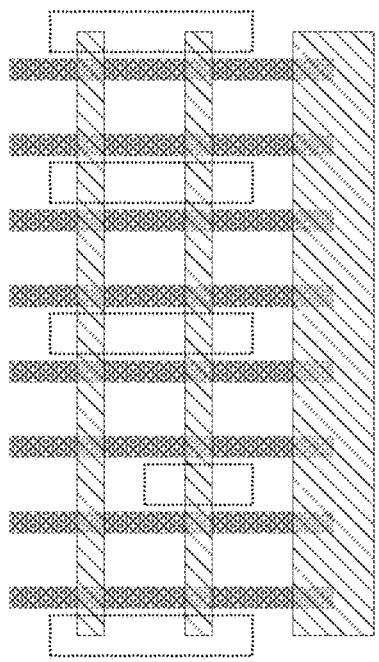
Figure 11D:
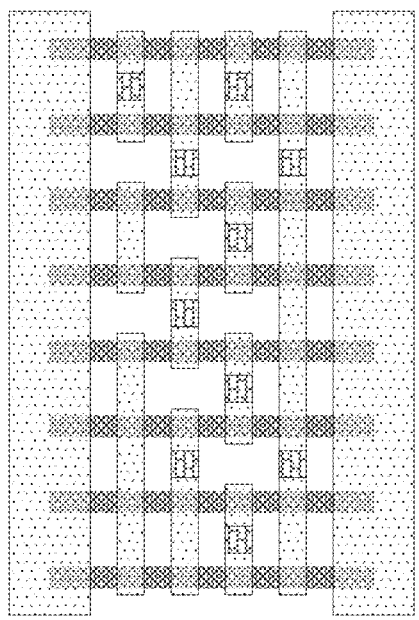
Figure 12A:
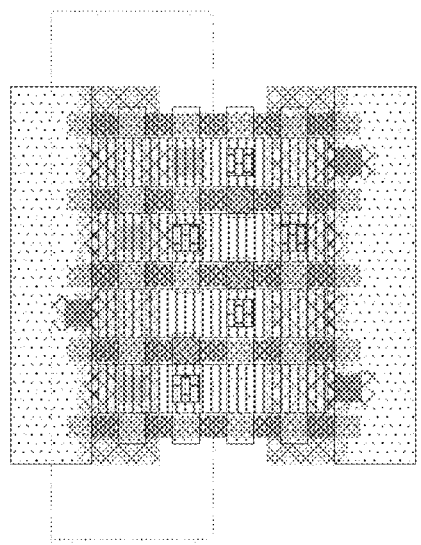
FIGS. 12A-D depict an aoi21x1 cell.
Figure 12B:
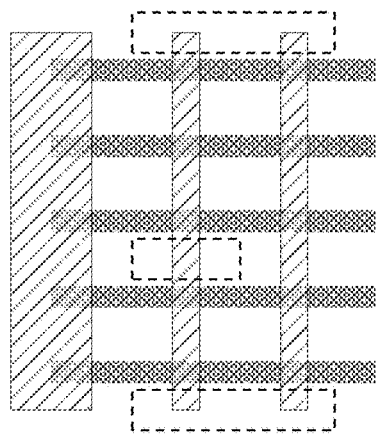
Figure 12C:
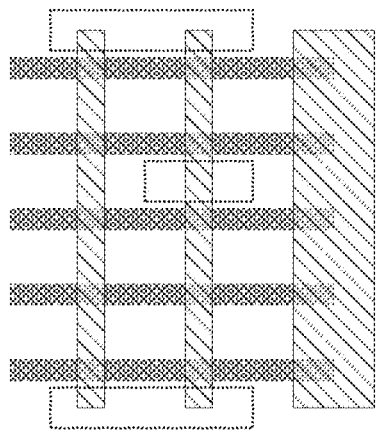
Figure 12D:
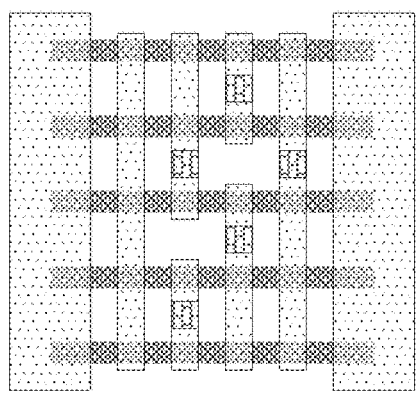
Figure 13A:
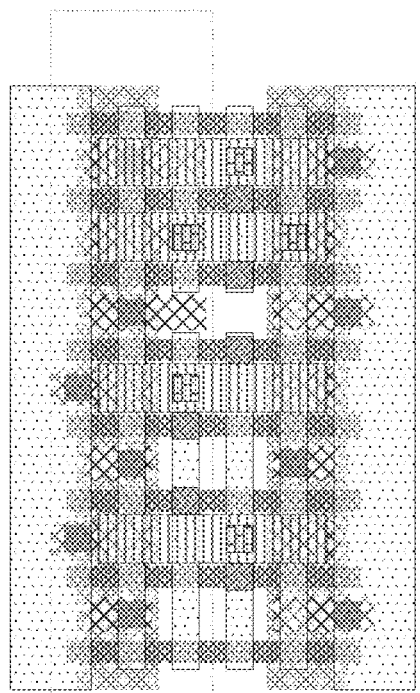
FIGS. 13A-D depict an aoi21x2 cell.
Figure 13B:
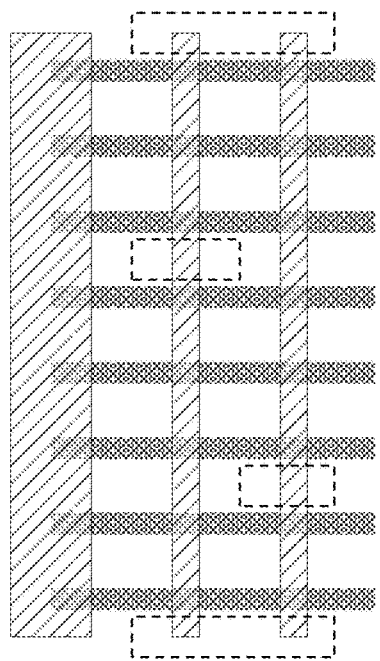
Figure 13C:
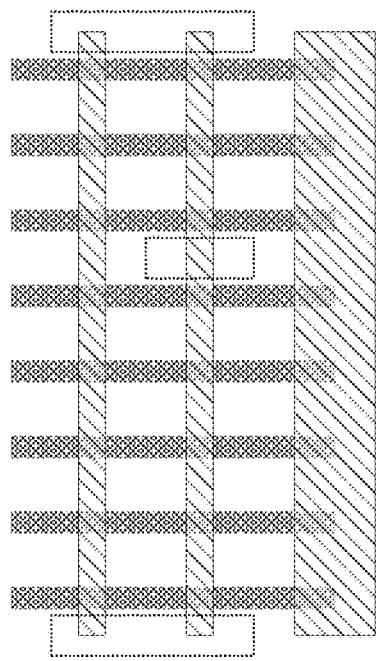
Figure 13D:
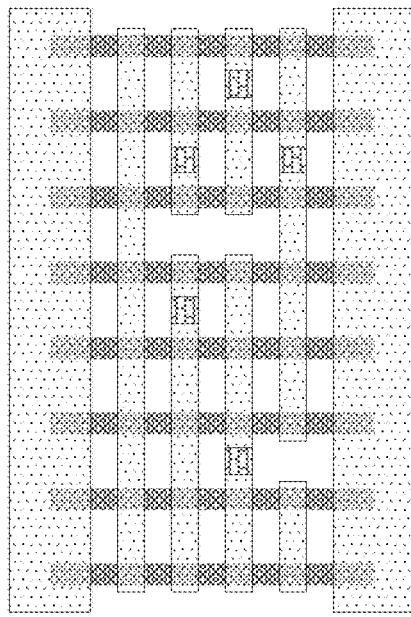
Figure 14A:
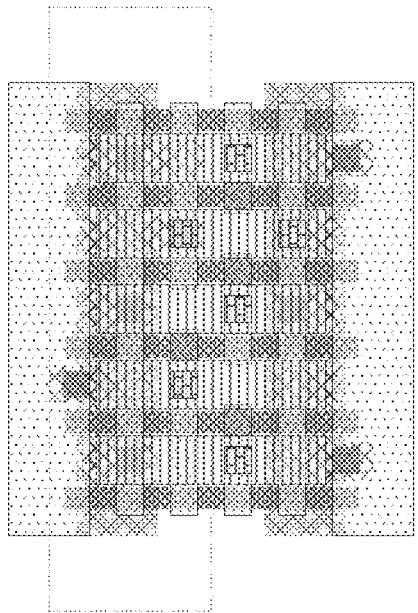
FIGS. 14A-D depict an aoi22x1 cell.
Figure 14B:
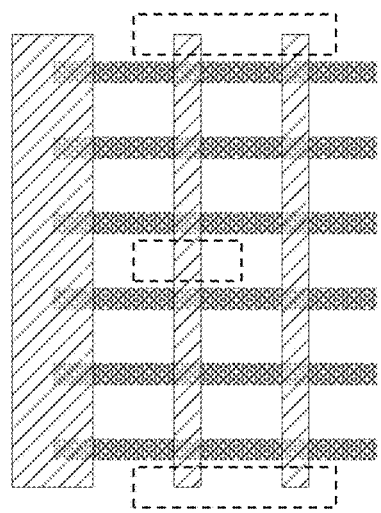
Figure 14C:
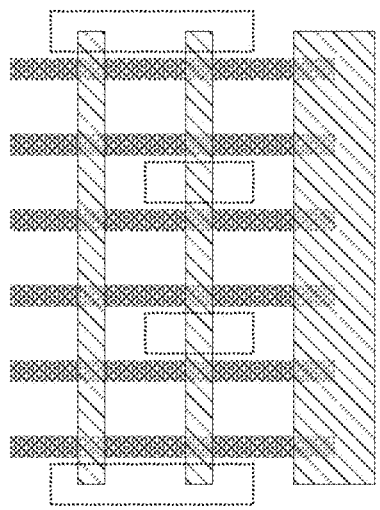
Figure 14D:
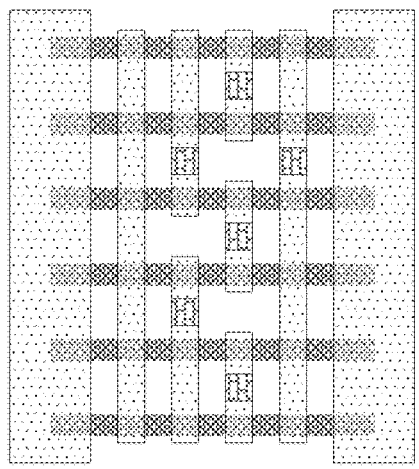
Figure 15A:
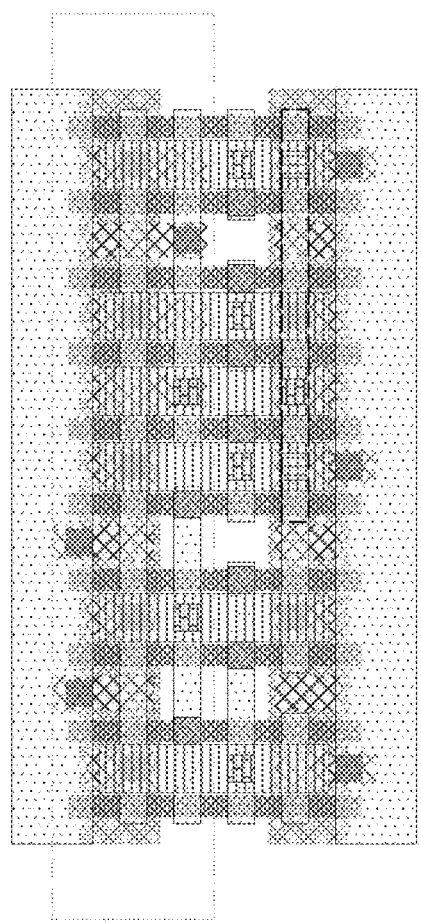
FIGS. 15A-D depict an aoi22x2 cell.
Figure 15B:
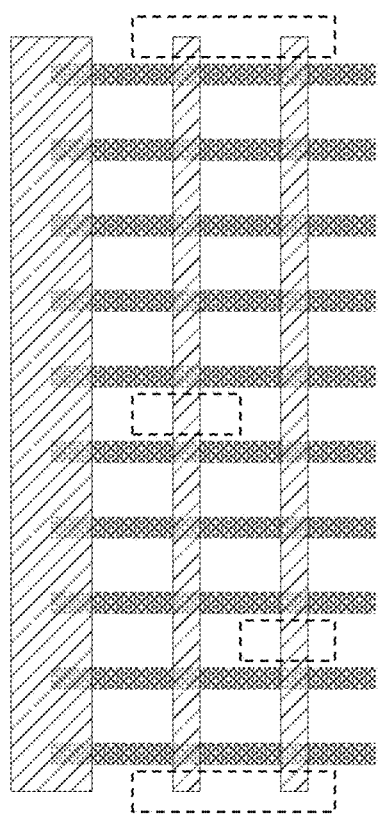
Figure 15C:
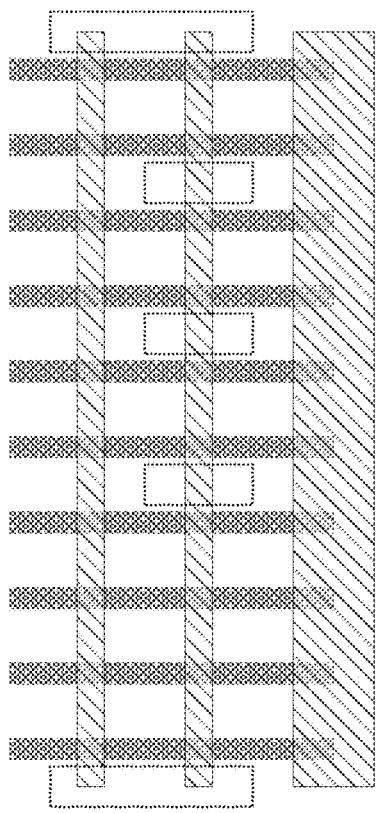
Figure 15D:
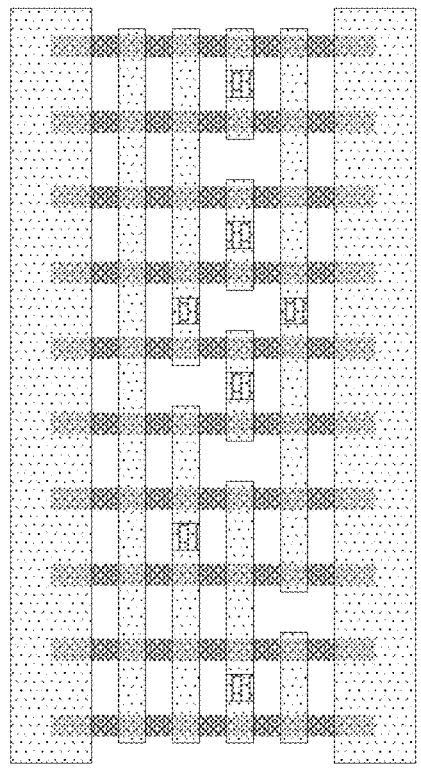
Figure 16A:
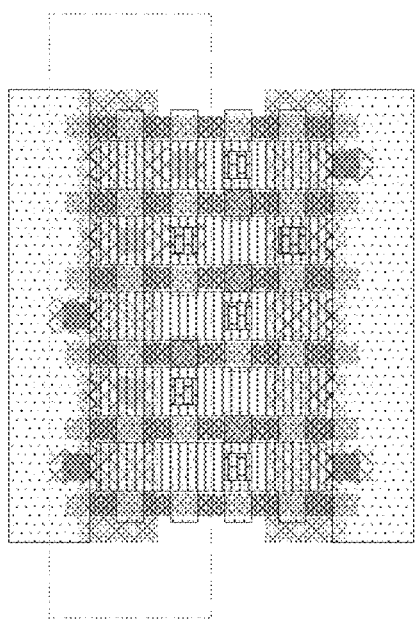
FIGS. 16A-D depict an aoi31x1 cell.
Figure 16B:
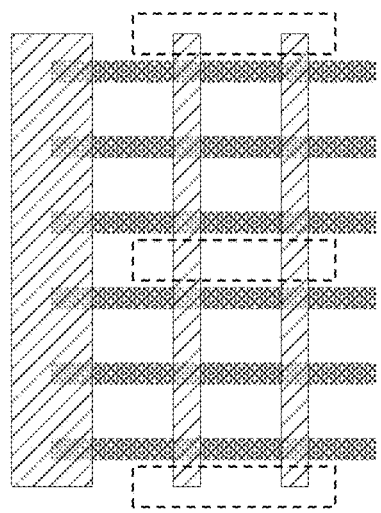
Figure 16C:
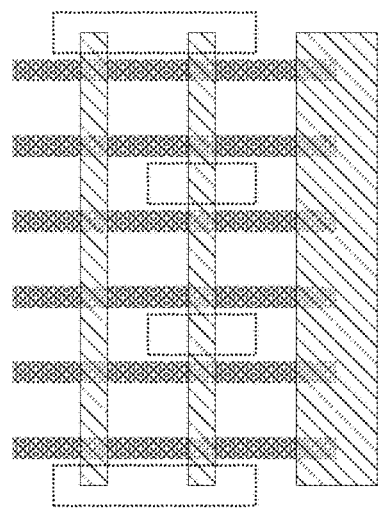
Figure 16D:
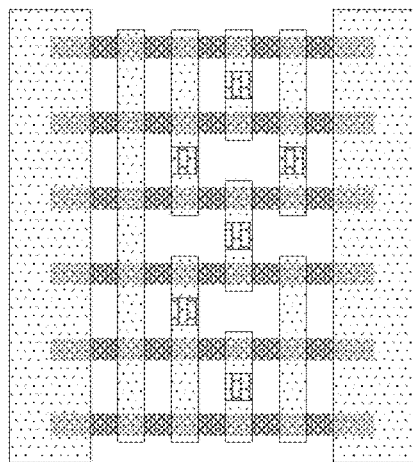
Figure 17A:
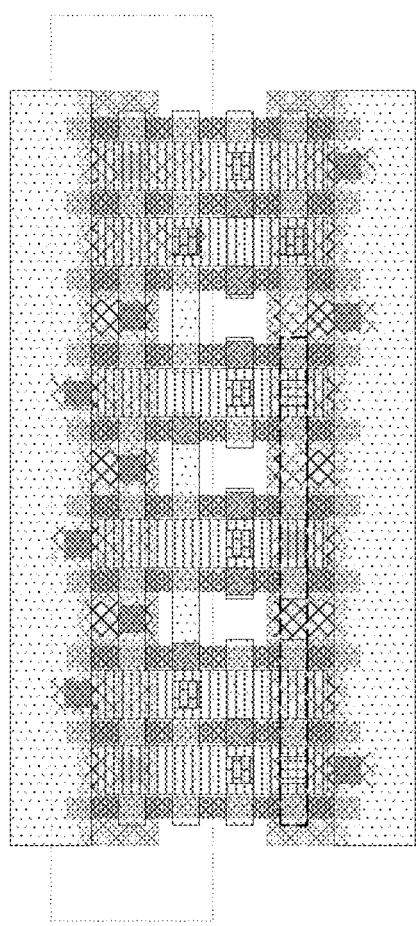
FIGS. 17A-D depict an aoi31x2 cell.
Figure 17B:
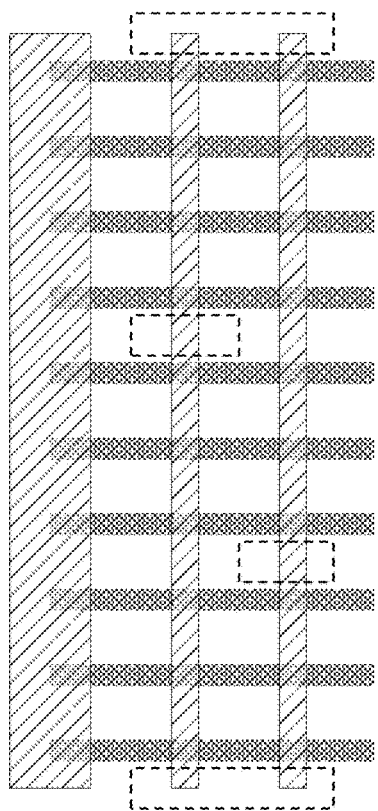
Figure 17C:
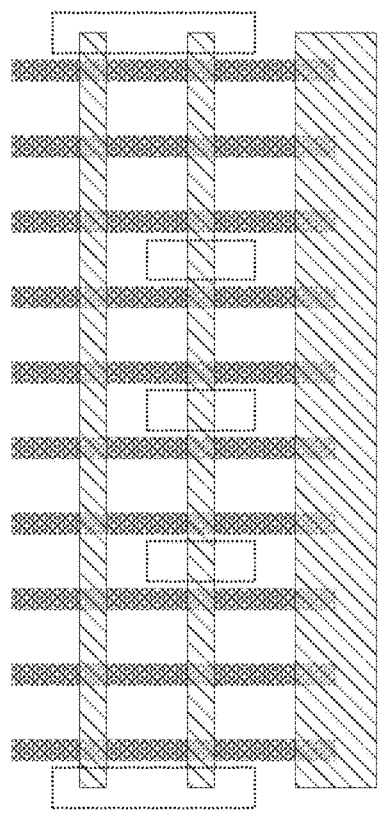
Figure 17D:
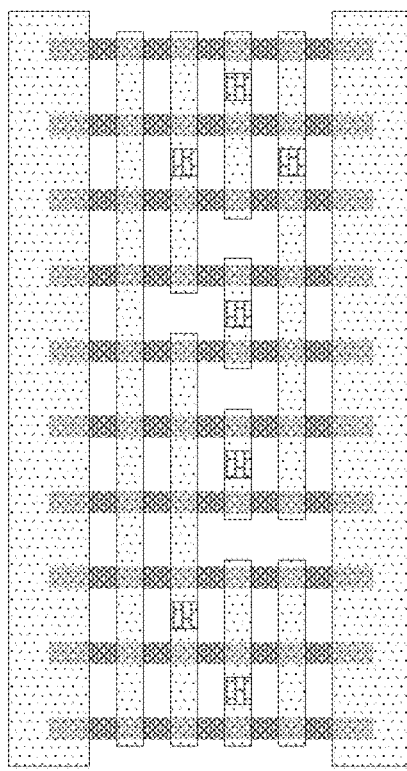
Figure 18A:
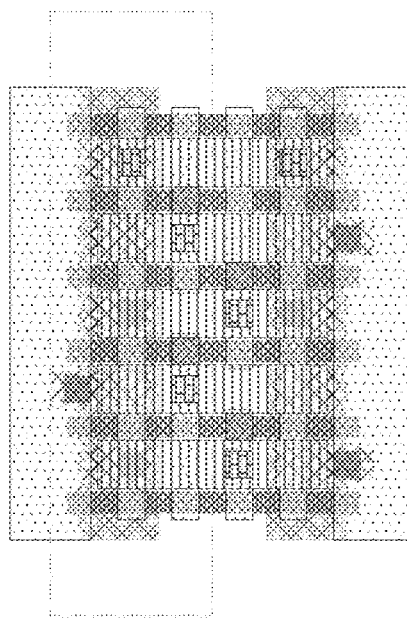
FIGS. 18A-D depict an aoi211x1 cell.
Figure 18B:
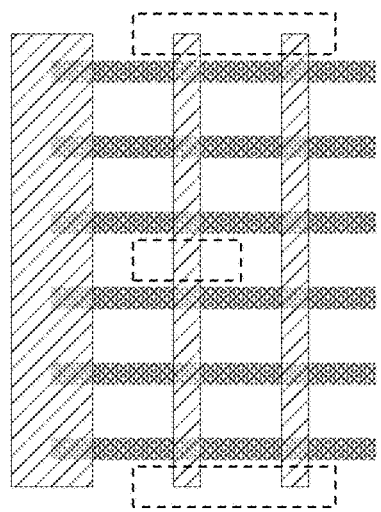
Figure 18C:
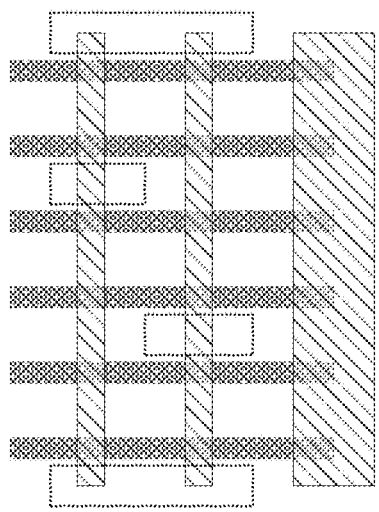
Figure 18D:
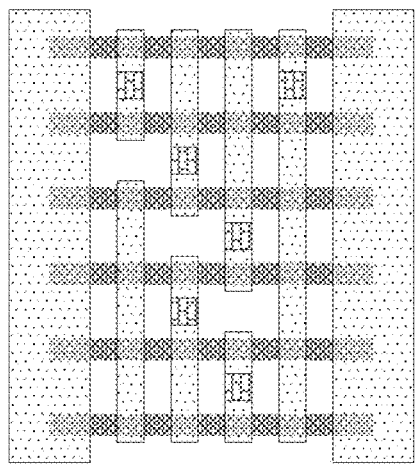
Figure 19A:
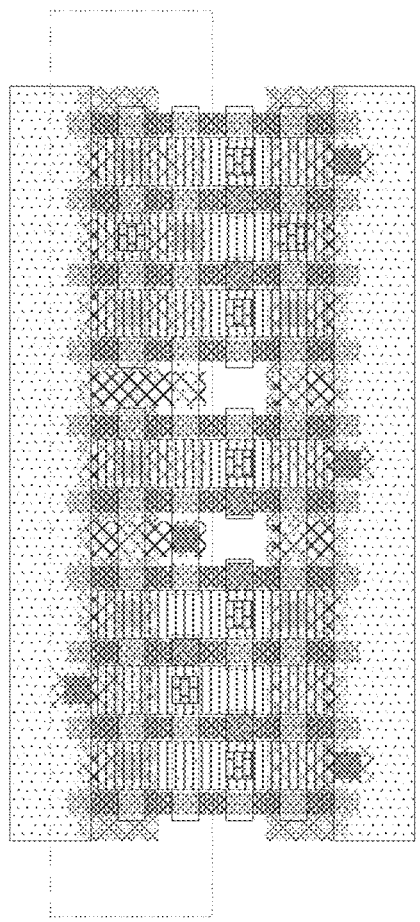
FIGS. 19A-D depict an aoi222x1 cell.
Figure 19B:
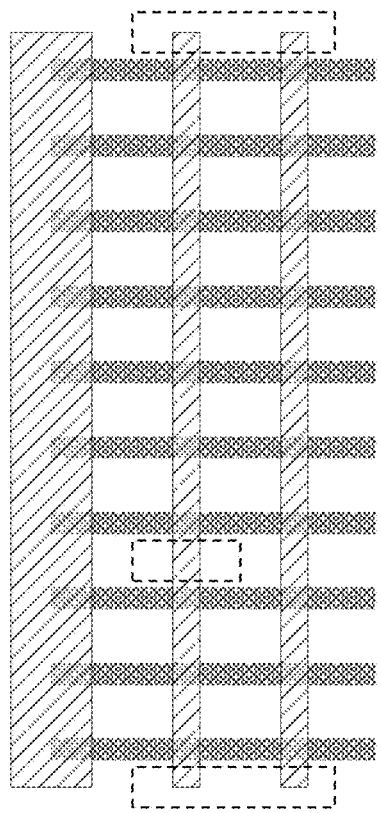
Figure 19C:
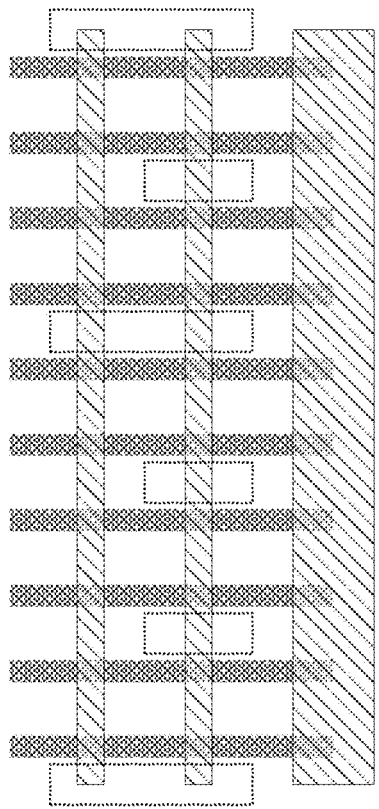
Figure 19D:
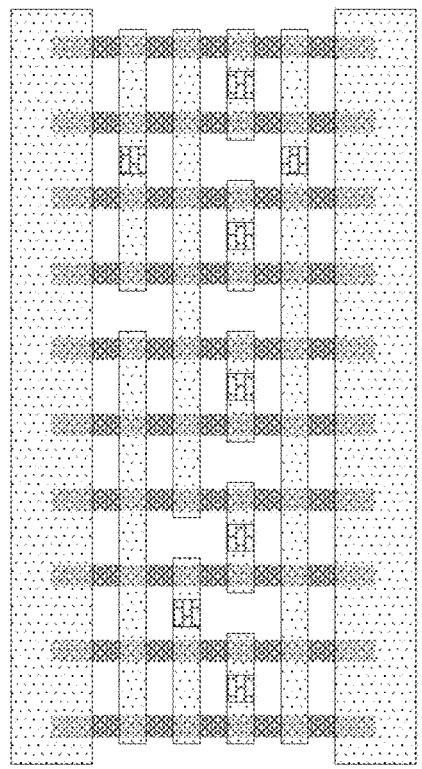
Figure 20A:
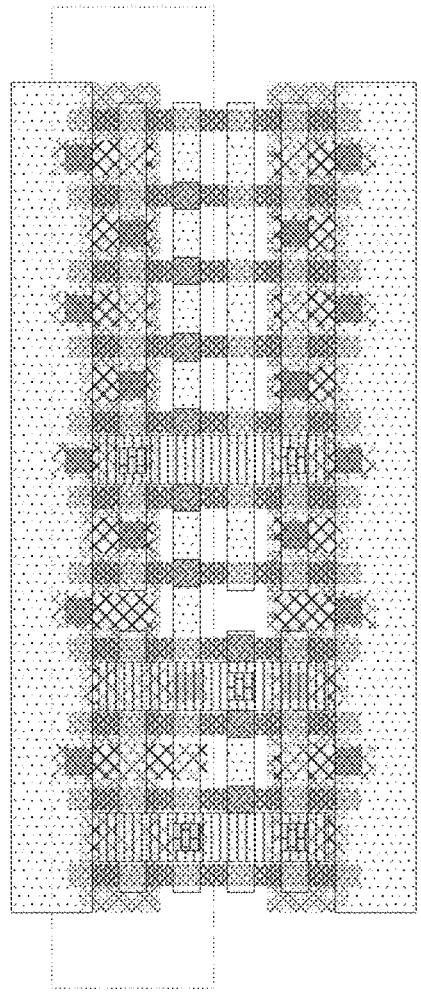
FIGS. 20A-D depict an bufhx6 cell.
Figure 20B:
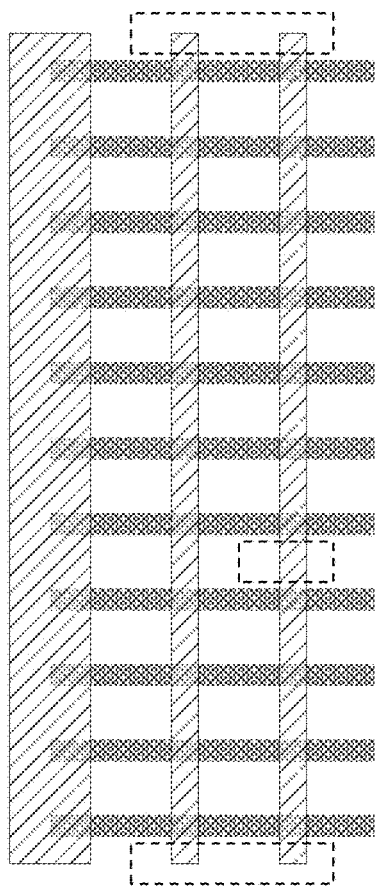
Figure 20C:
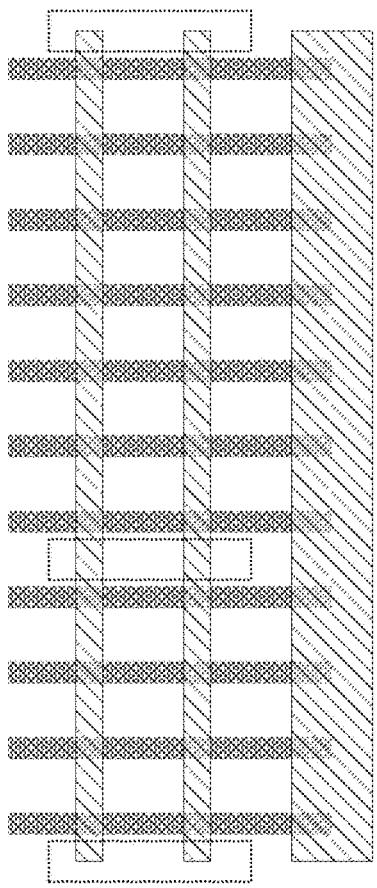
Figure 20D:
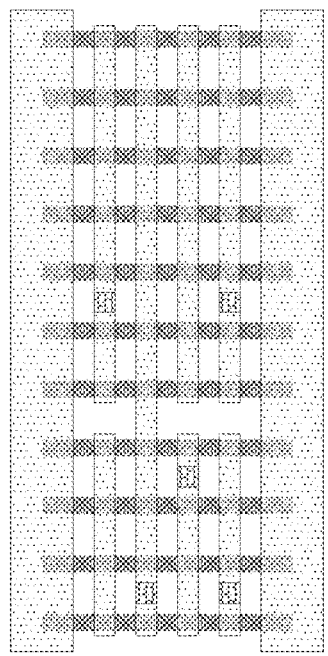
Figure 21A:
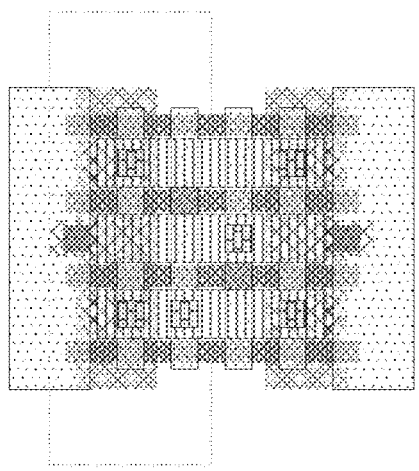
FIGS. 21A-D depict an bufx1 cell.
Figure 21B:
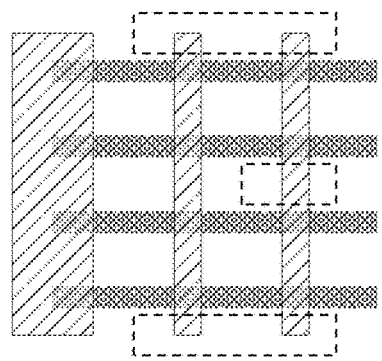
Figure 21C:
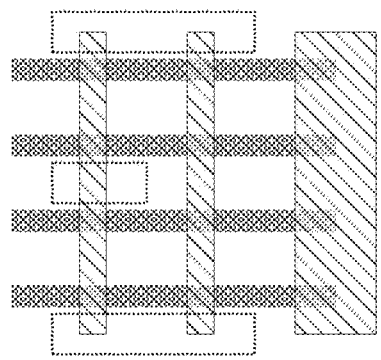
Figure 21D:
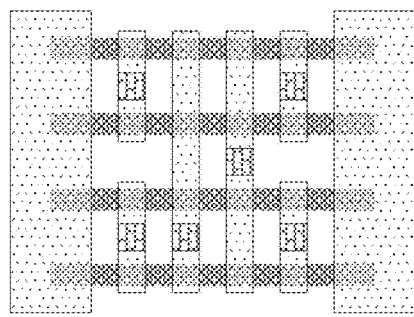
Figure 22A:
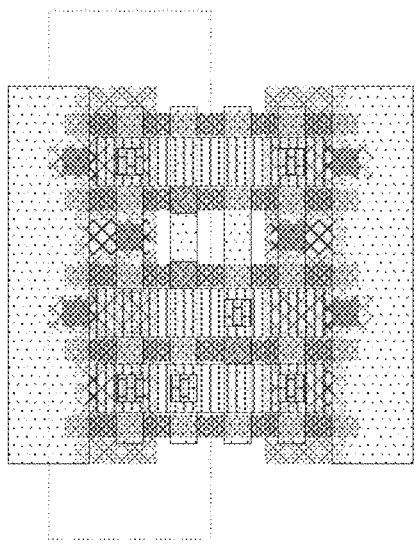
FIGS. 22A-D depict an bufx2 cell.
Figure 22B:
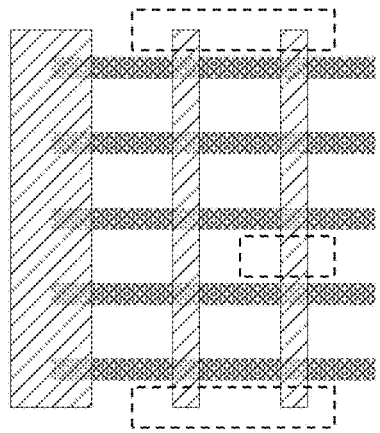
Figure 22C:
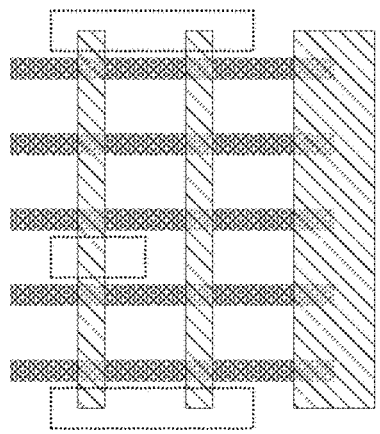
Figure 22D:
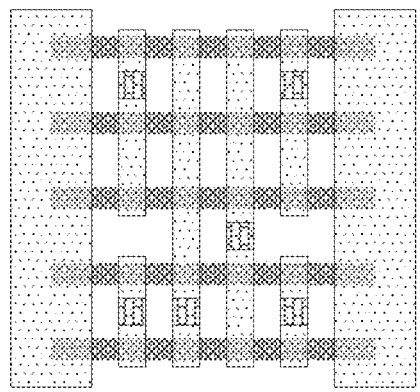
Figure 23A:
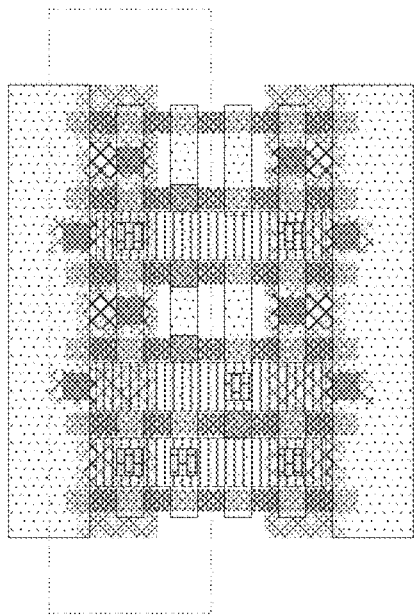
FIGS. 23A-D depict an bufx3 cell.
Figure 23B:
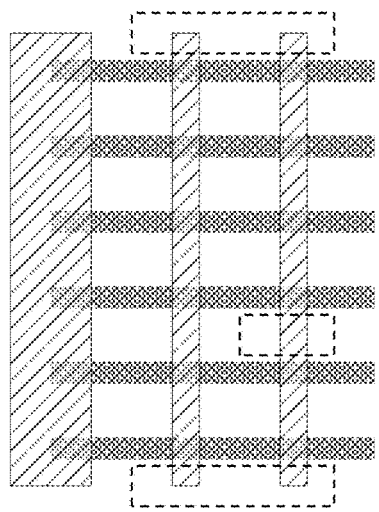
Figure 23C:
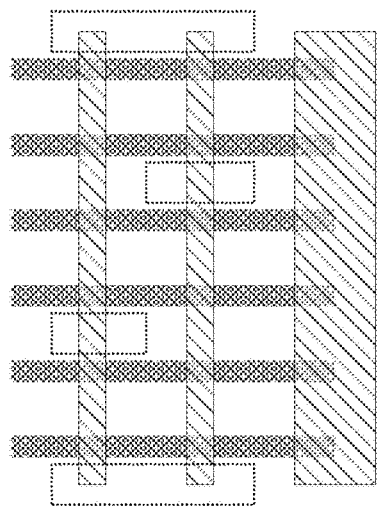
Figure 23D:
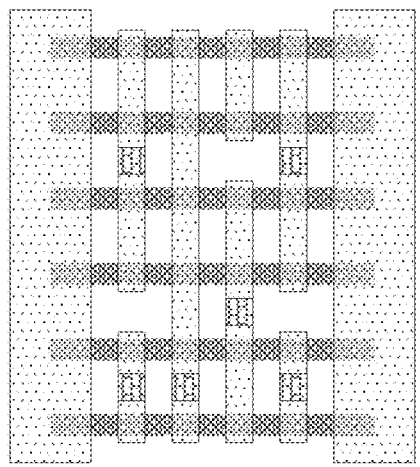
Figure 24A:
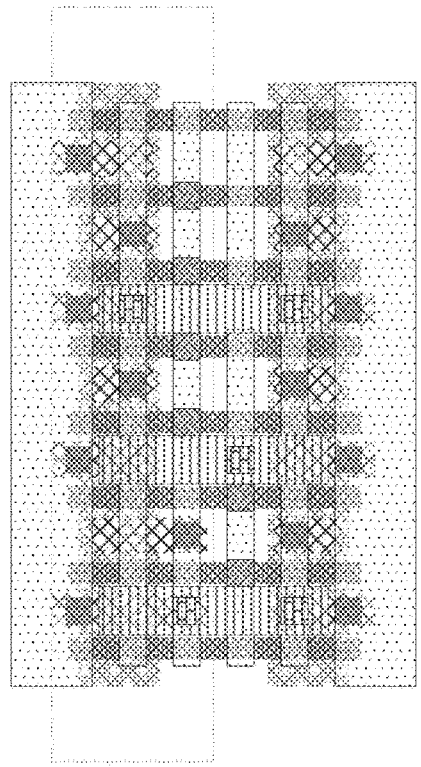
FIGS. 24A-D depict an bufx4 cell.
Figure 24B:
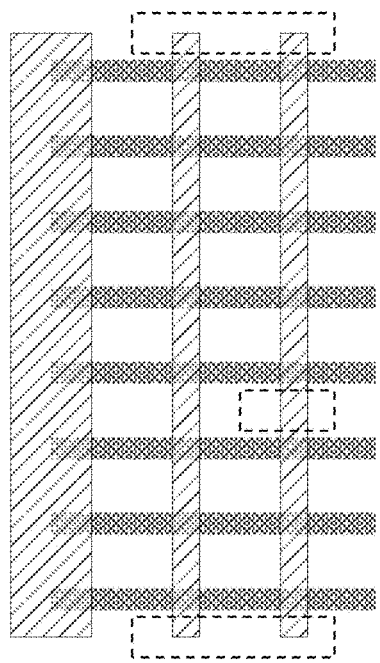
Figure 24C:
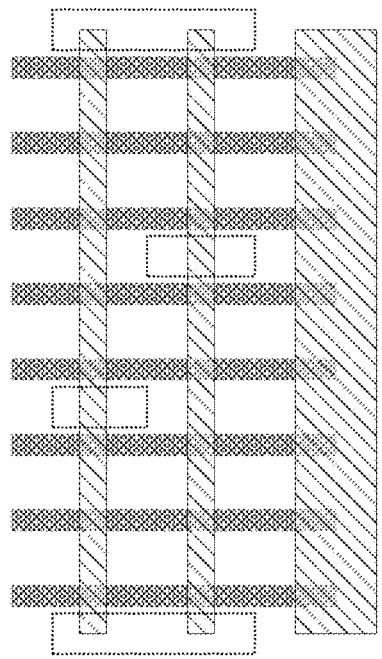
Figure 24D:
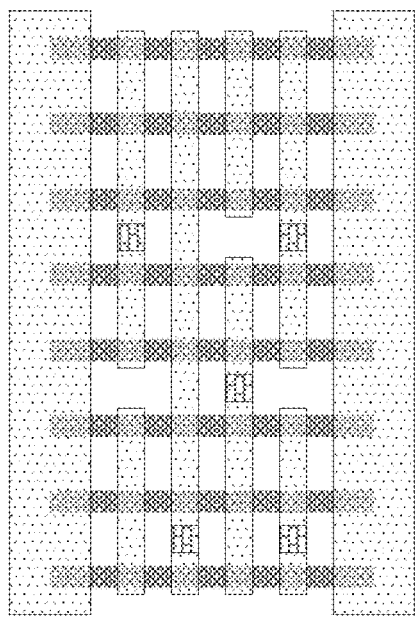
Figure 25A:
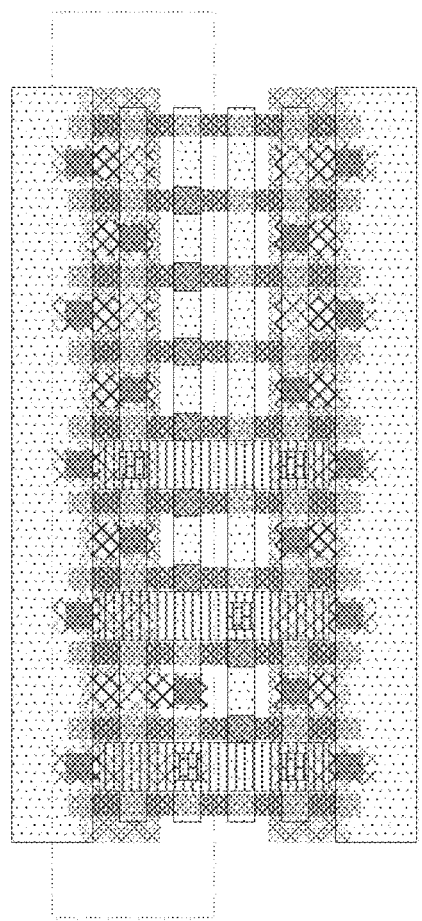
FIGS. 25A-D depict an bufx6 cell.
Figure 25B:
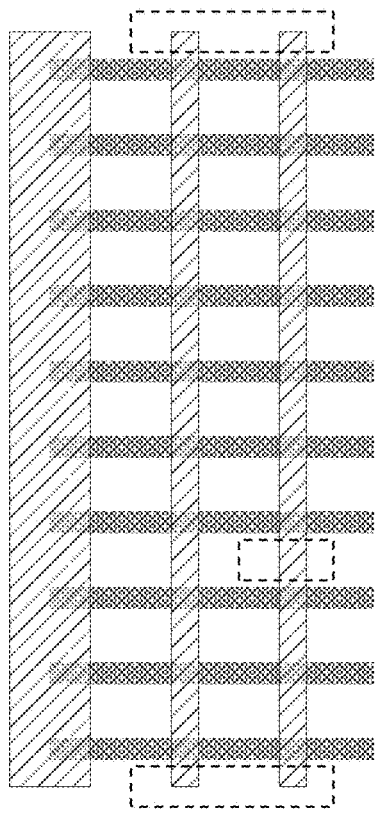
Figure 25C:
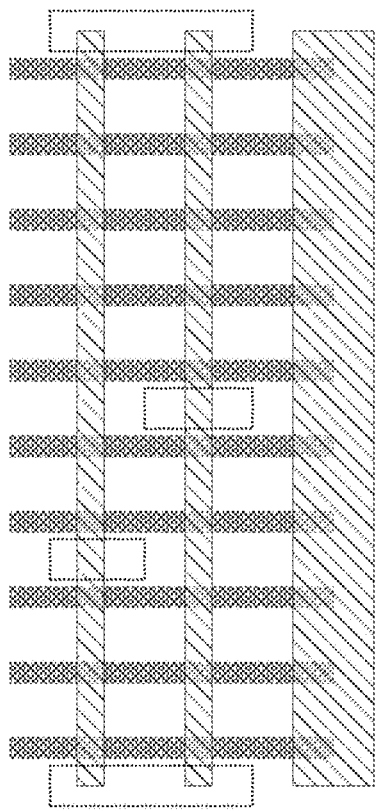
Figure 25D:
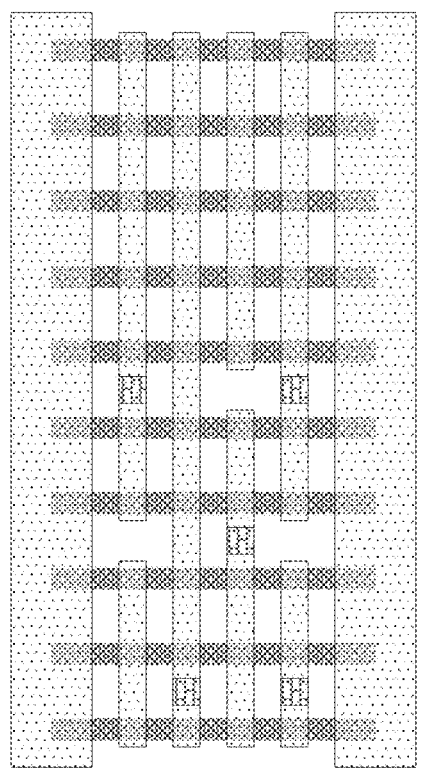
Figure 26A:
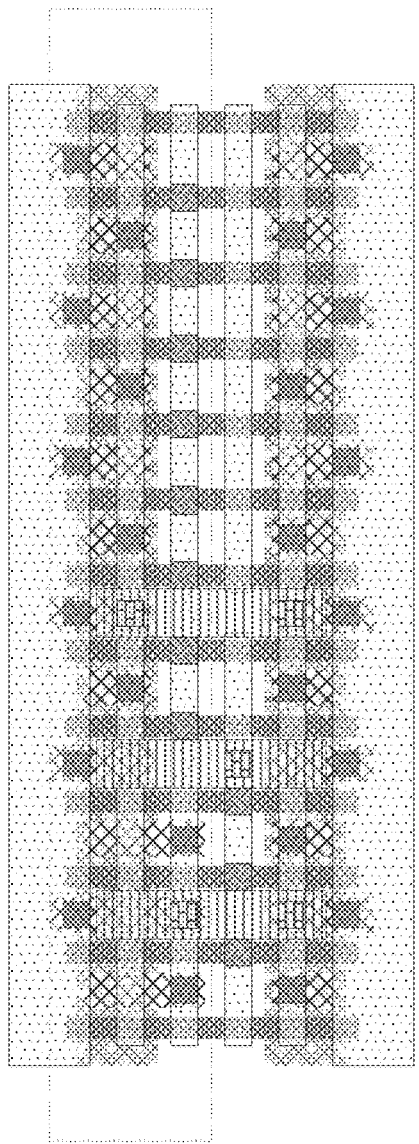
Figure 26C:
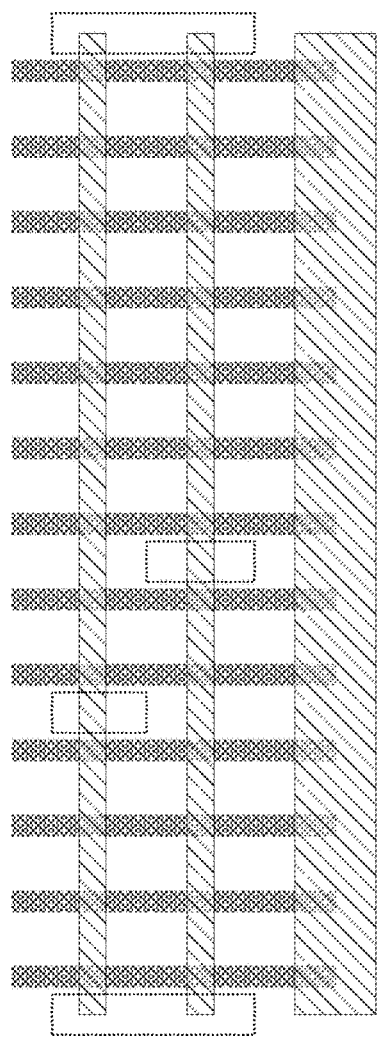
Figure 26D:
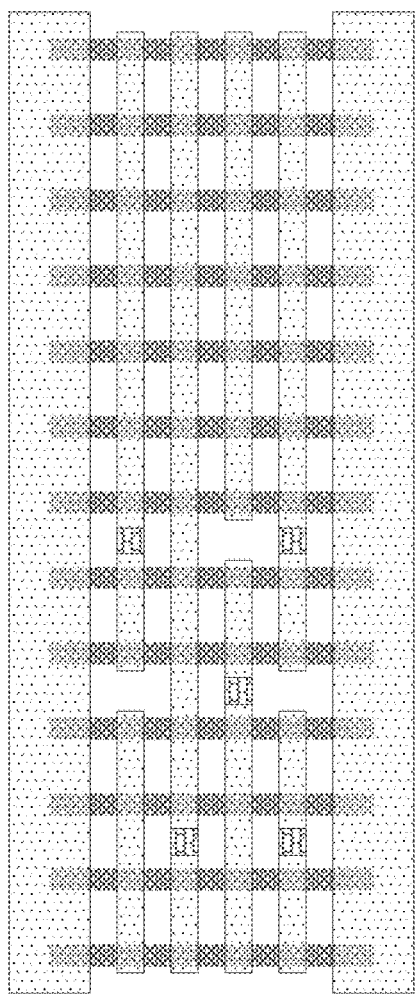
Figure 27A:
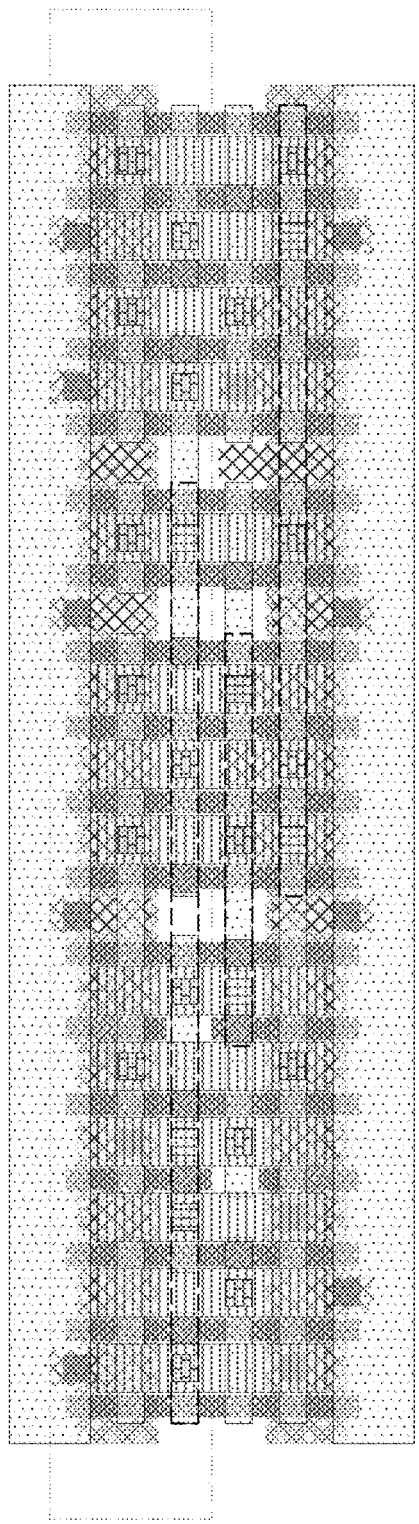
FIGS. 27A-D depict an ckor2lban2x1 cell.
Figure 27B:
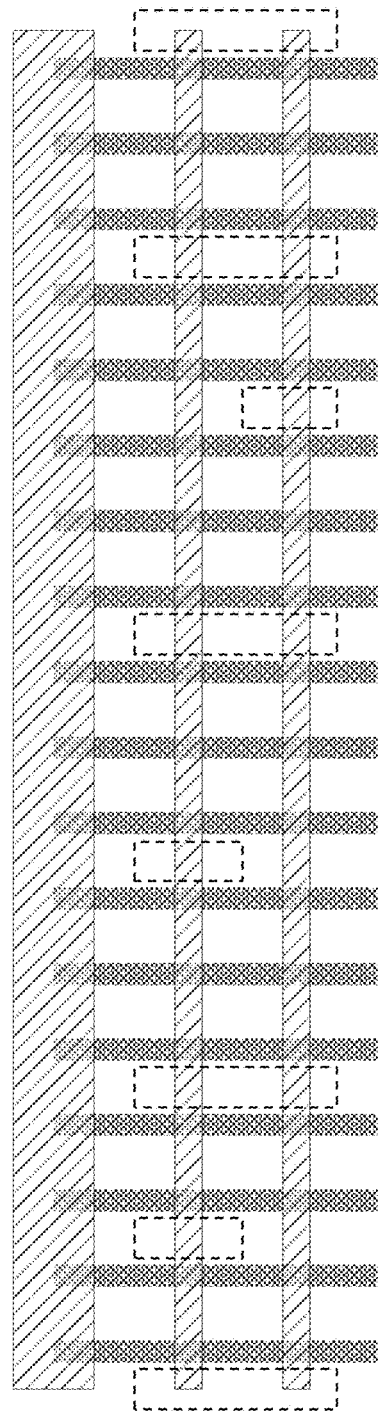
Figure 27C:
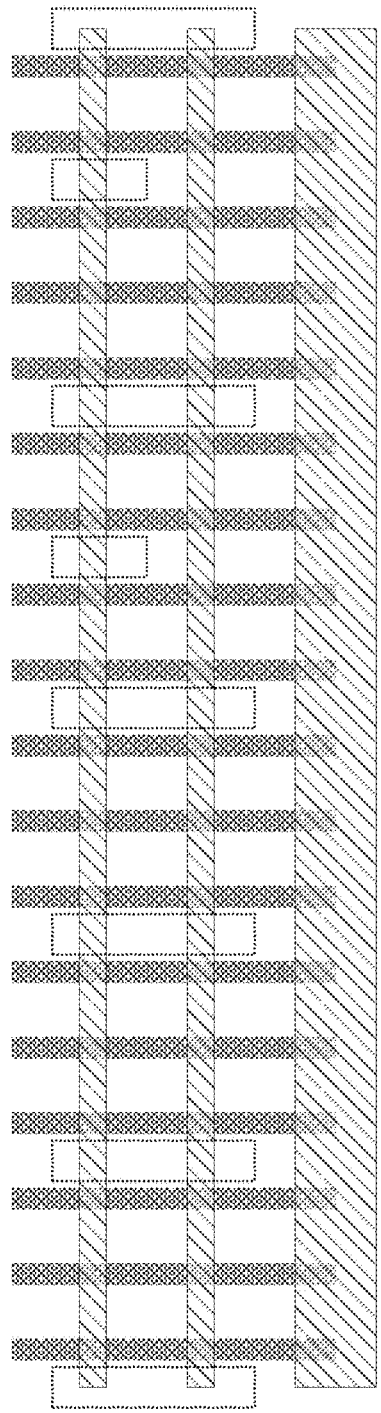
Figure 27D:
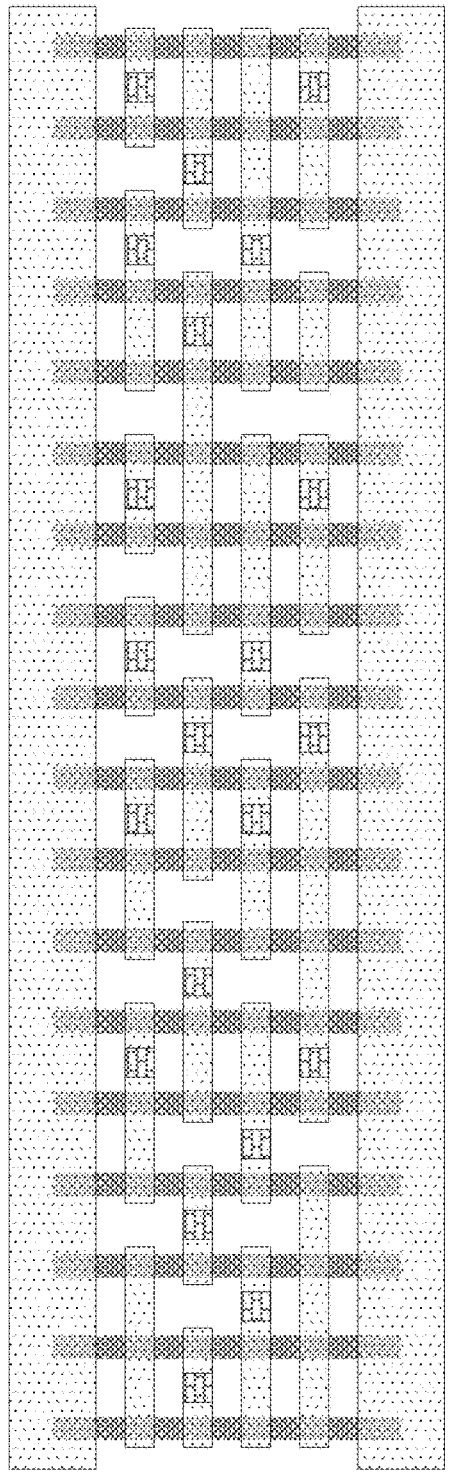
Figure 28A:
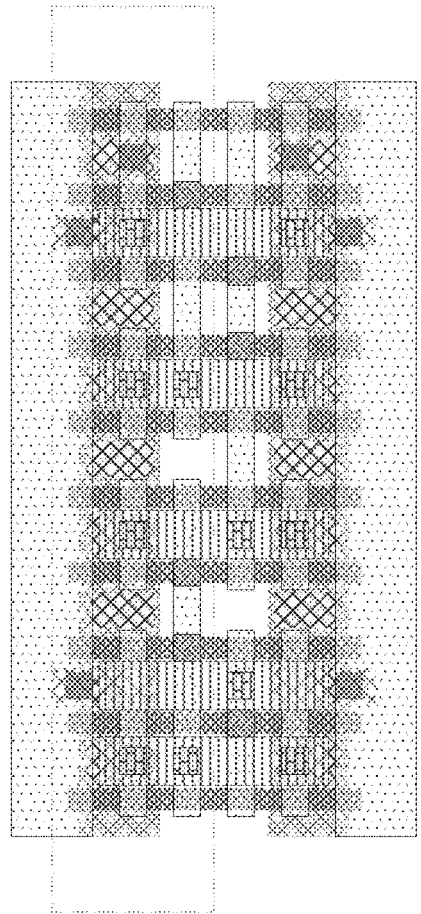
FIGS. 28A-D depict an dlyx1 cell.
Figure 28B:
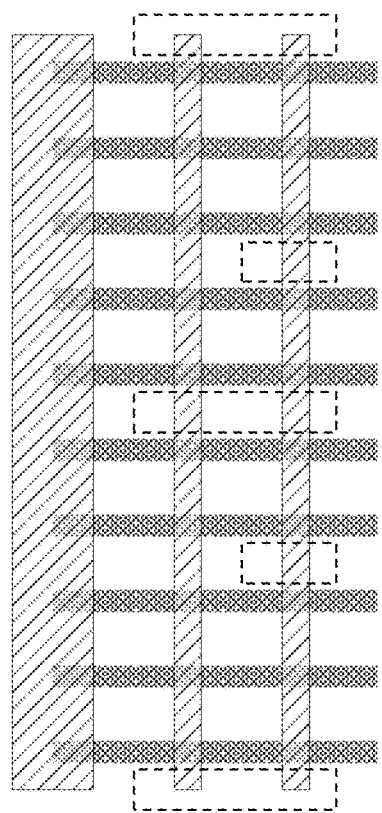
Figure 28C:
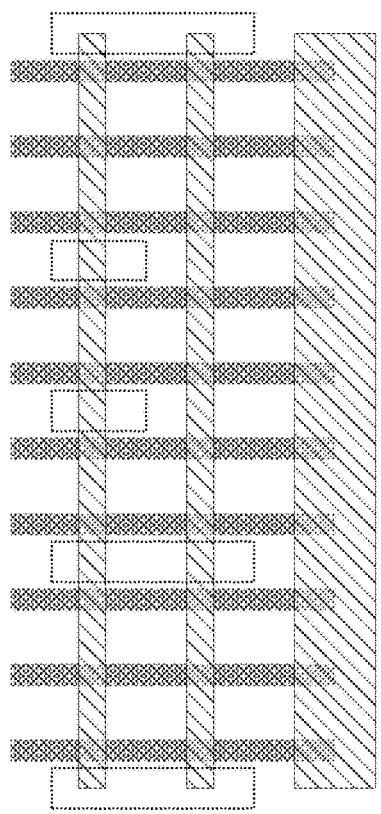
Figure 28D:
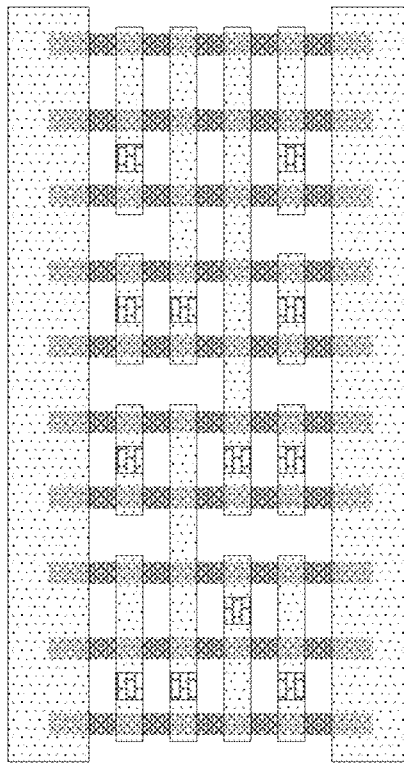
Figure 29A:
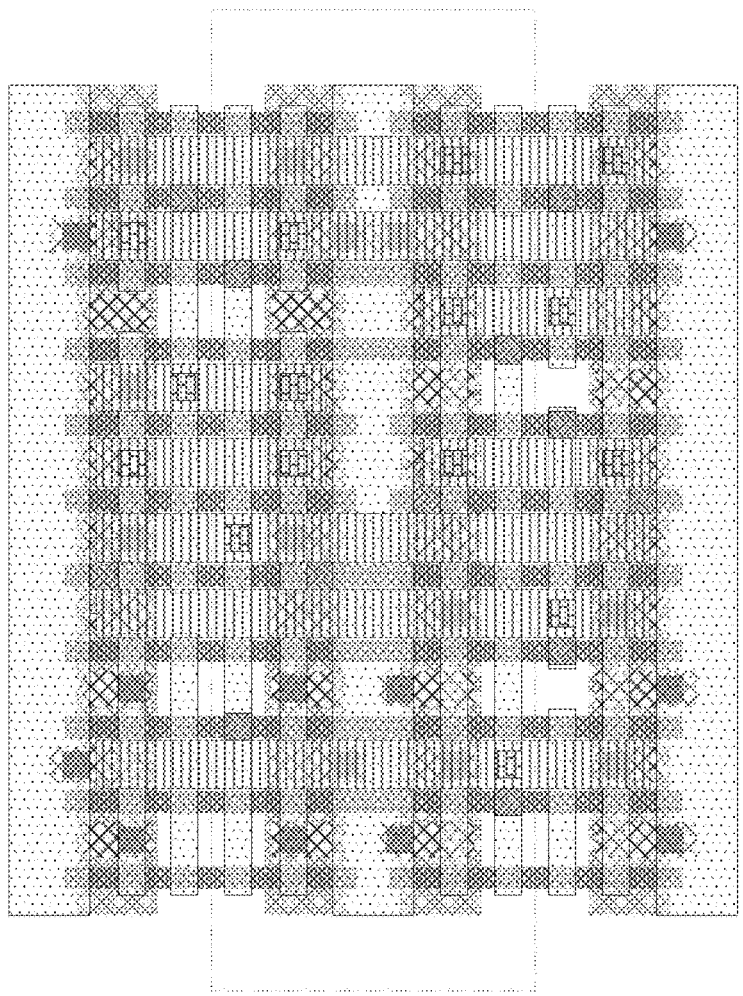
FIGS. 29A-D depict an fax1 cell.
Figure 29B:
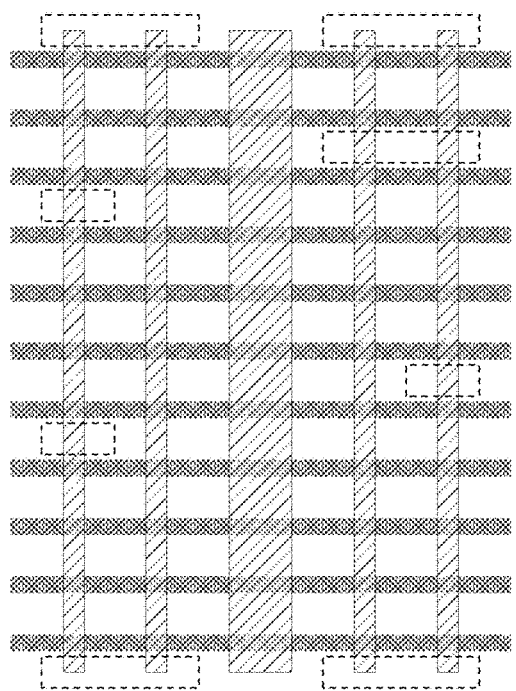
Figure 29C:
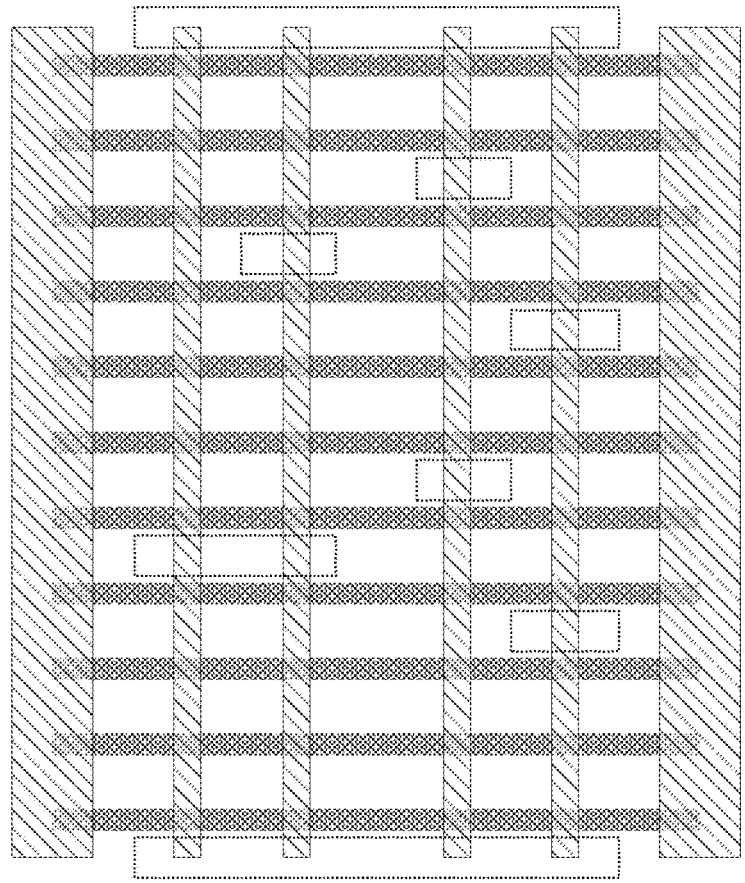
Figure 29D:
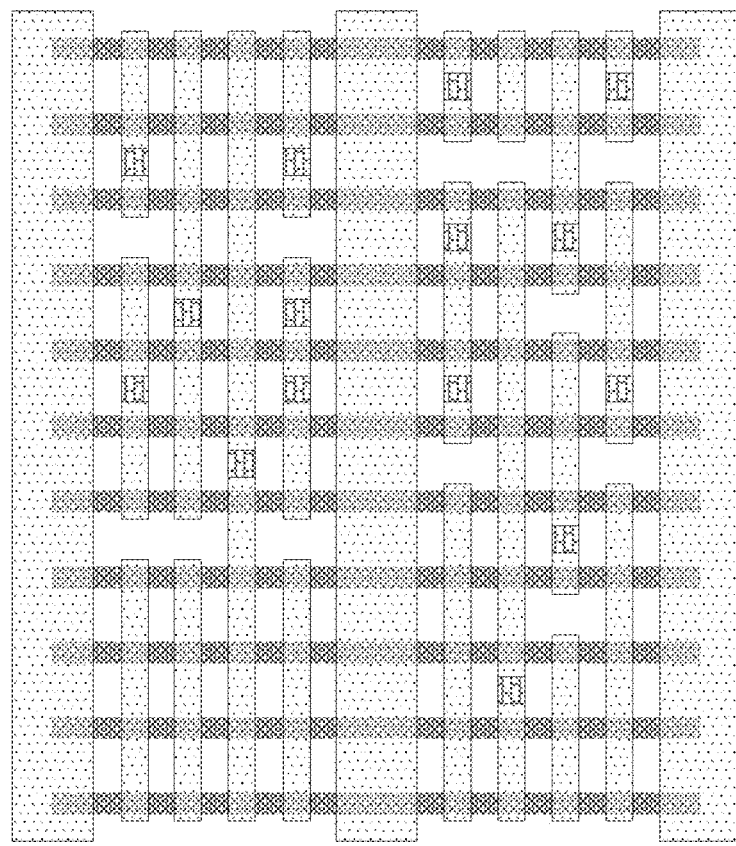
Figure 30A:
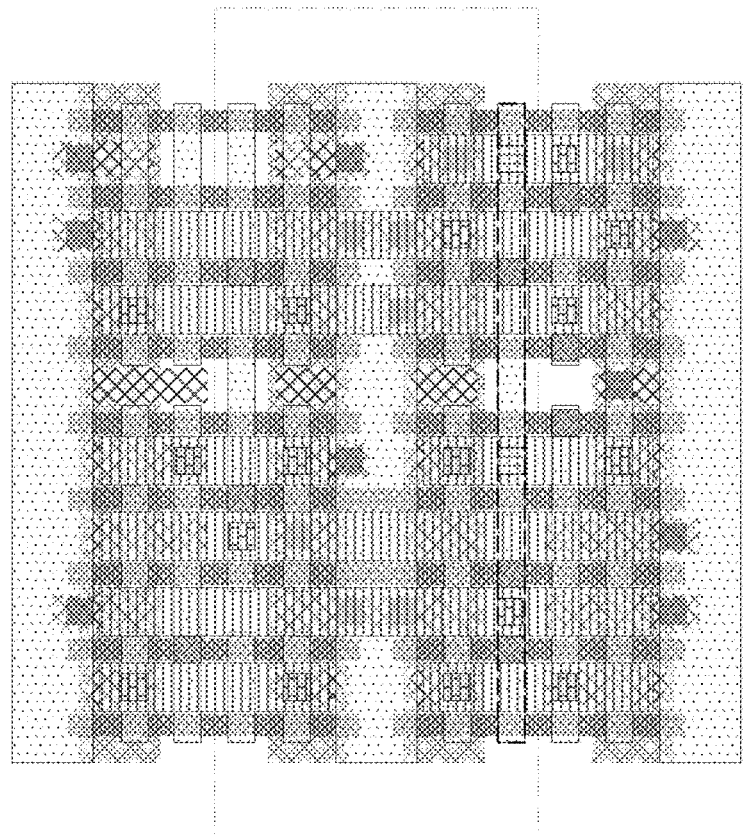
FIGS. 30A-D depict an hax1 cell.
Figure 30B:
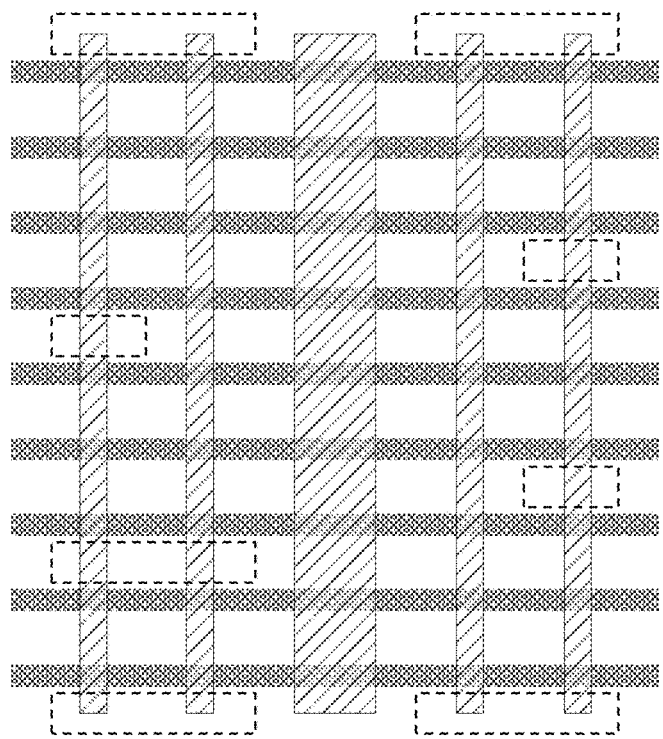
Figure 30C:
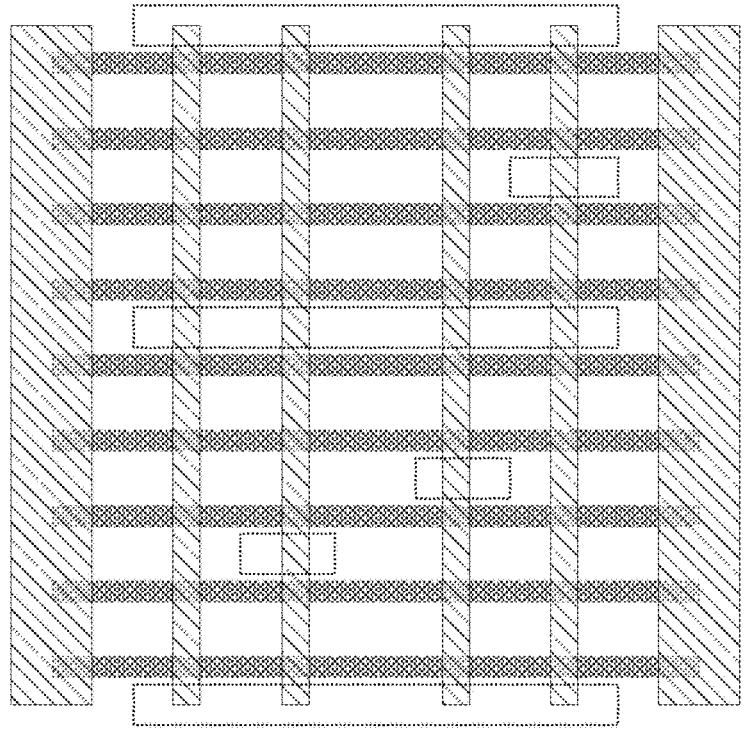
Figure 30D:
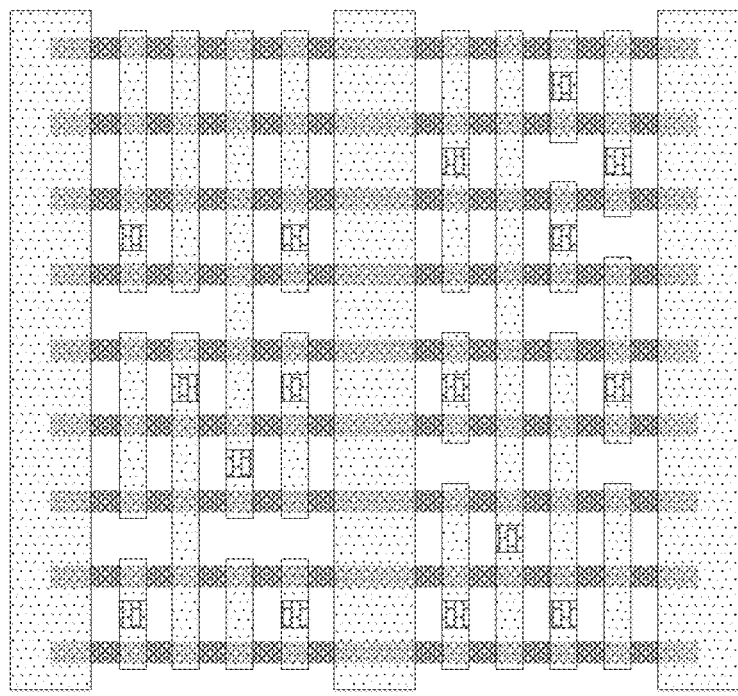
Figure 31A:
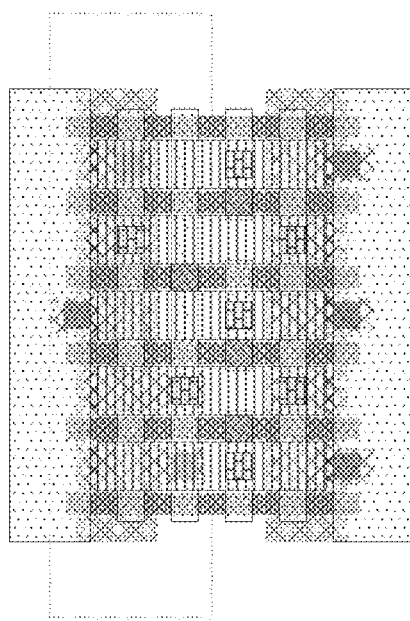
FIGS. 31A-D depict an iaoi21x1 cell.
Figure 31B:
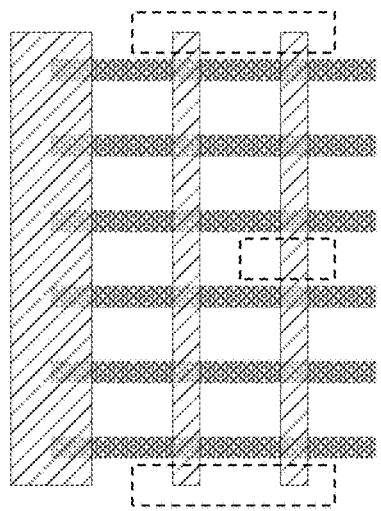
Figure 31C:
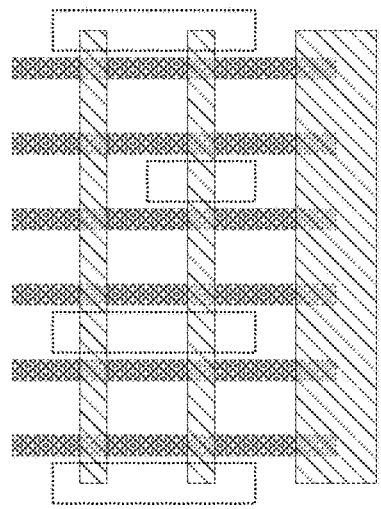
Figure 31D:
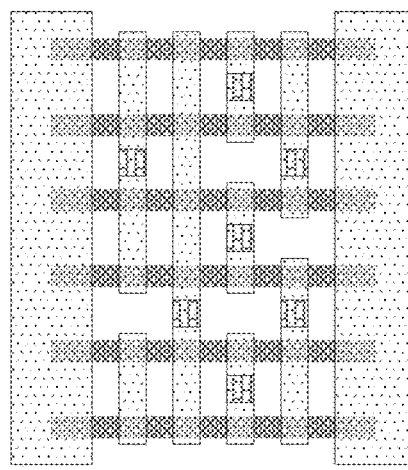
Figure 32A:
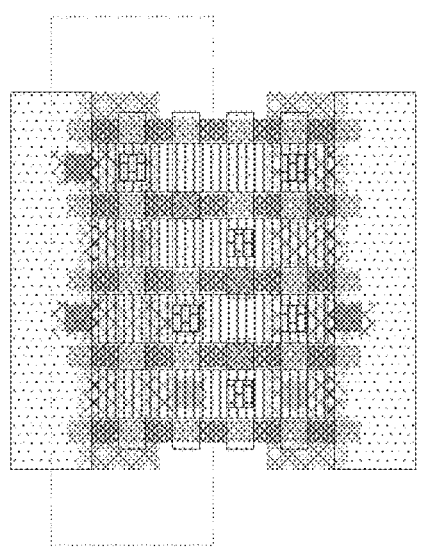
FIGS. 32A-D depict an ind2x1 cell.
Figure 32B:
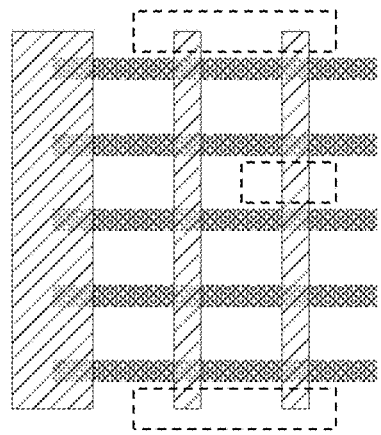
Figure 32C:
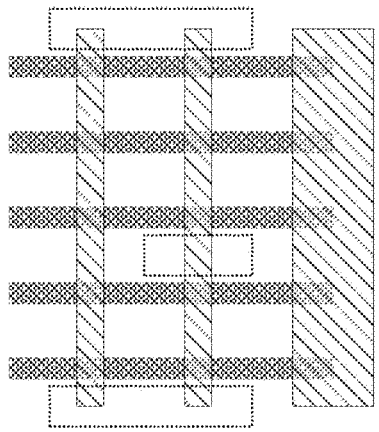
Figure 32D:
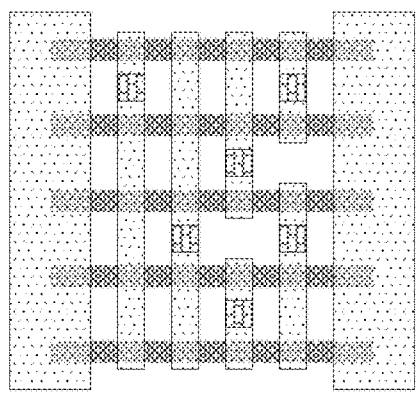
Figure 33A:
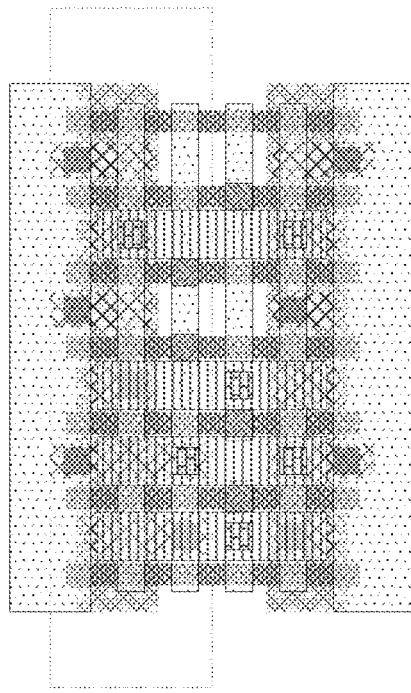
FIGS. 33A-D depict an ind2x2 cell.
Figure 33B:
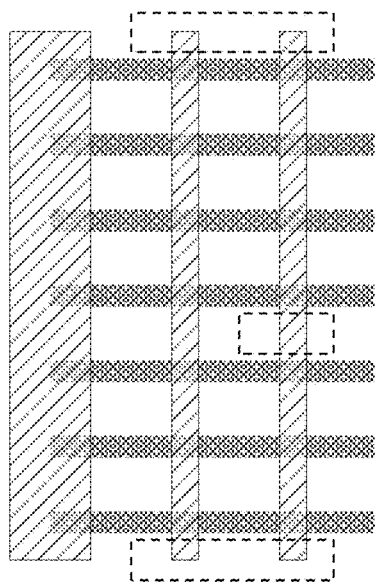
Figure 33C:
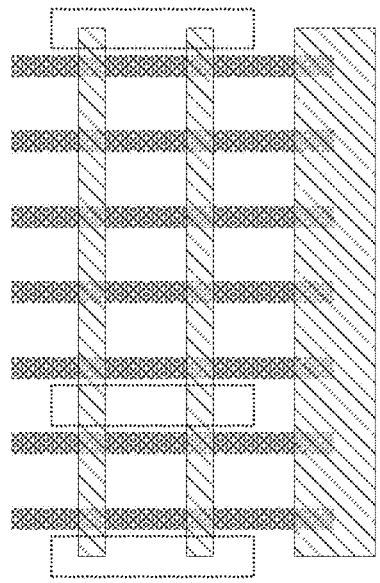
Figure 33D:
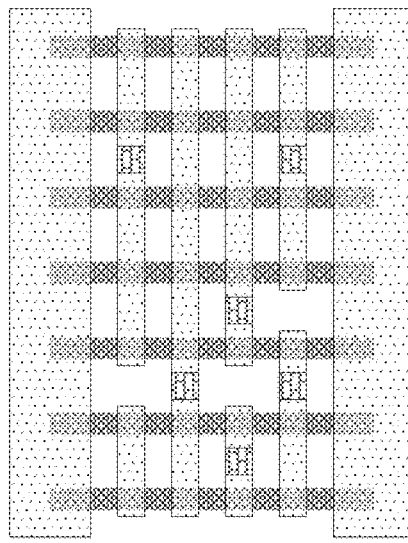
Figure 34A:
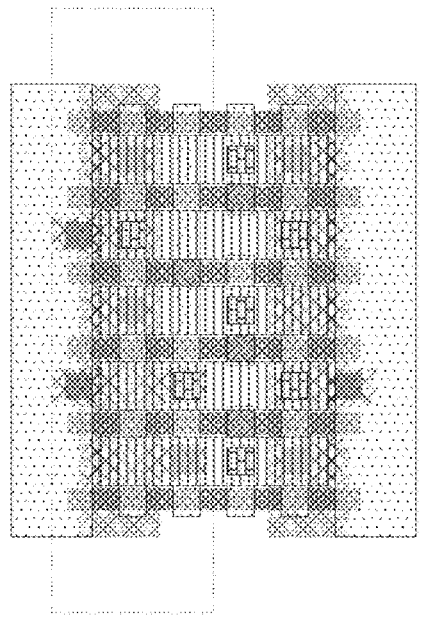
FIGS. 34A-D depict an ind3x1 cell.
Figure 34B:
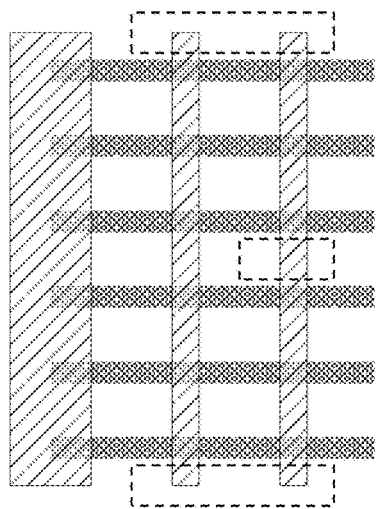
Figure 34C:
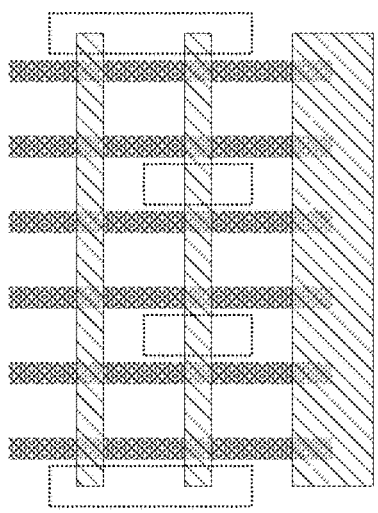
Figure 34D:
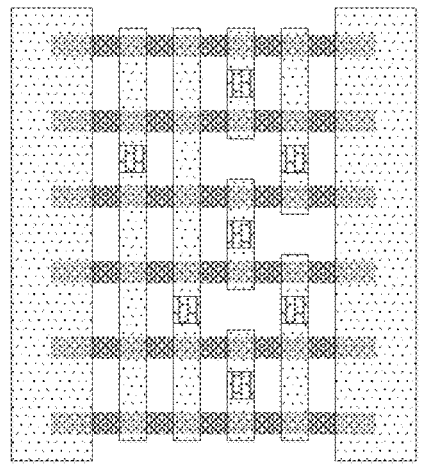
Figure 35A:
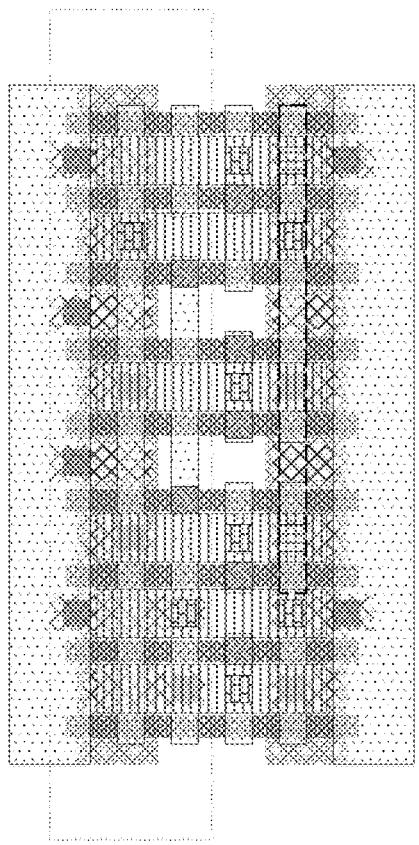
FIGS. 35A-D depict an ind3x2 cell.
Figure 35B:
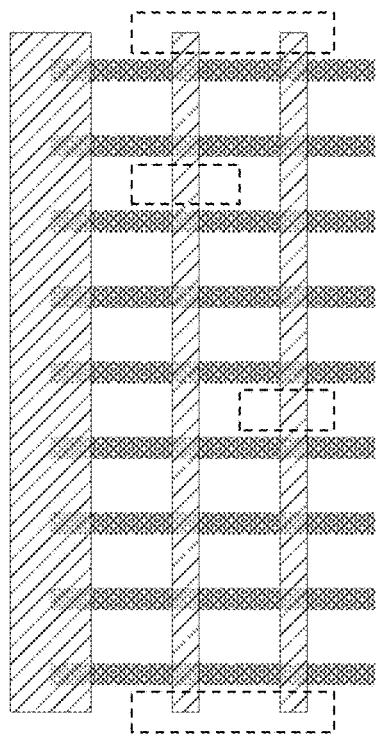
Figure 35C:
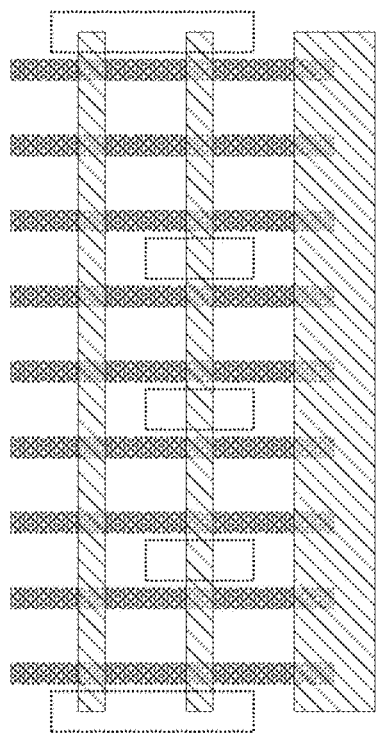
Figure 35D:
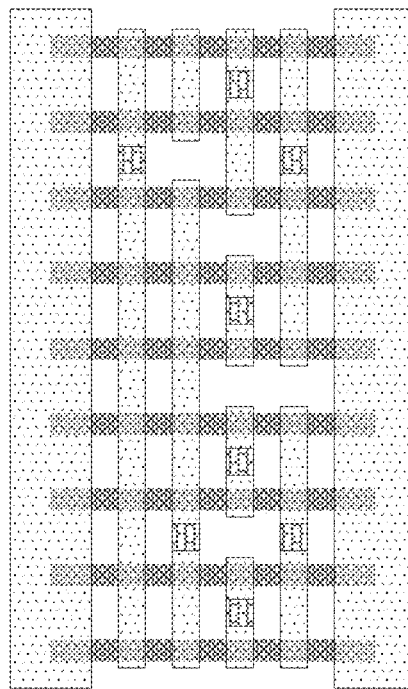
Figure 36A:
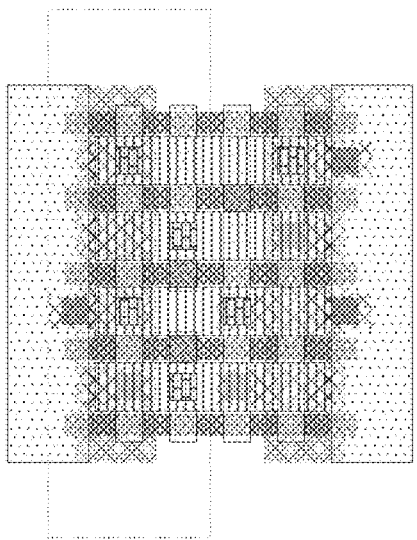
FIGS. 36A-D depict an inr2x1 cell.
Figure 36B:
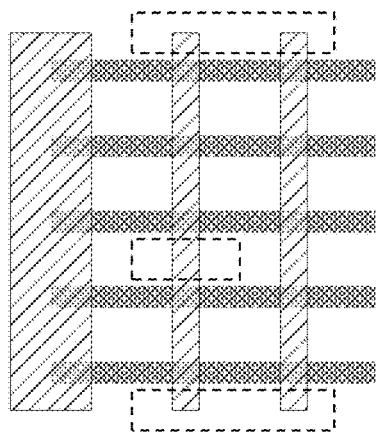
Figure 36C:
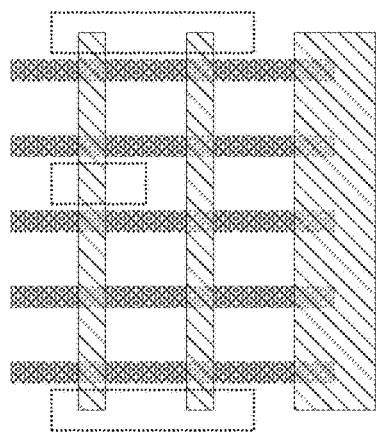
Figure 36D:
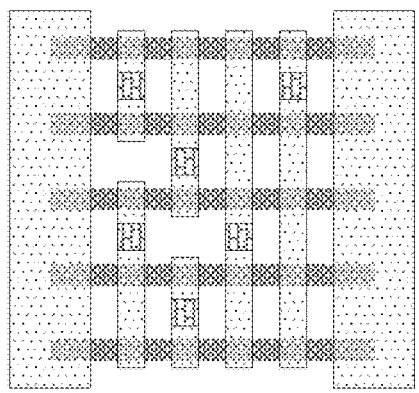
Figure 37A:
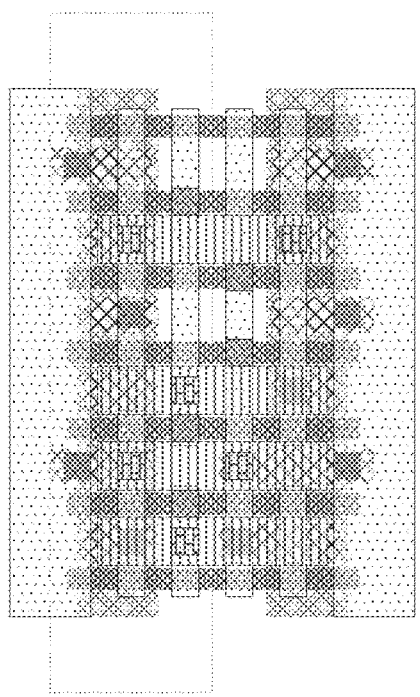
FIGS. 37A-D depict an inr2x2 cell.
Figure 37B:
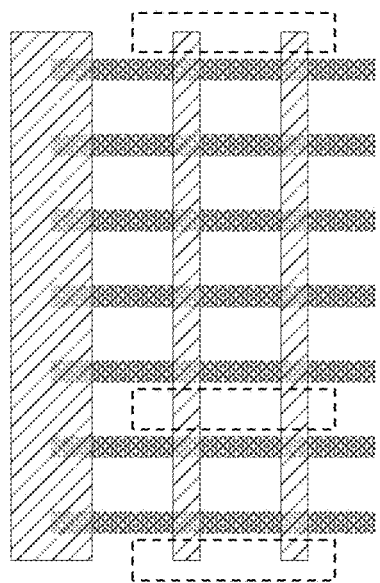
Figure 37C:
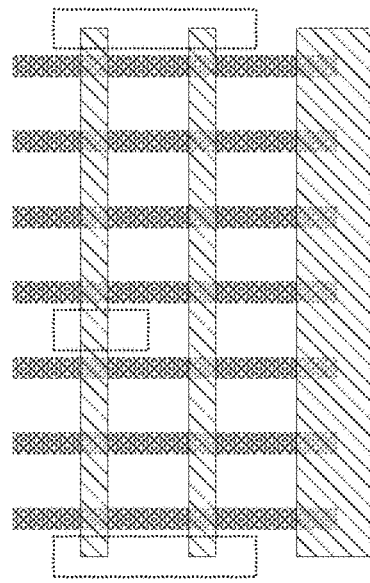
Figure 37D:
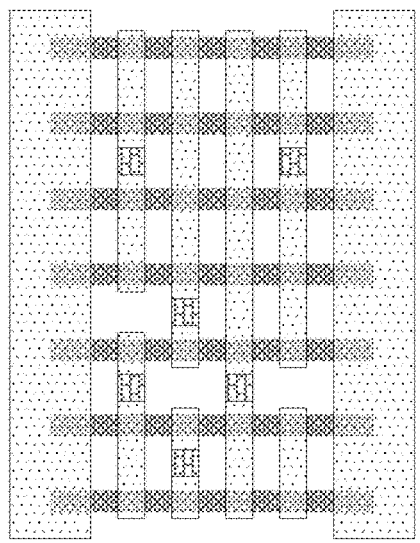
Figure 38A:
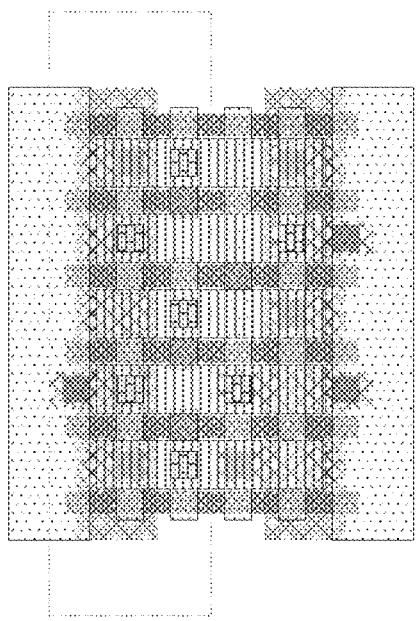
FIGS. 38A-D depict an inr3x1 cell.
Figure 38B:
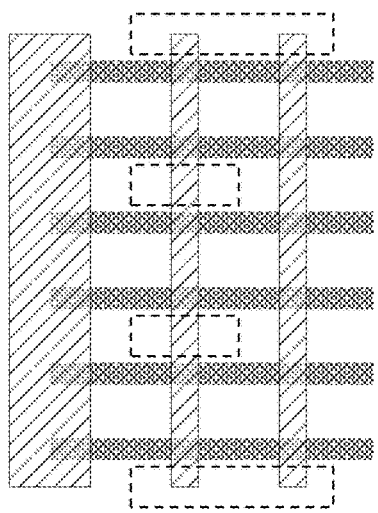
Figure 38C:
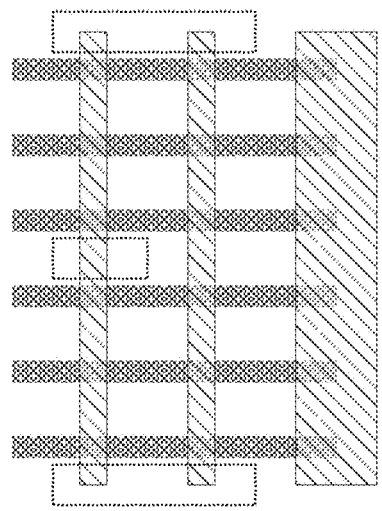
Figure 38D:
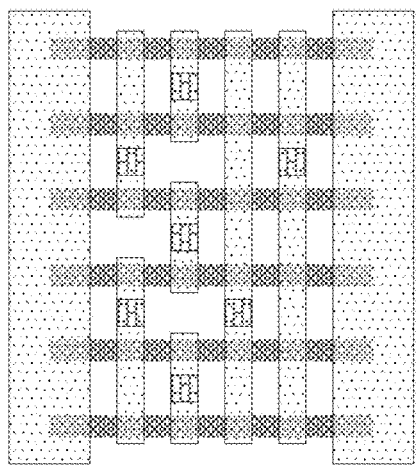
Figure 39A:
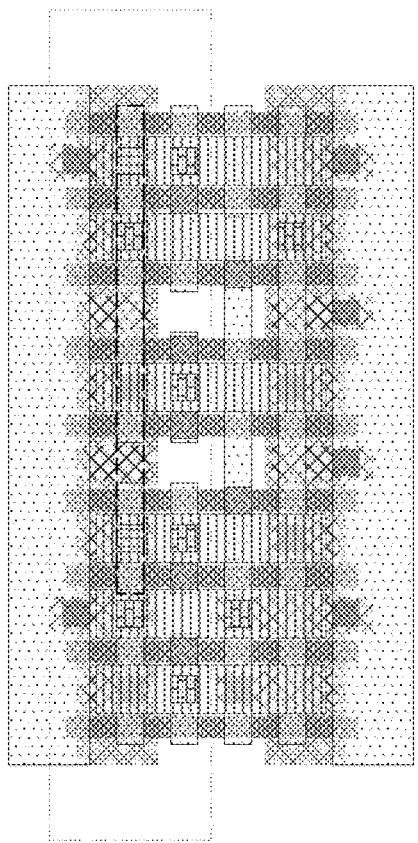
FIGS. 39A-D depict an inr3x2 cell.
Figure 39B:
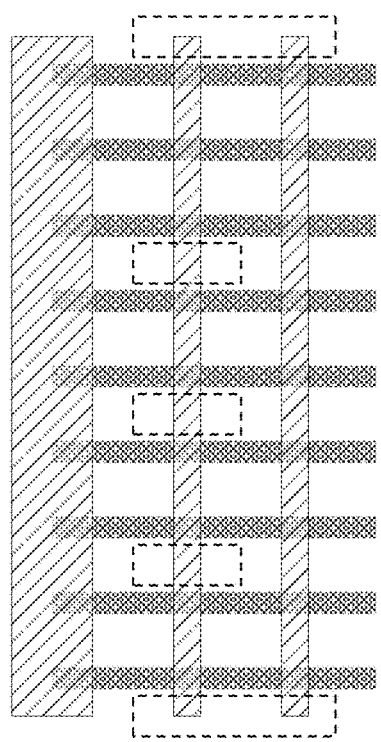
Figure 39C:
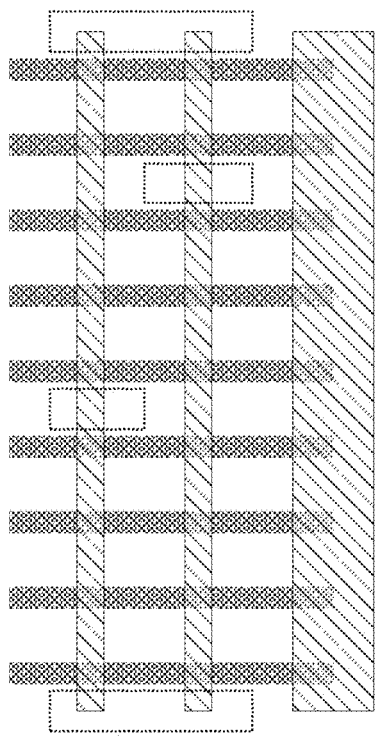
Figure 39D:
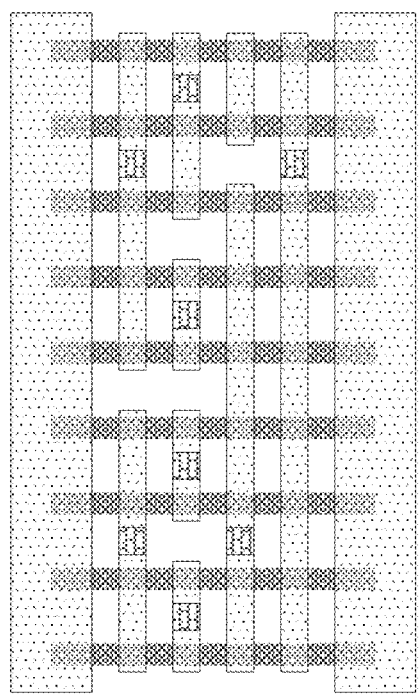
Figure 40A:
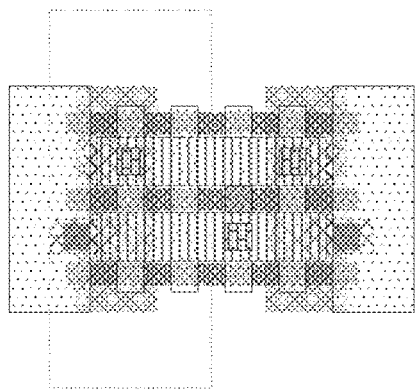
FIGS. 40A-D depict an invx1 cell.
Figure 40B:
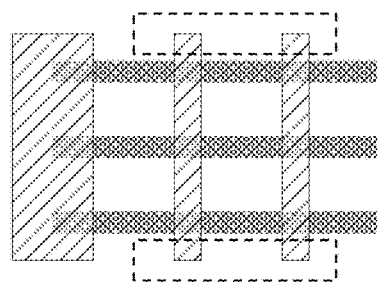
Figure 40C:
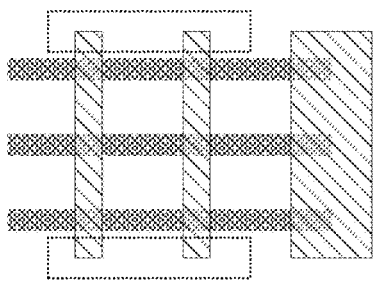
Figure 40D:
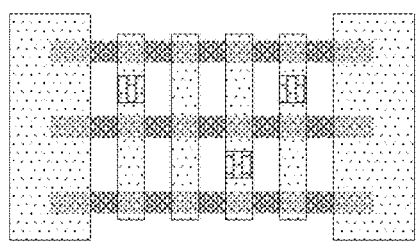
Figure 41A:
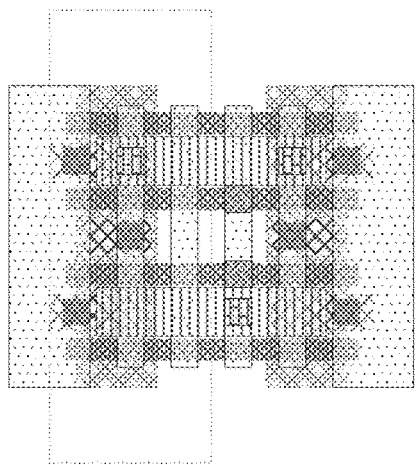
FIGS. 41A-D depict an invx2 cell.
Figure 41B:
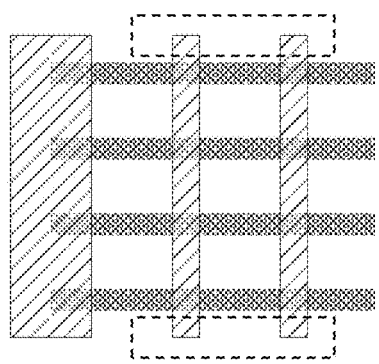
Figure 41C:
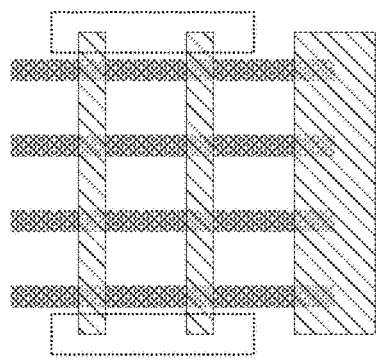
Figure 41D:
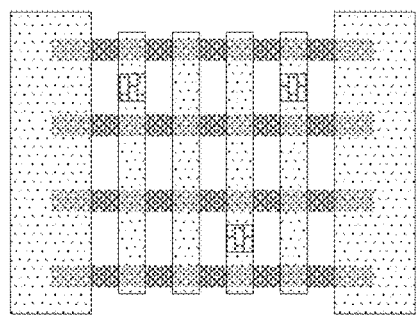
Figure 42A:
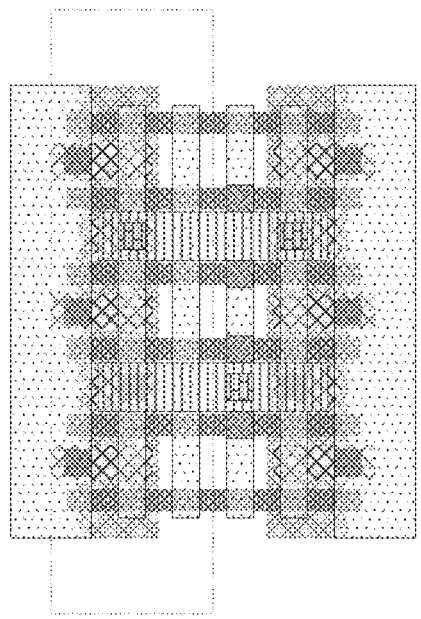
FIGS. 42A-D depict an invx4 cell.
Figure 42B:
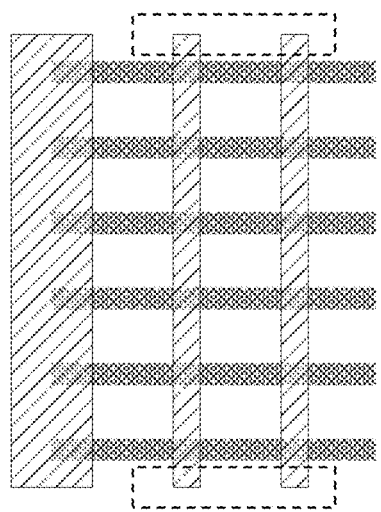
Figure 42C:
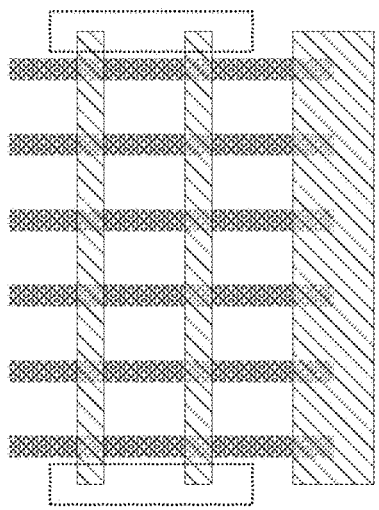
Figure 42D:
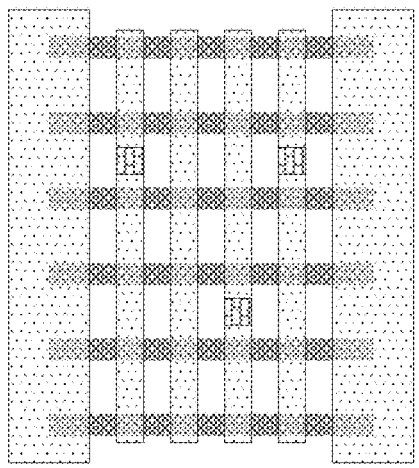
Figure 43A:
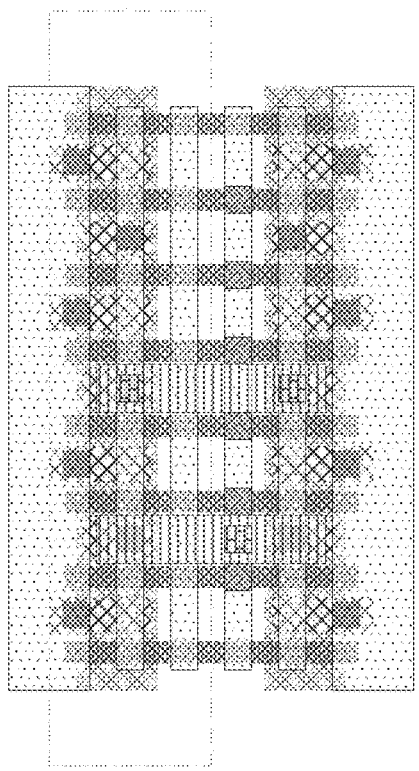
FIGS. 43A-D depict an invx6 cell.
Figure 43B:
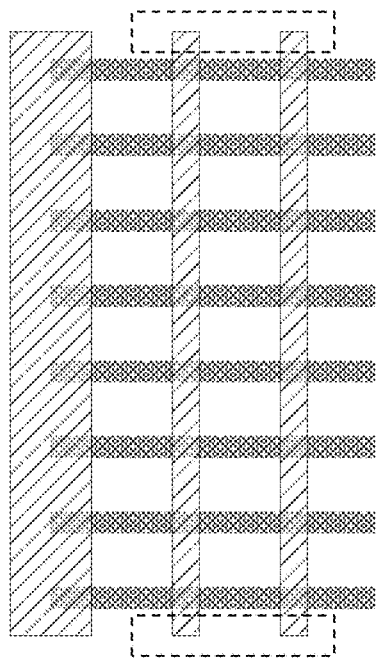
Figure 43C:
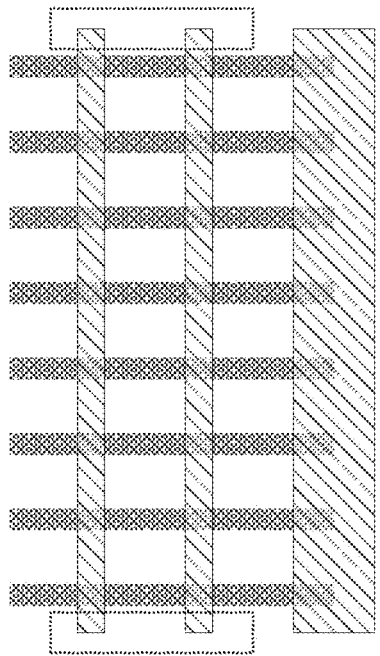
Figure 43D:
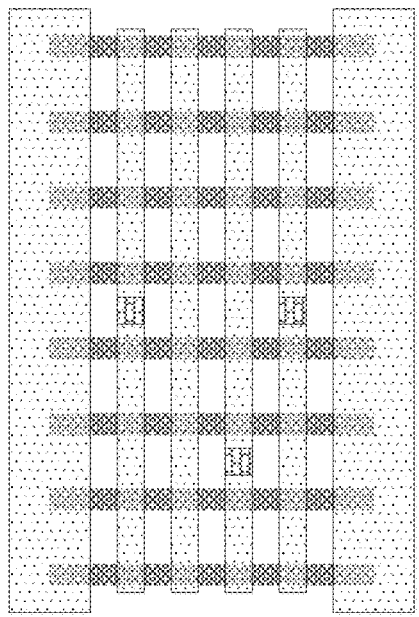
Figure 44A:
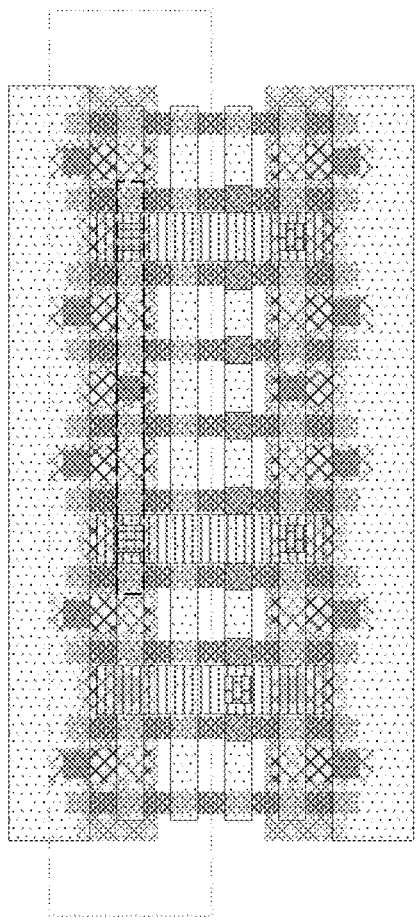
FIGS. 44A-D depict an invx8 cell.
Figure 44B:
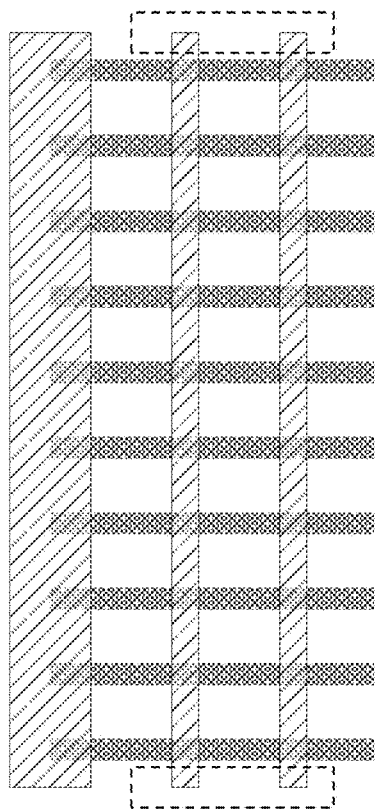
Figure 44C:
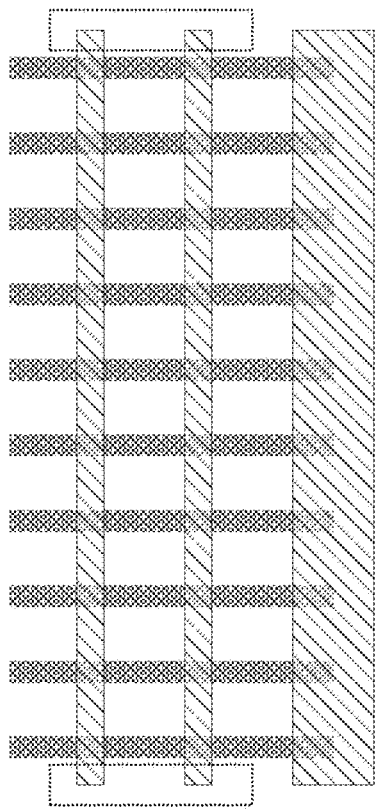
Figure 44D:
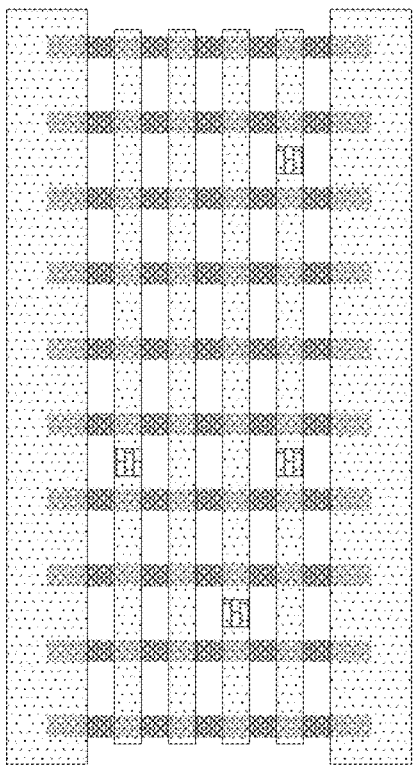
Figure 45A:
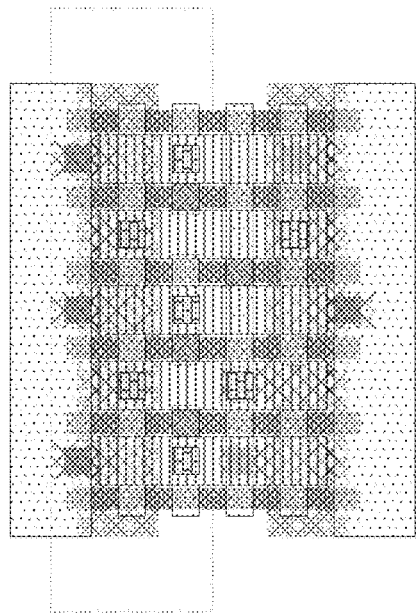
FIGS. 45A-D depict an ioai21x1 cell.
Figure 45B:
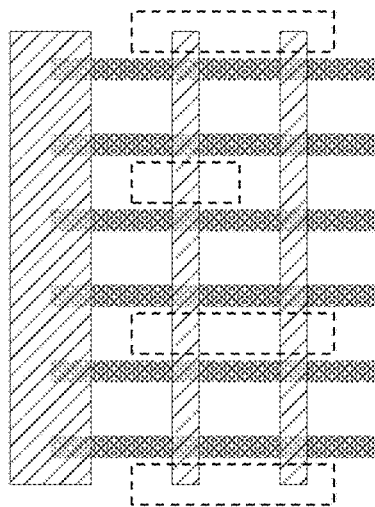
Figure 45C:
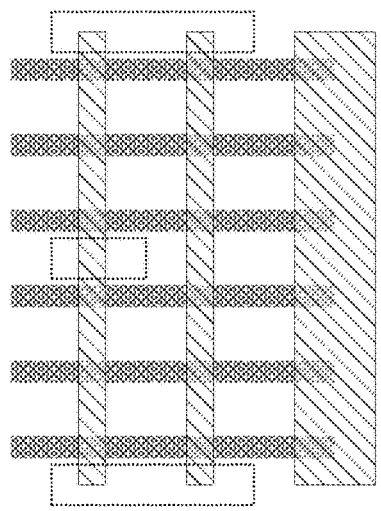
Figure 45D:
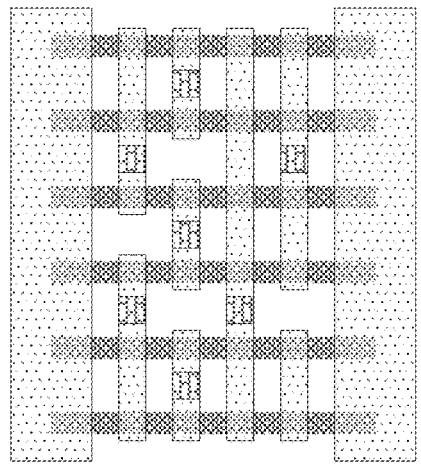
Figure 46A:
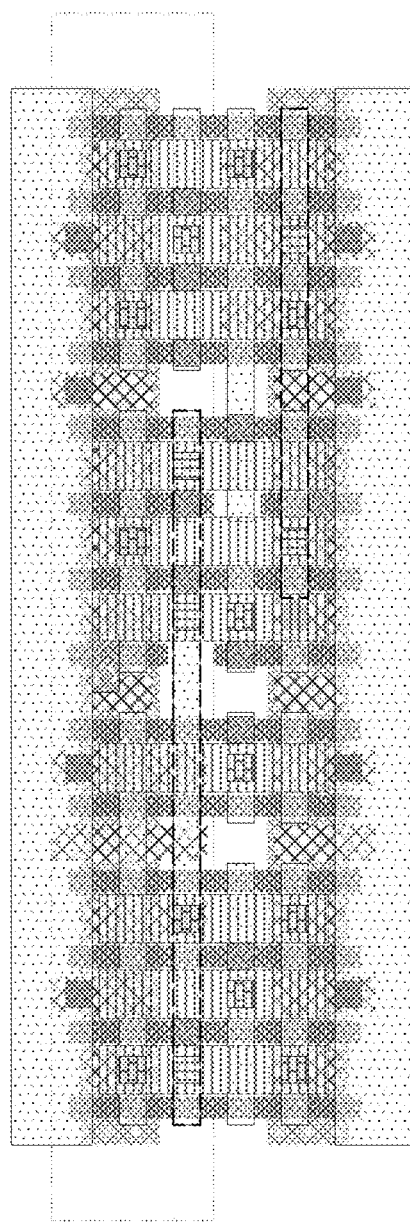
FIGS. 46A-D depict an latqx1 cell.
Figure 46B:
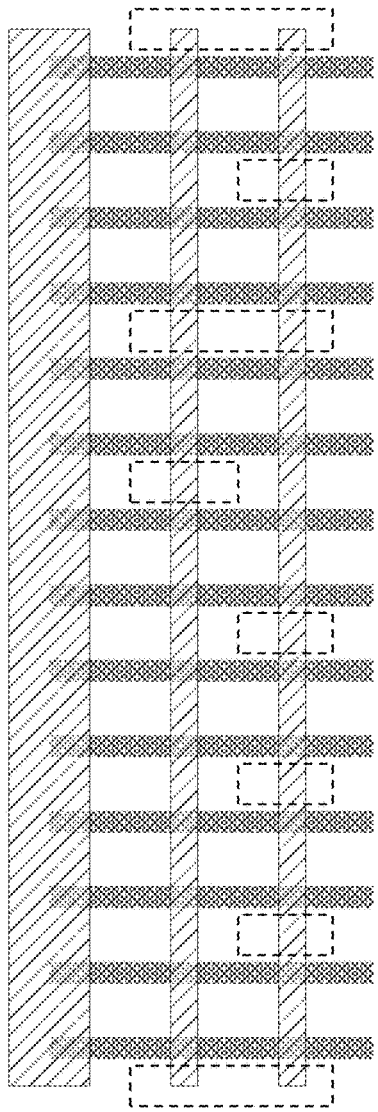
Figure 46C:
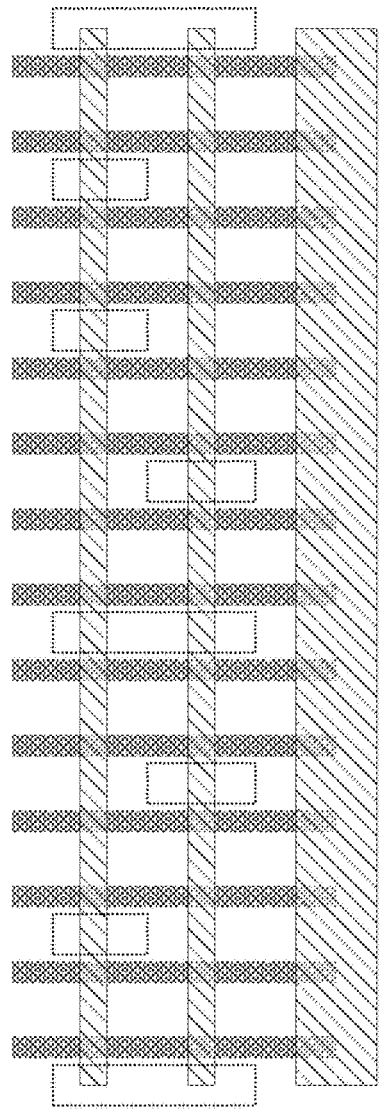
Figure 46D:
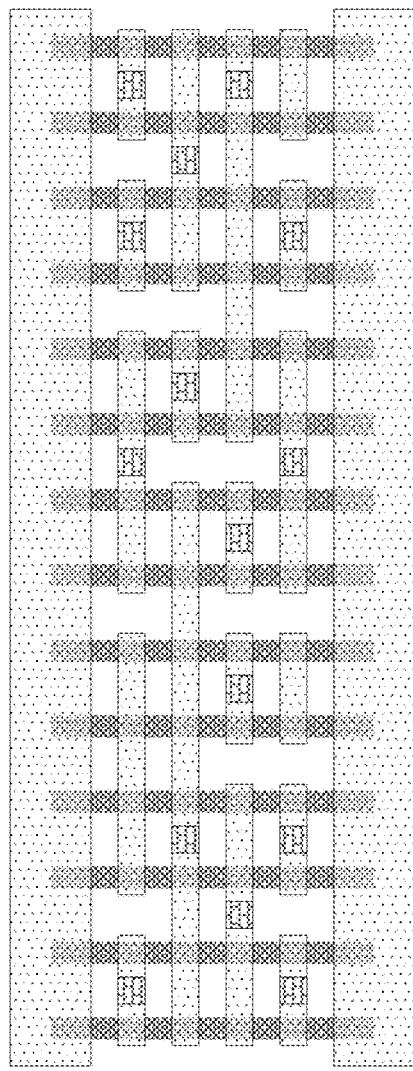
Figure 47A:
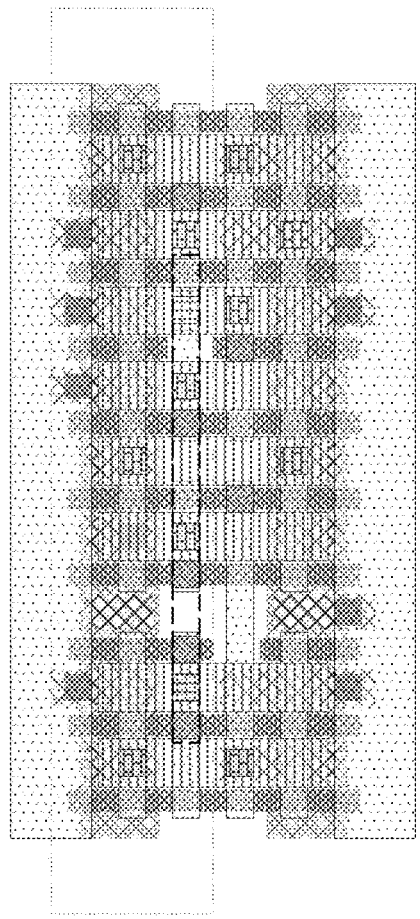
FIGS. 47A-D depict an mux2x1 cell.
Figure 47B:
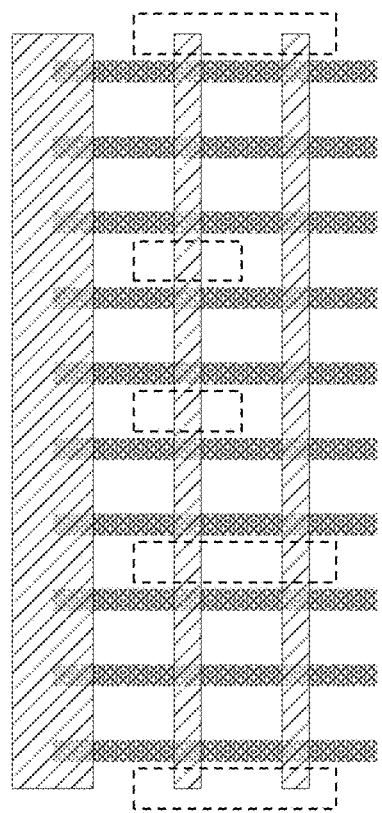
Figure 47C:
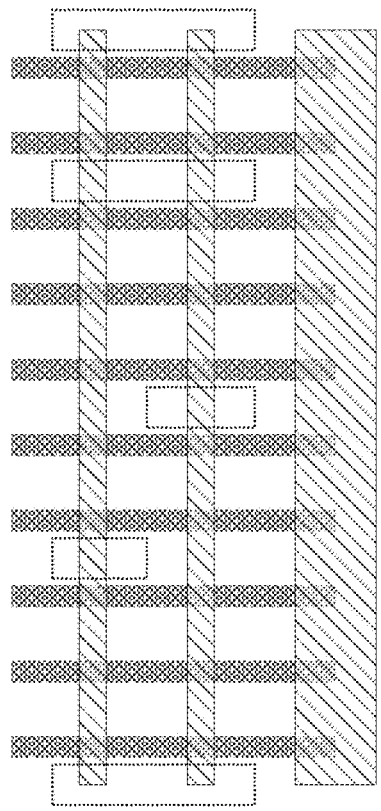
Figure 47D:
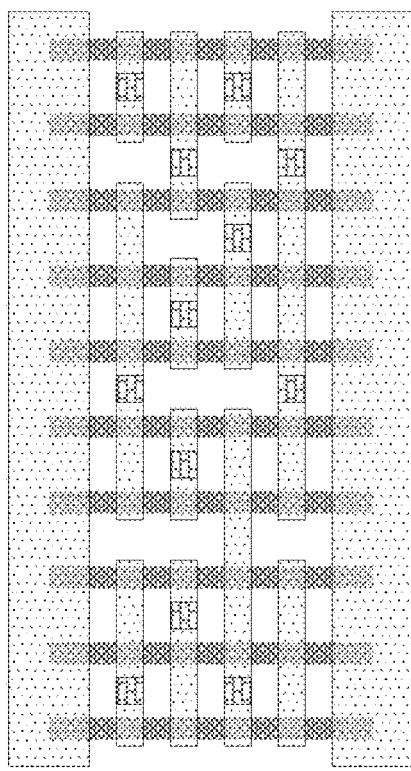
Figure 48A:
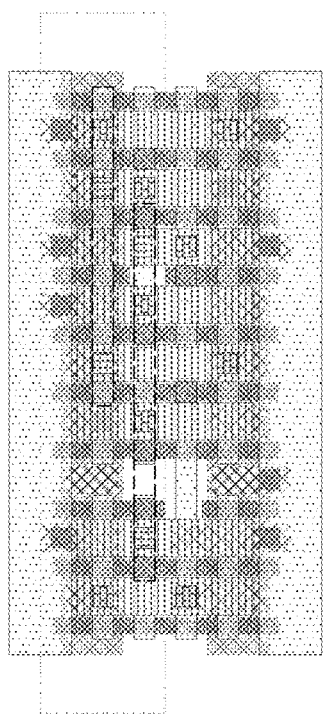
Figure 48B:
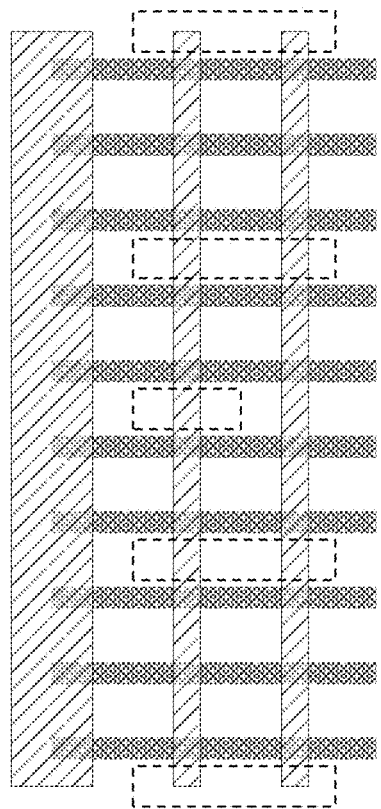
Figure 48D:
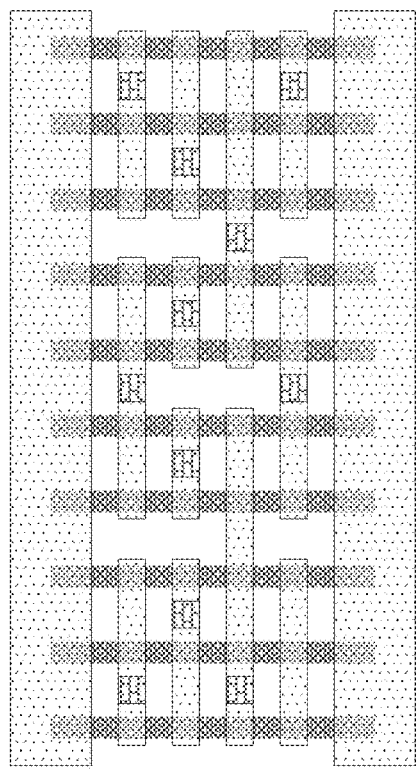
Figure 49A:
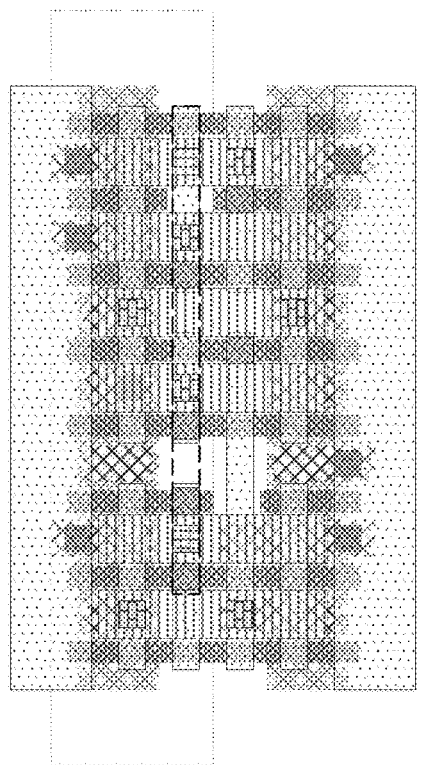
FIGS. 49A-D depict an muxi2x1 cell.
Figure 49B:
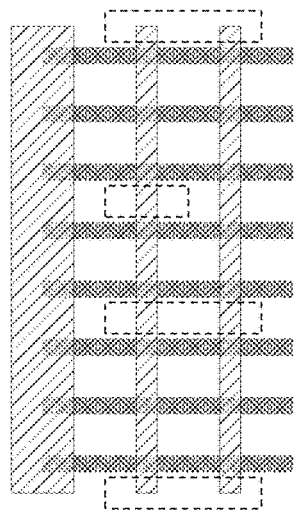
Figure 49C:
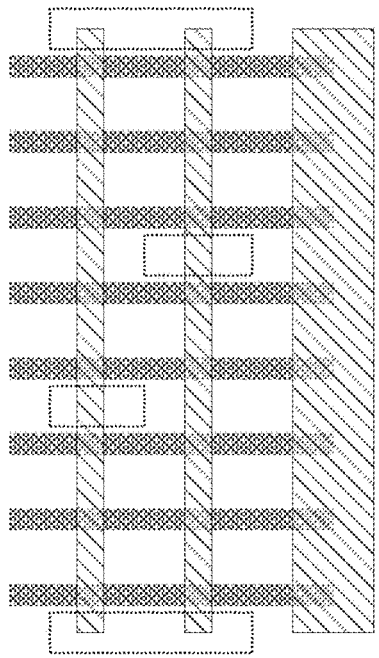
Figure 49D:
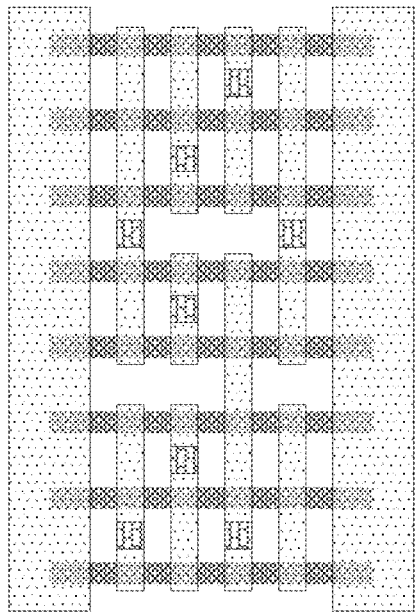
Figure 50A:
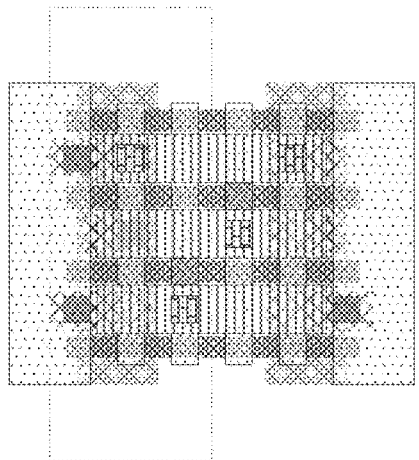
FIGS. 50A-D depict an nd2x1 cell.
Figure 50B:
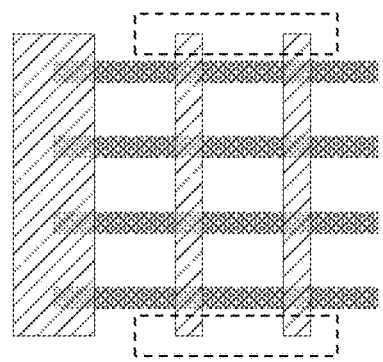
Figure 50C:
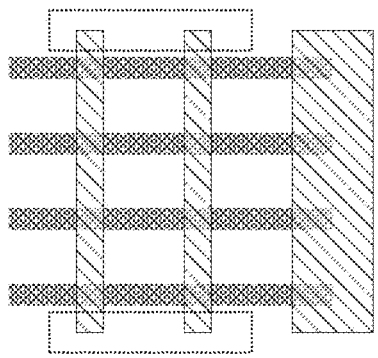
Figure 50D:
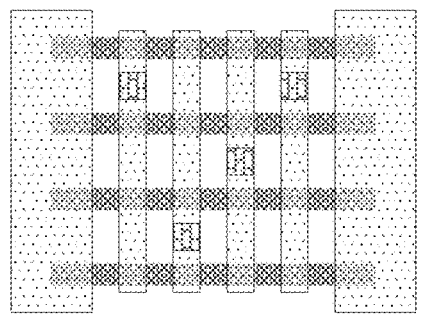
Figure 51A:
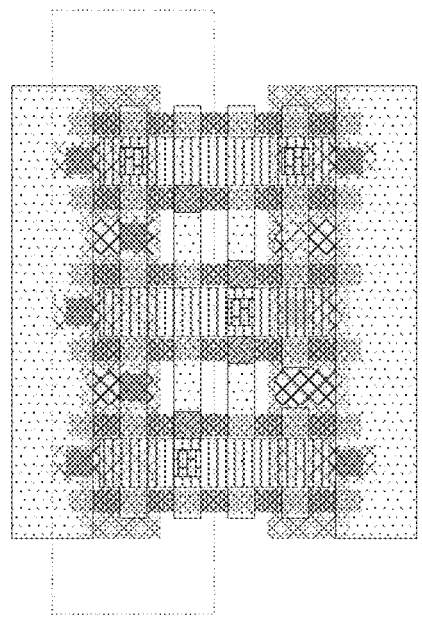
FIGS. 51A-D depict an nd2x2 cell.
Figure 51B:
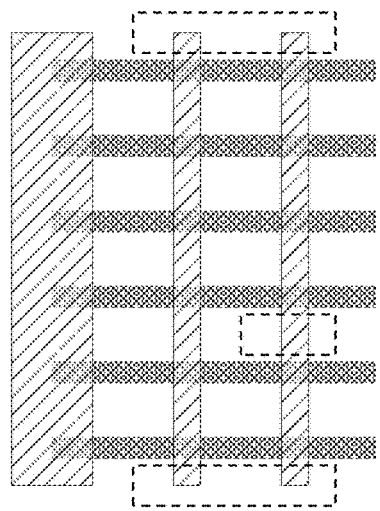
Figure 51C:
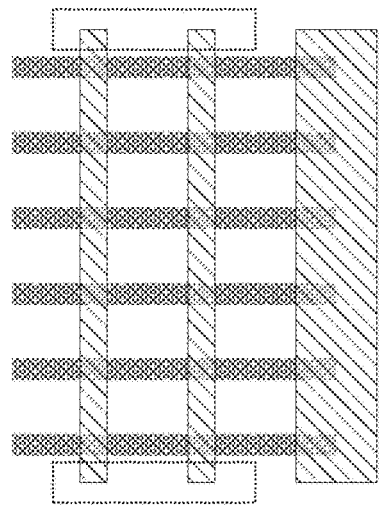
Figure 51D:
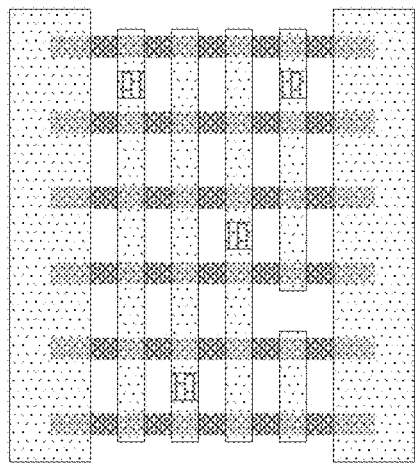
Figure 52A:
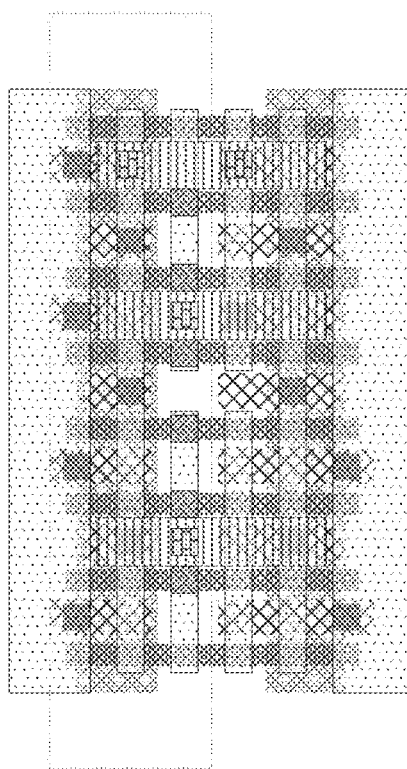
FIGS. 52A-D depict an nd2x3 cell.
Figure 52B:
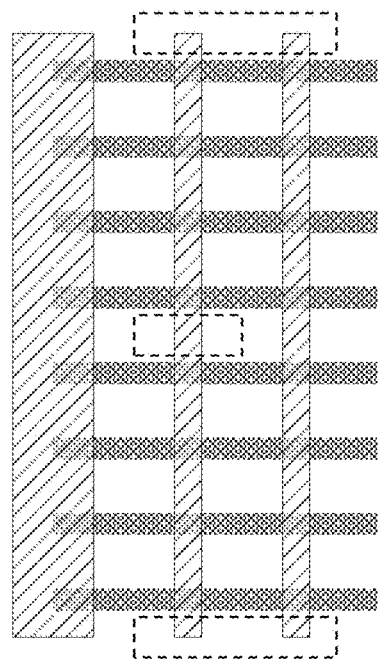
Figure 52C:
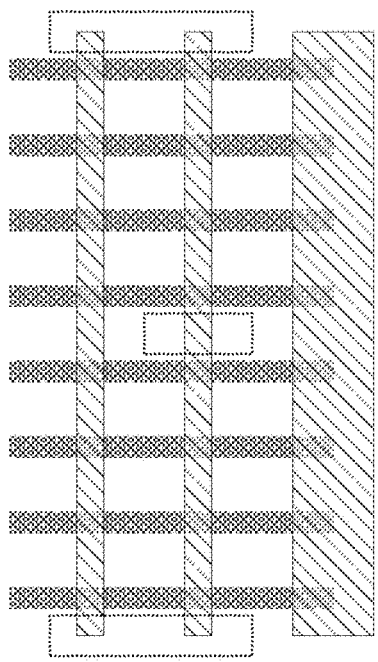
Figure 52D:
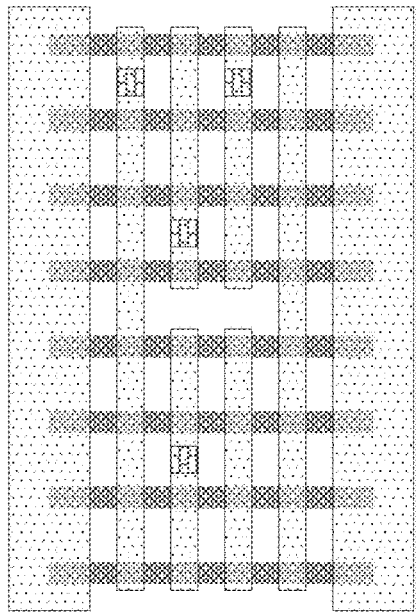
Figure 53A:
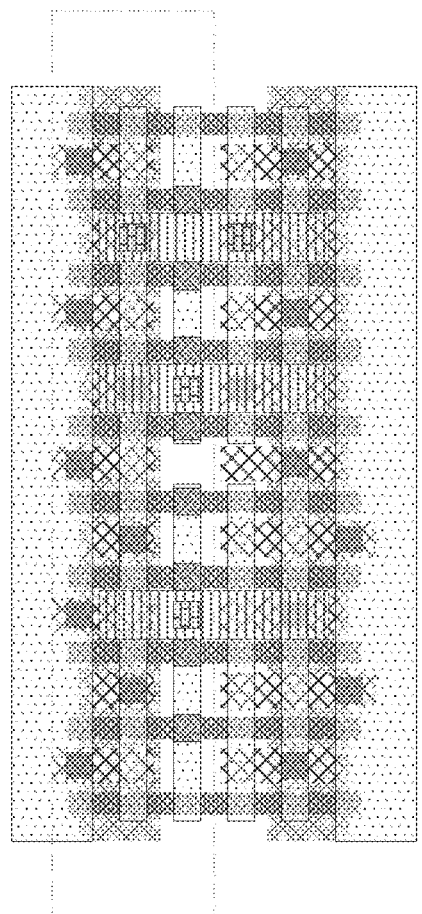
FIGS. 53A-D depict an nd2x4 cell.
Figure 53B:
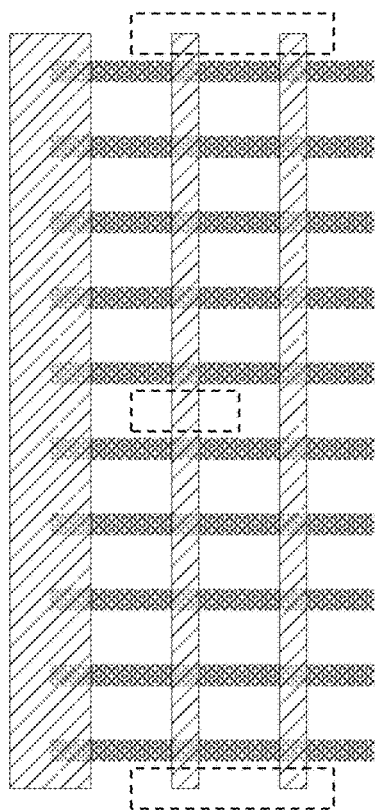
Figure 53C:
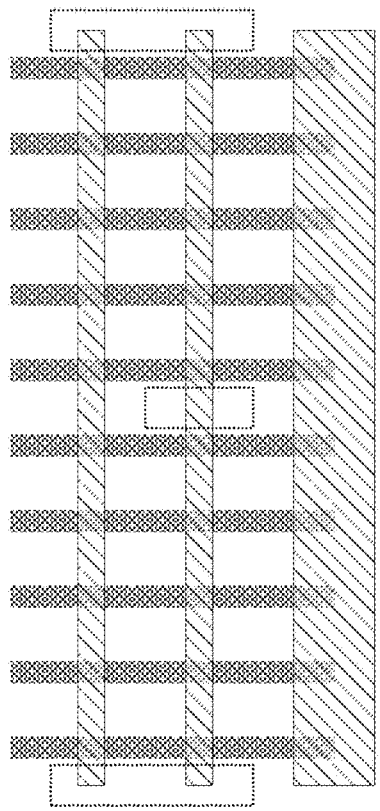
Figure 53D:
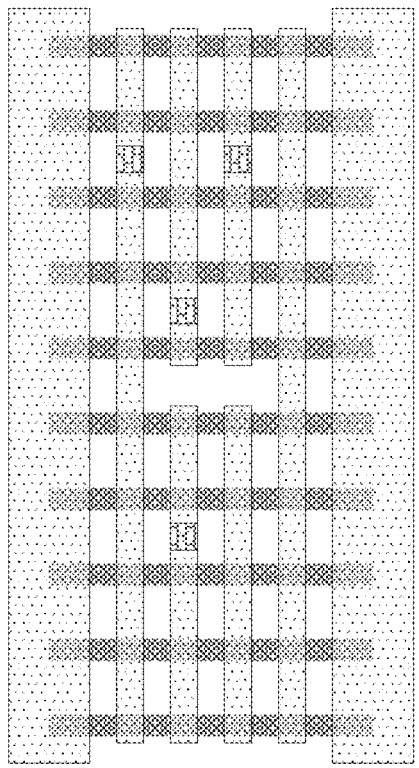
Figure 54A:
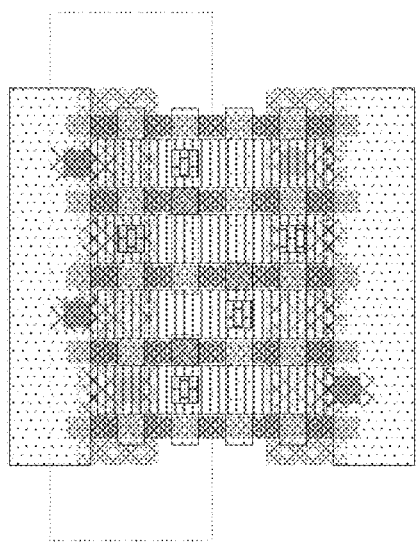
FIGS. 54A-D depict an nd3x1 cell.
Figure 54B:
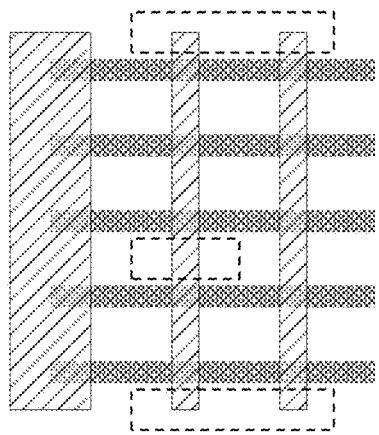
Figure 54C:
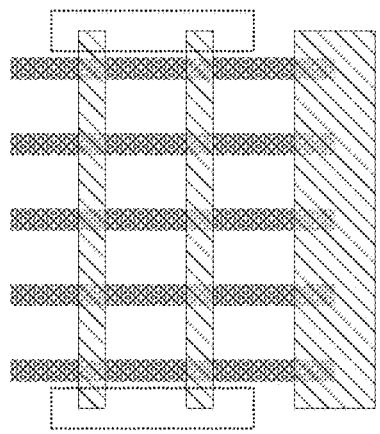
Figure 54D:
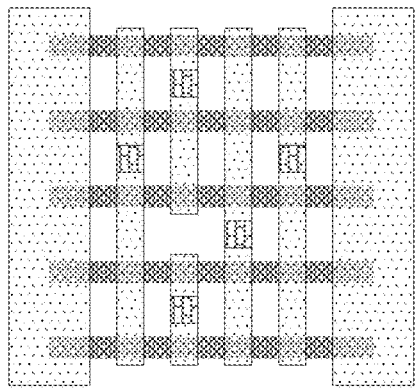
Figure 55B:
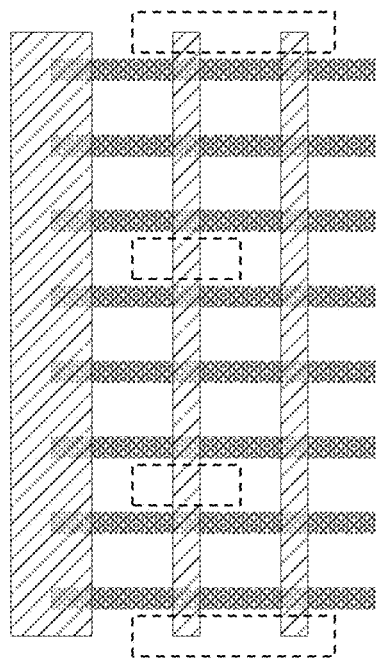
Figure 55C:
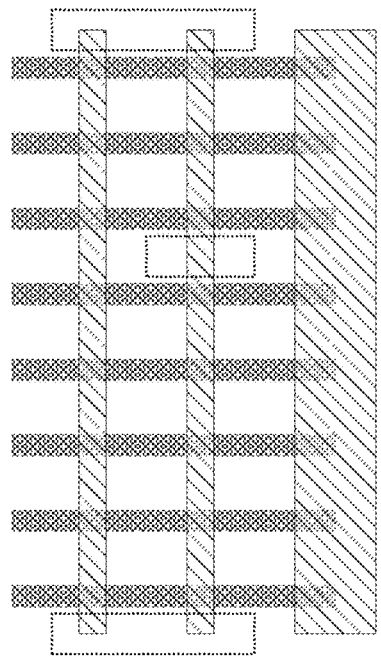
Figure 55D:
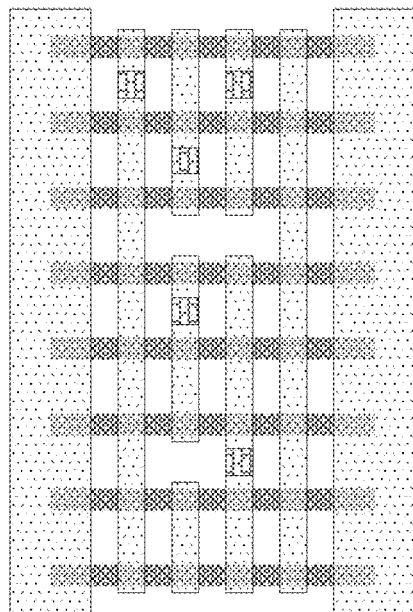
Figure 56A:
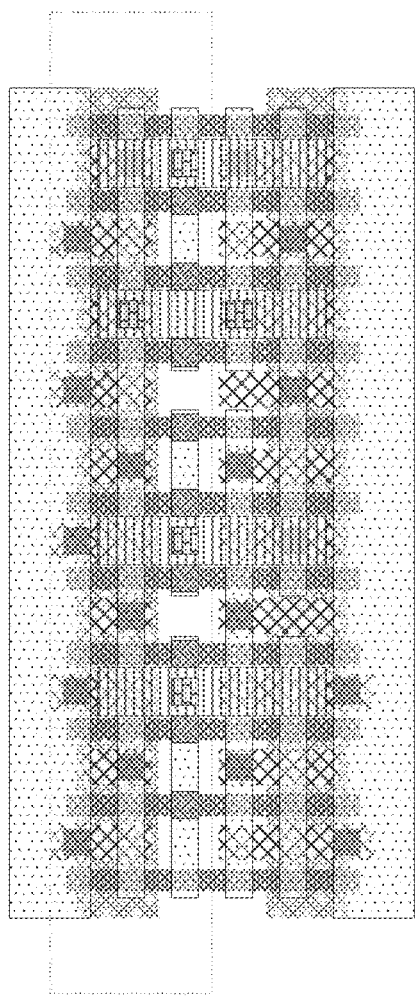
FIGS. 56A-D depict an nd3x3 cell.
Figure 56B:
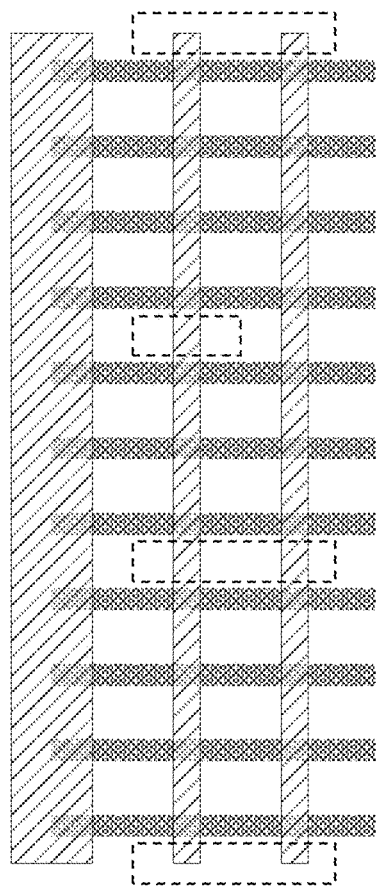
Figure 56C:
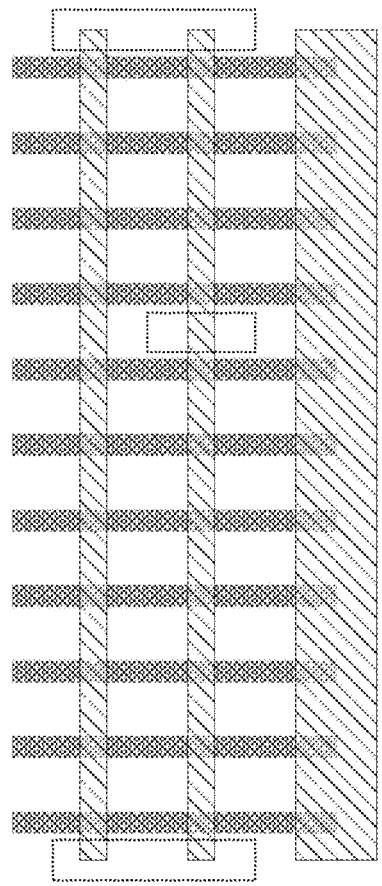
Figure 56D:
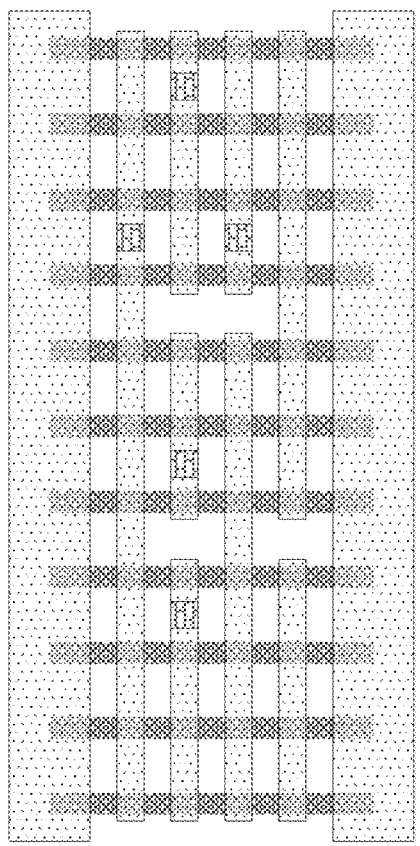
Figure 57A:
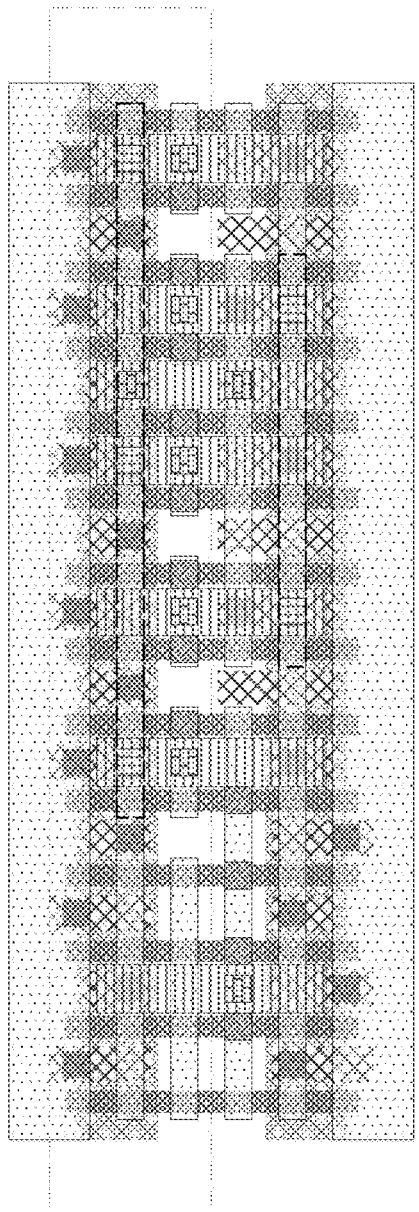
FIGS. 57A-D depict an nd3x4 cell.
Figure 57B:
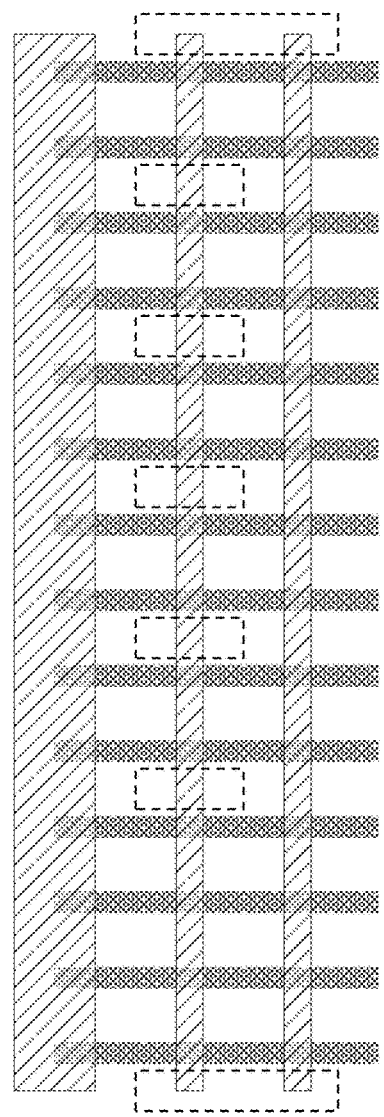
Figure 57C:
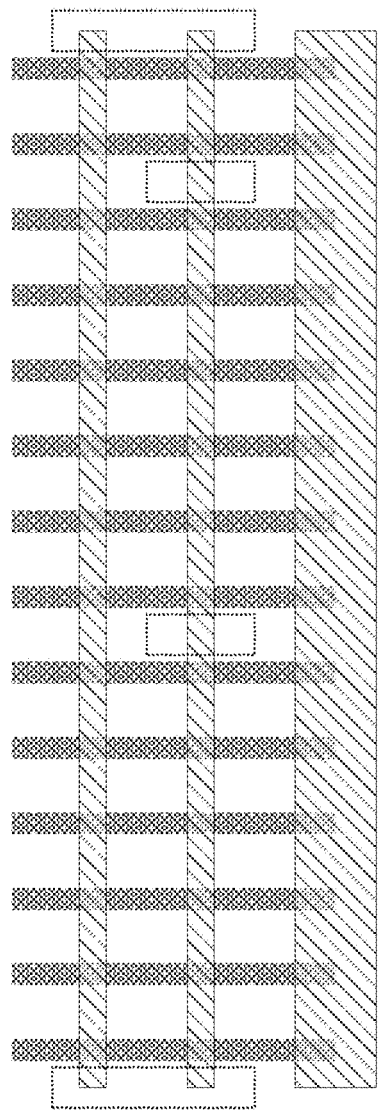
Figure 57D:
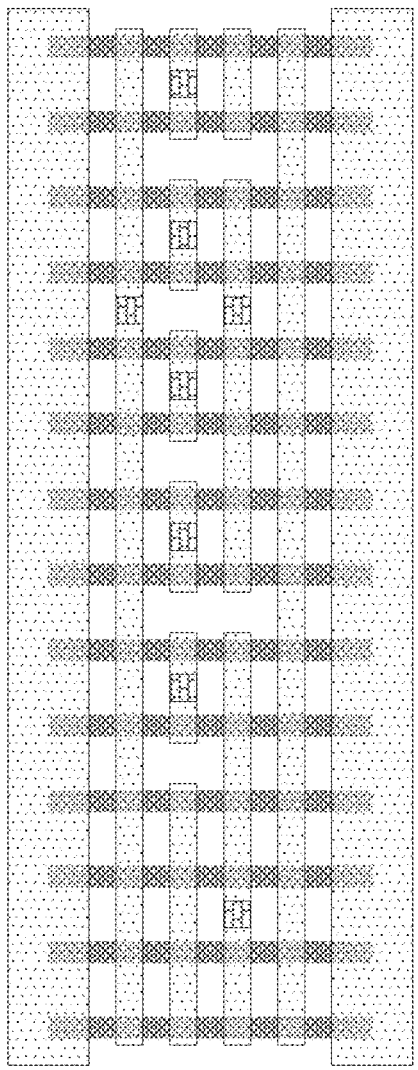
Figure 58A:
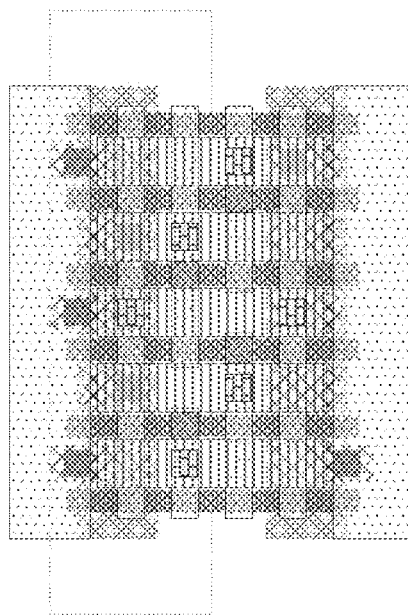
FIGS. 58A-D depict an nd4x1 cell.
Figure 58B:
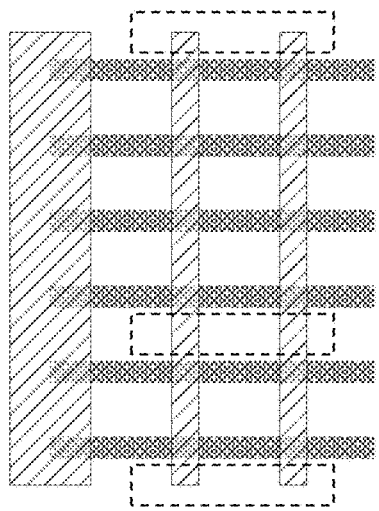
Figure 58C:
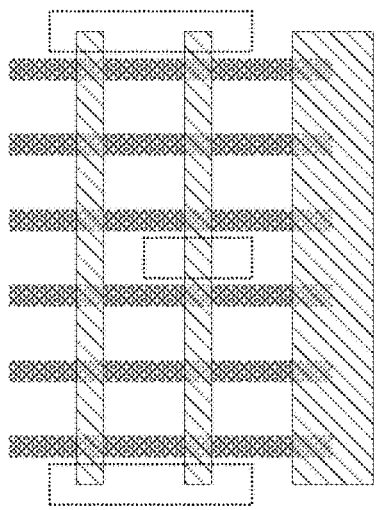
Figure 58D:
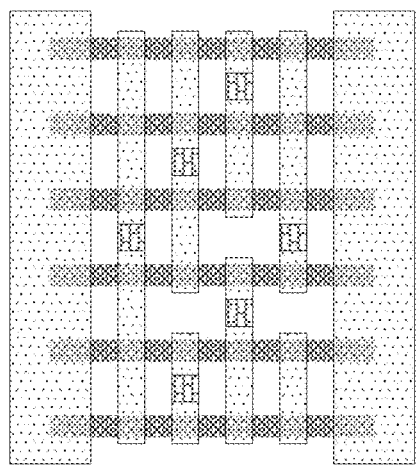
Figure 59A:
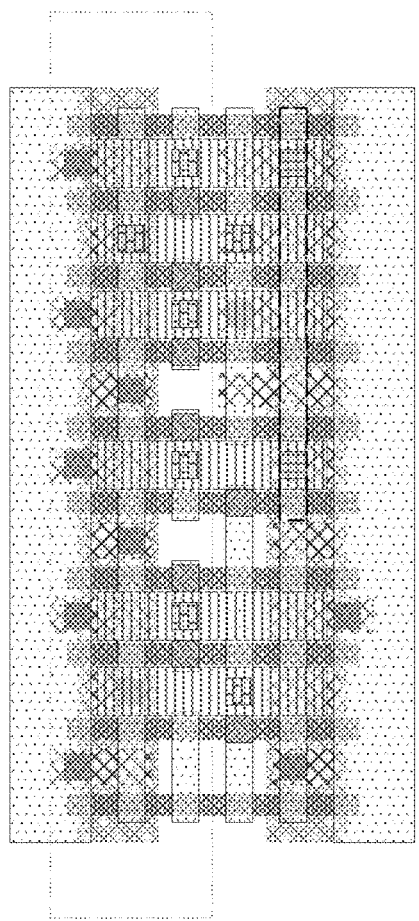
FIGS. 59A-D depict an nd4x2 cell.
Figure 59B:
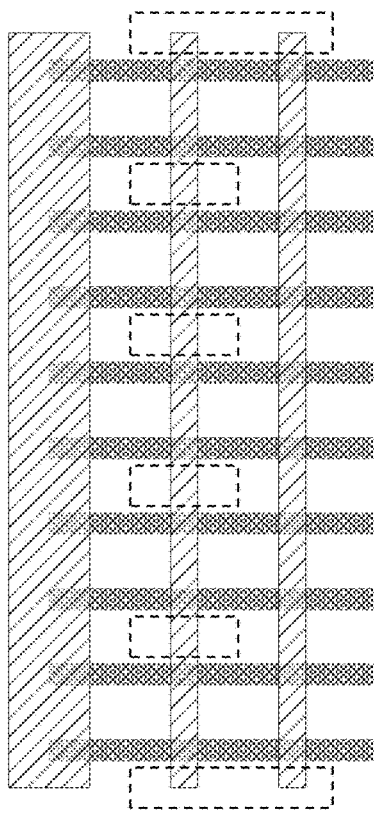
Figure 59C:
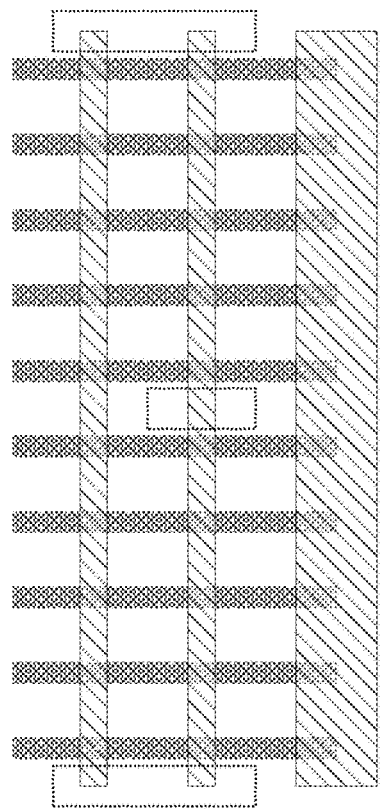
Figure 59D:
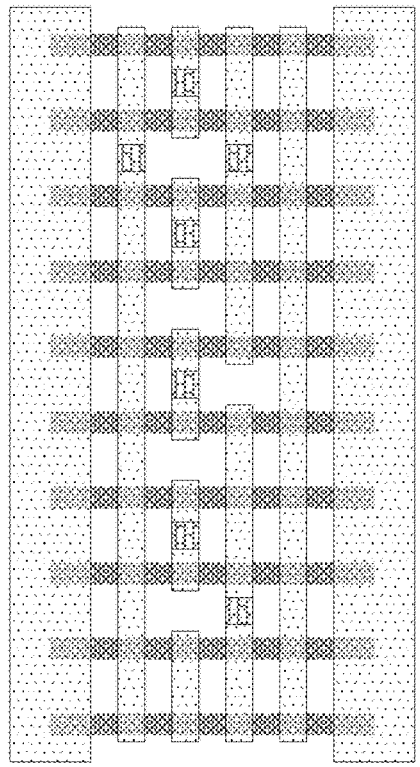
Figure 60A:
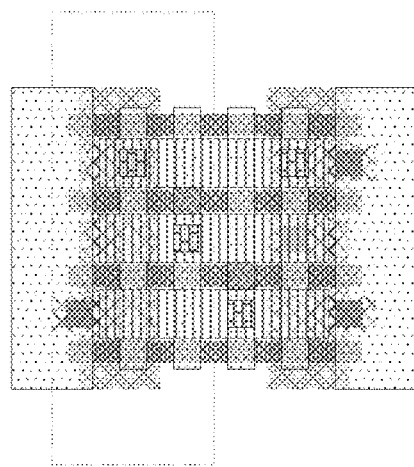
FIGS. 60A-D depict an nr2x1 cell.
Figure 60B:
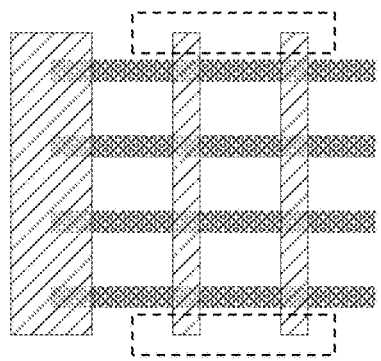
Figure 60C:
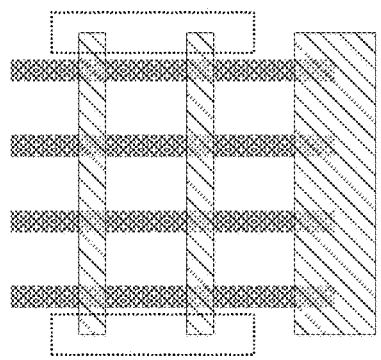
Figure 60D:
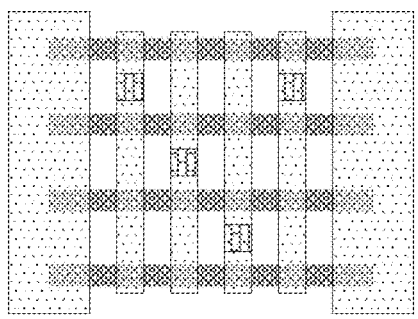
Figure 61A:
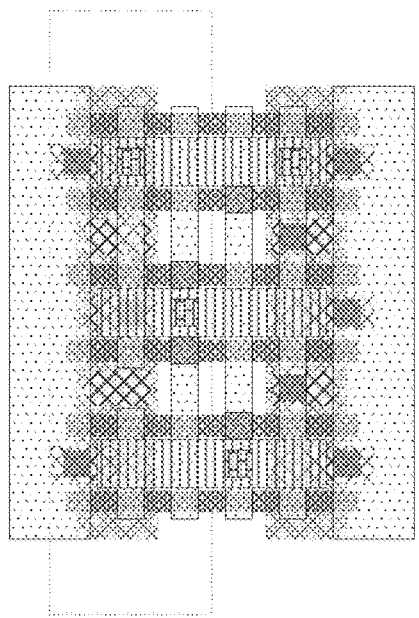
FIGS. 61A-D depict an nr2x2 cell.
Figure 61B:
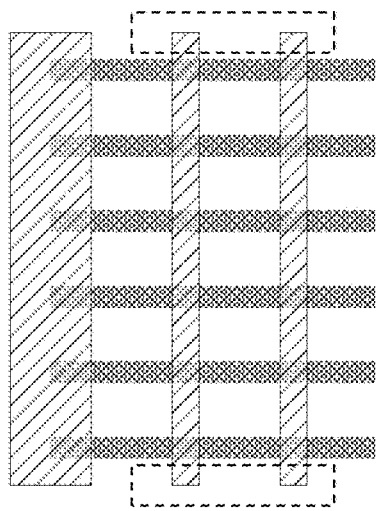
Figure 61C:
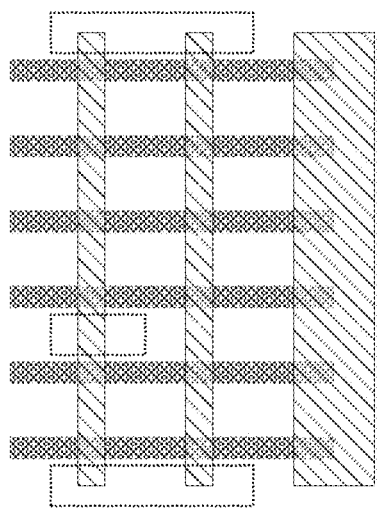
Figure 61D:
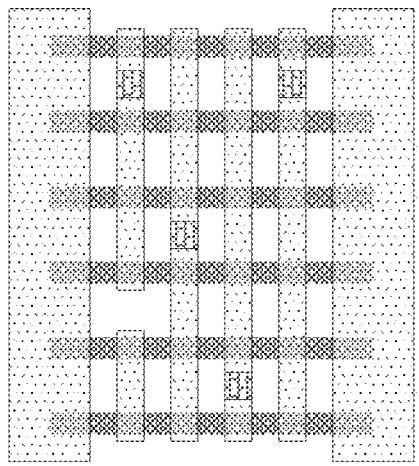
Figure 62A:
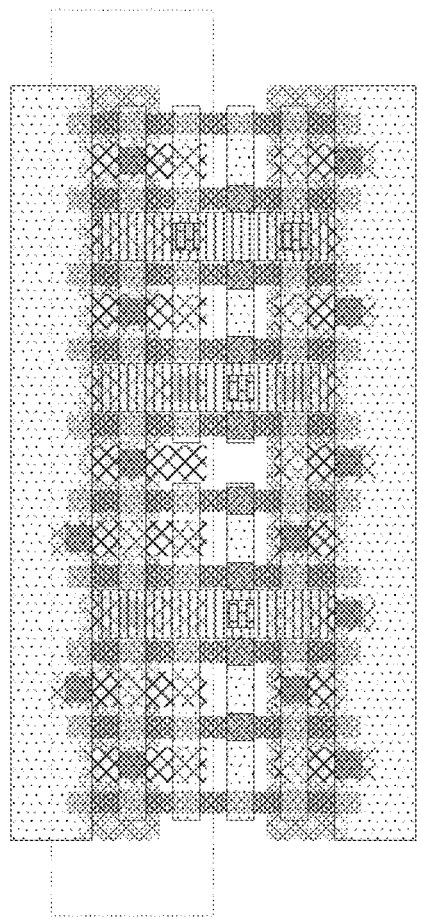
FIGS. 62A-D depict an nr2x4 cell.
Figure 62B:
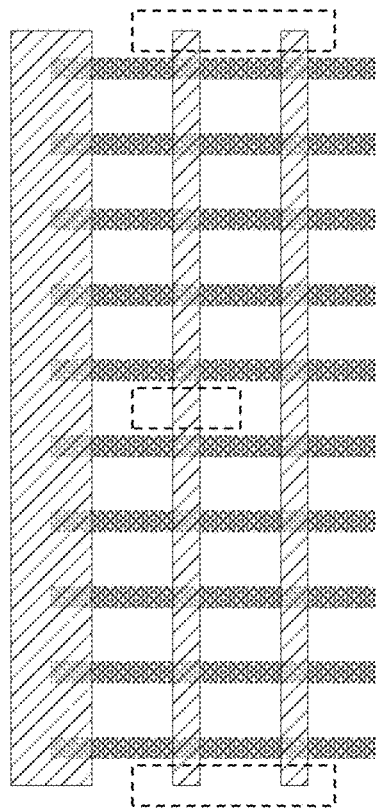
Figure 62C:
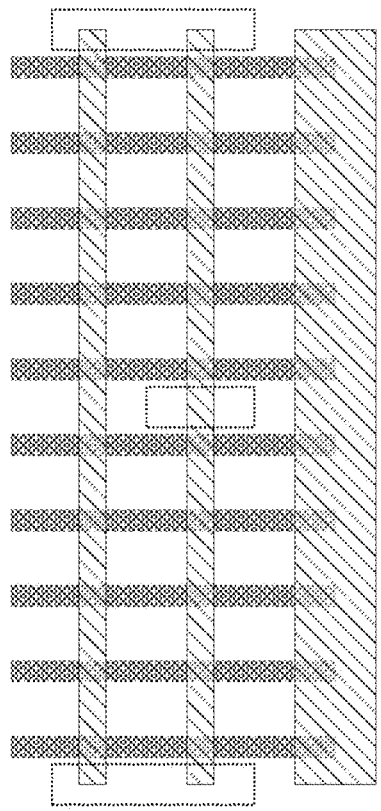
Figure 62D:
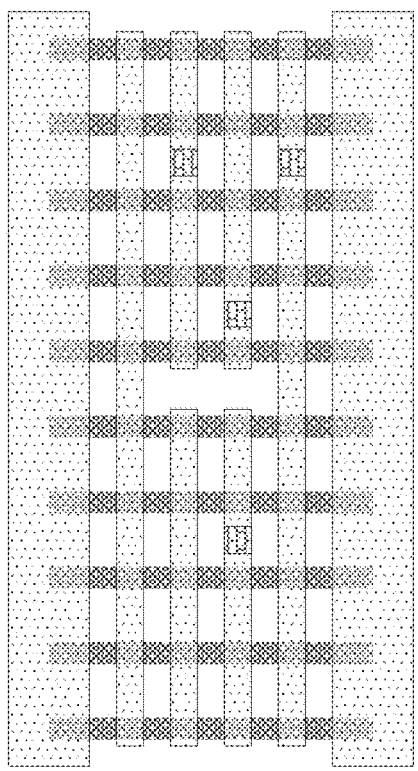
Figure 63A:
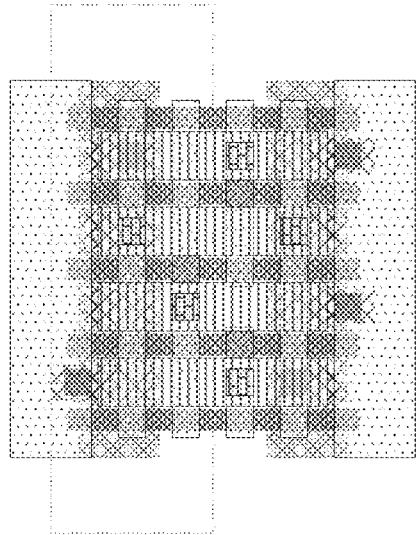
FIGS. 63A-D depict an nr3x1 cell.
Figure 63B:
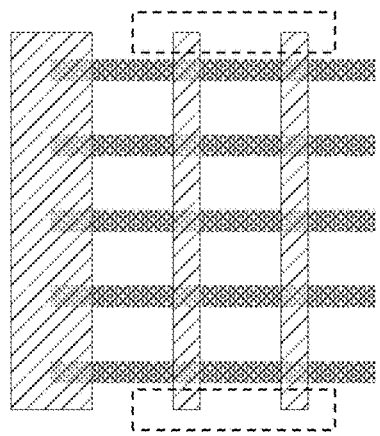
Figure 63C:
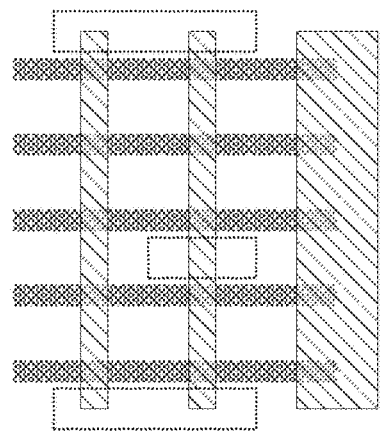
Figure 63D:
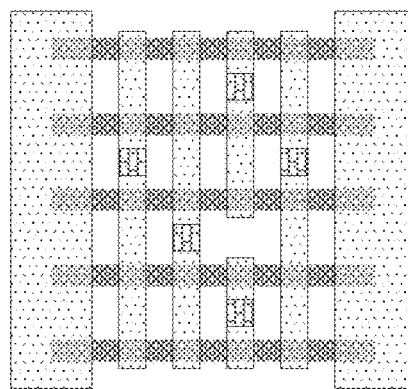
Figure 64A:
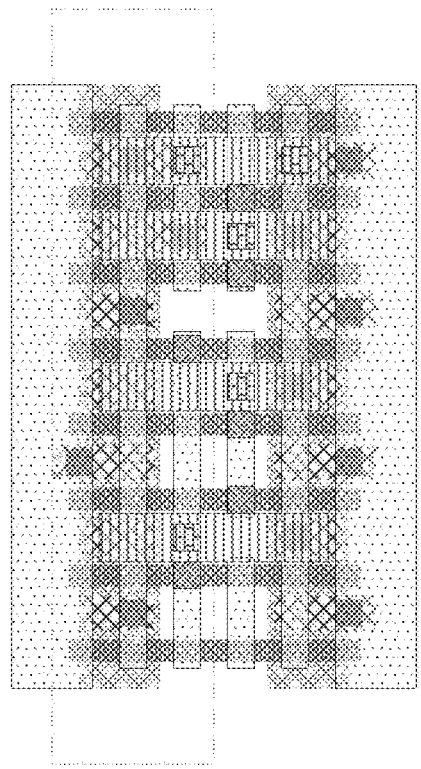
FIGS. 64A-D depict an nr3x2 cell.
Figure 64B:
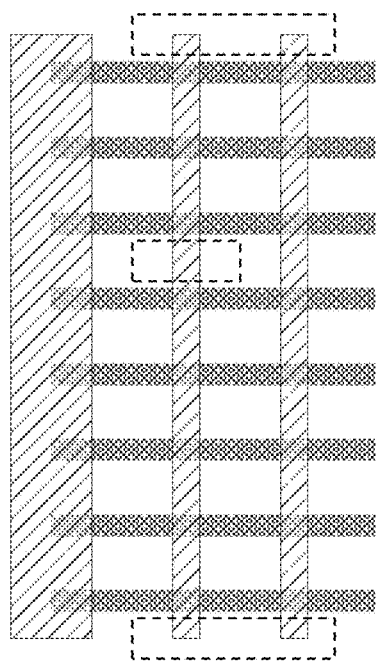
Figure 64C:
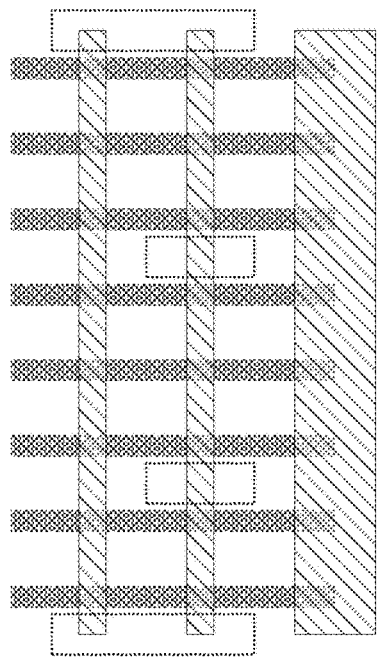
Figure 64D:
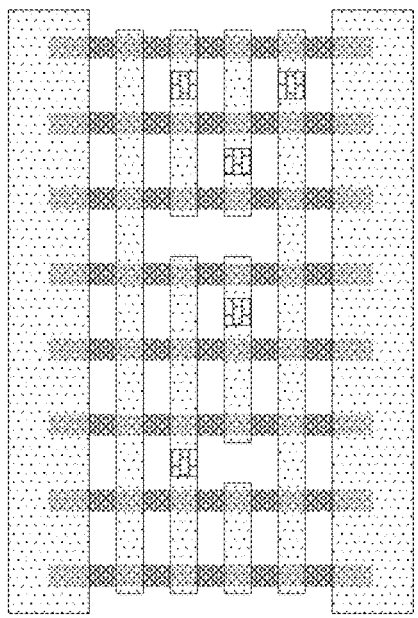
Figure 65A:
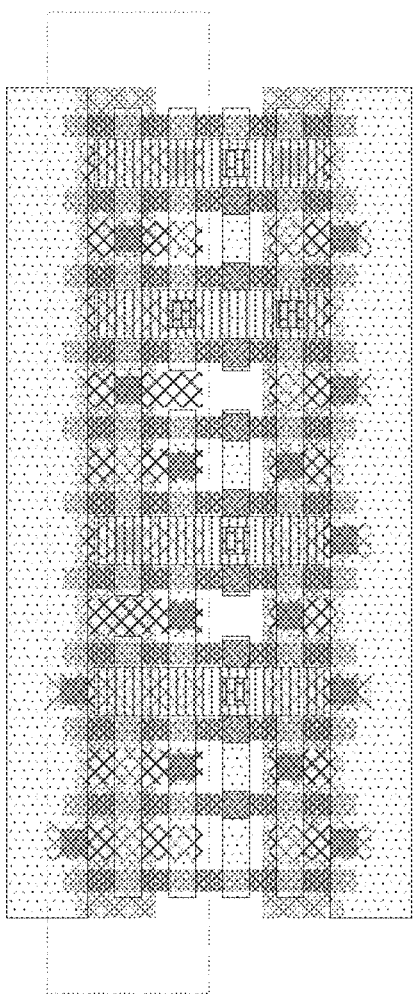
FIGS. 65A-D depict an nr3x3 cell.
Figure 65B:
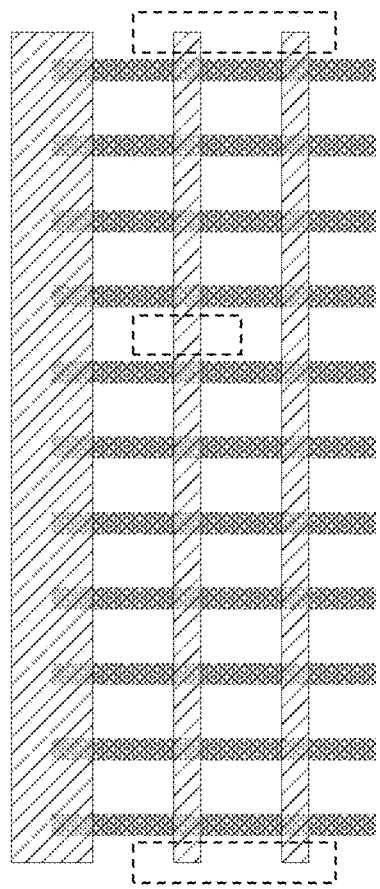
Figure 65C:
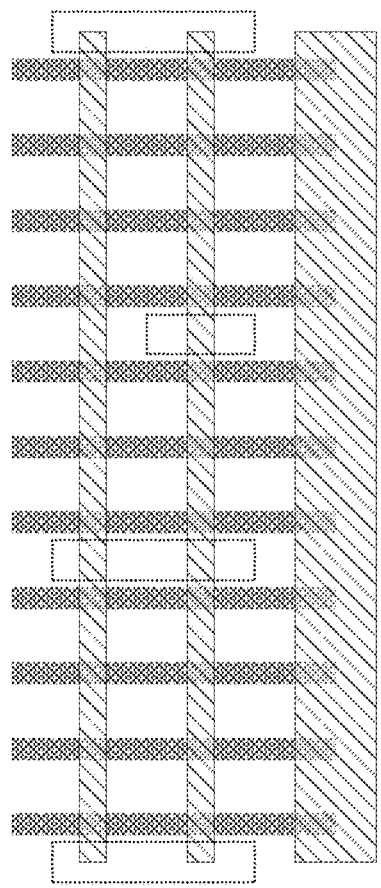
Figure 65D:
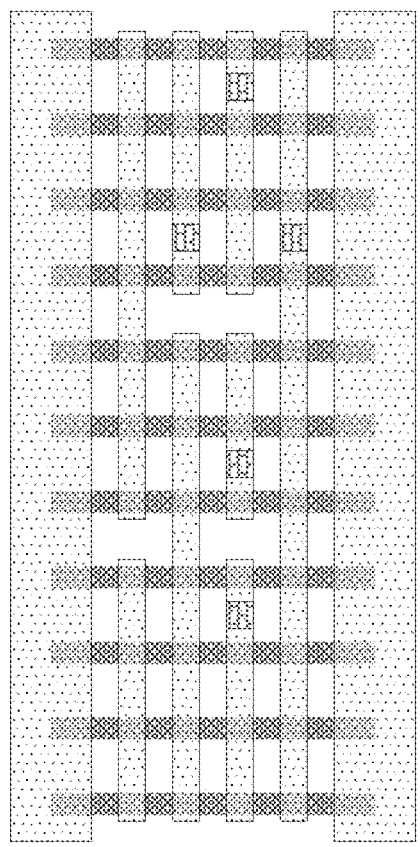
Figure 66A:
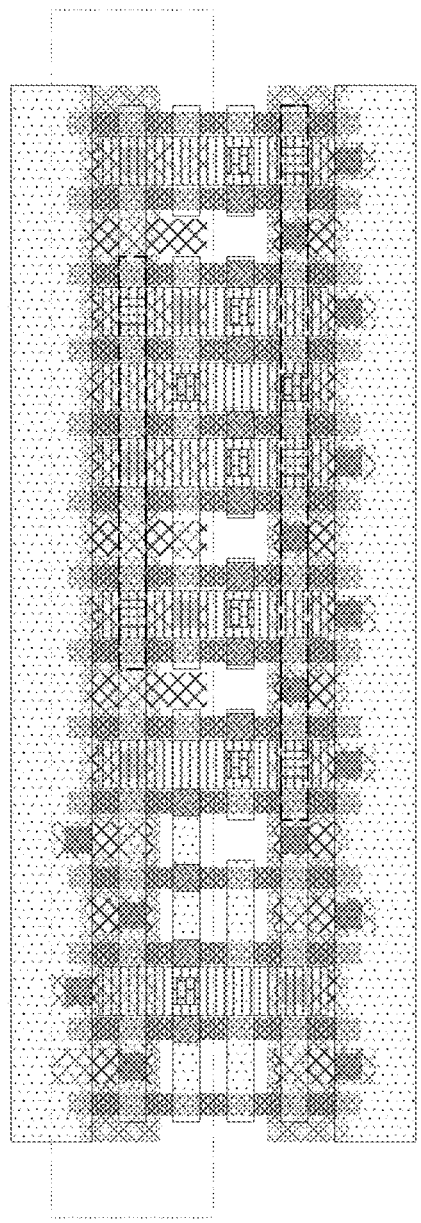
FIGS. 66A-D depict an nr3x4 cell.
Figure 66B:
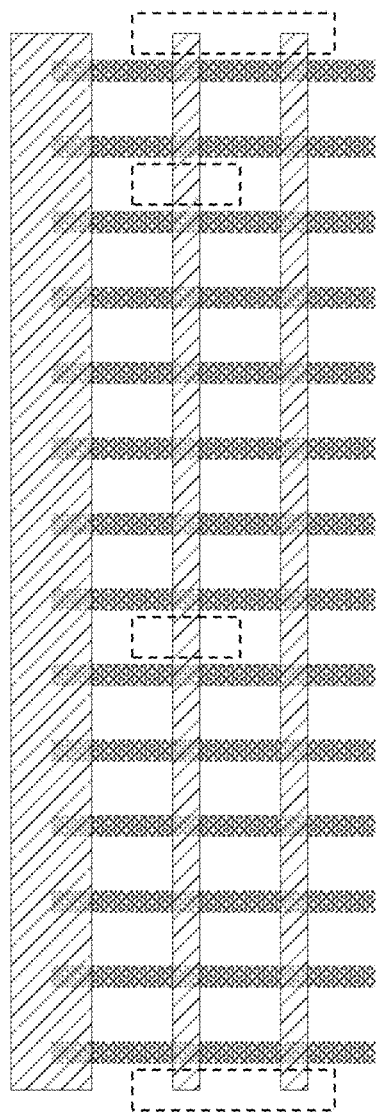
Figure 66C:
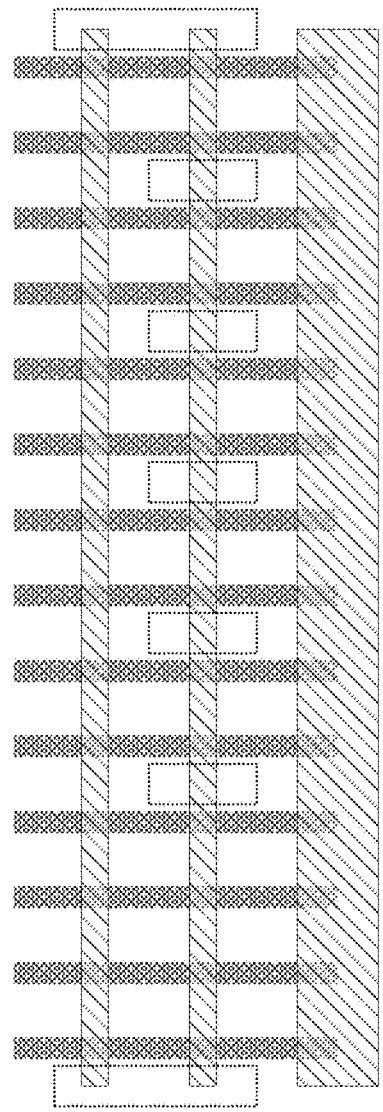
Figure 66D:
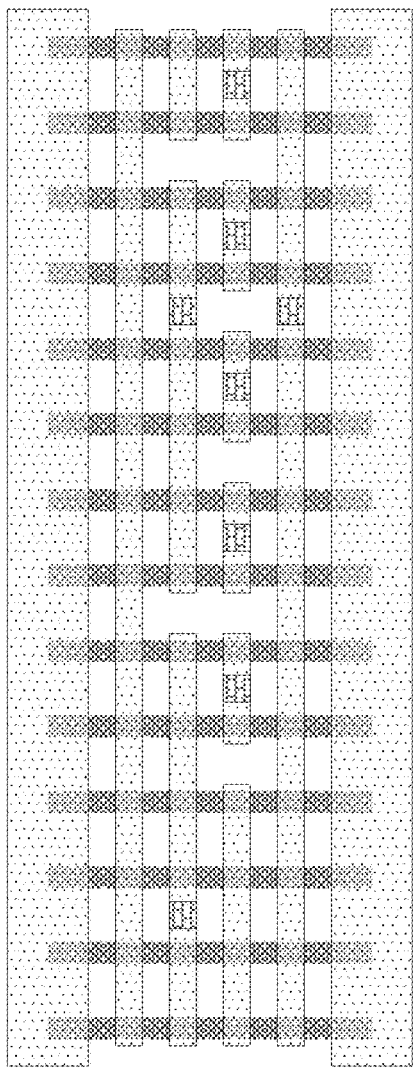
Figure 67A:
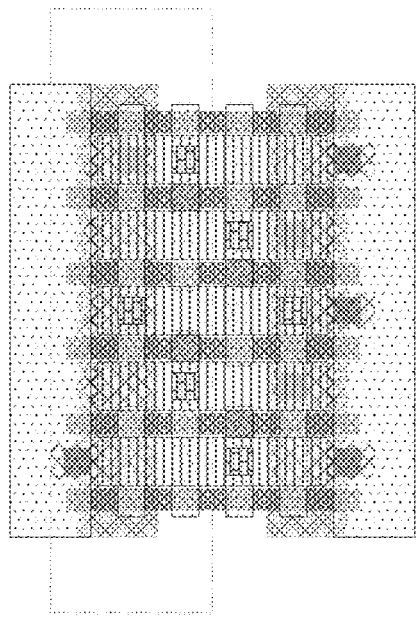
FIGS. 67A-D depict an nr4x1 cell.
Figure 67B:
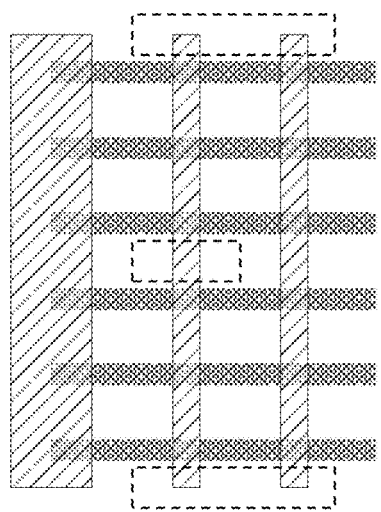
Figure 67C:
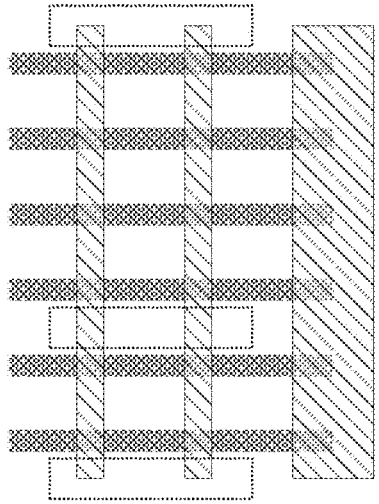
Figure 67D:
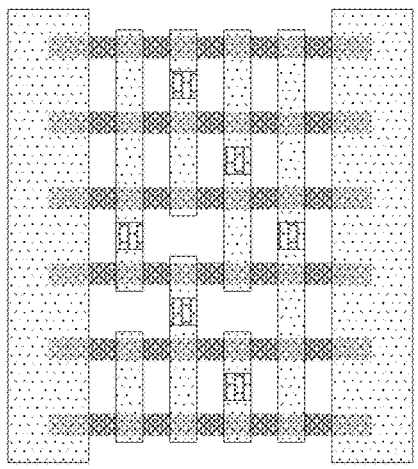
Figure 68A:
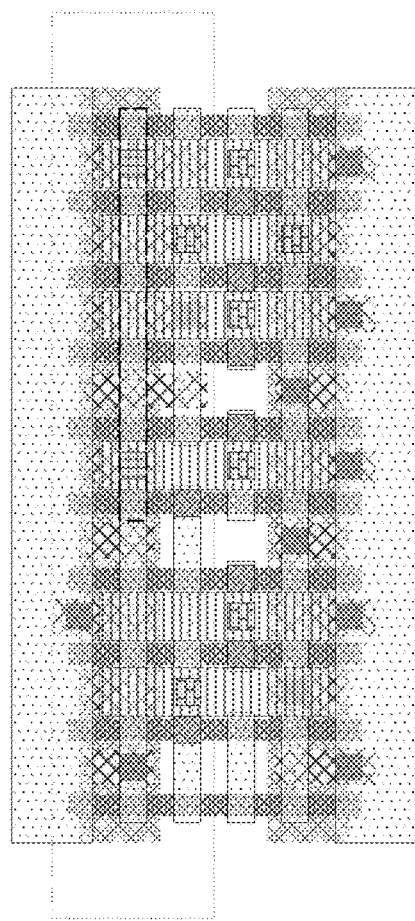
FIGS. 68A-D depict an nr4x2 cell.
Figure 68B:
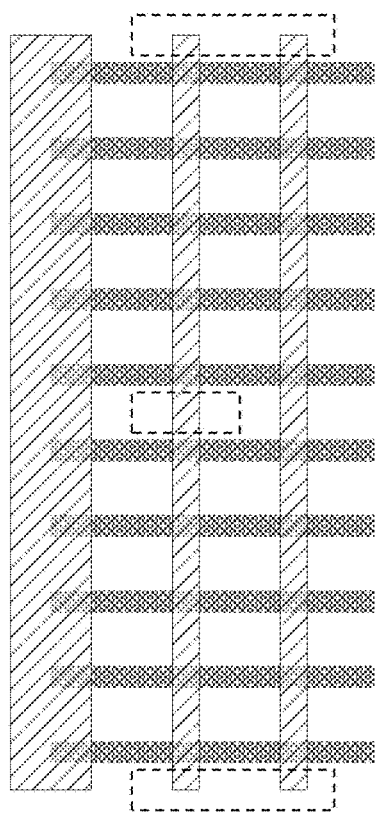
Figure 68C:
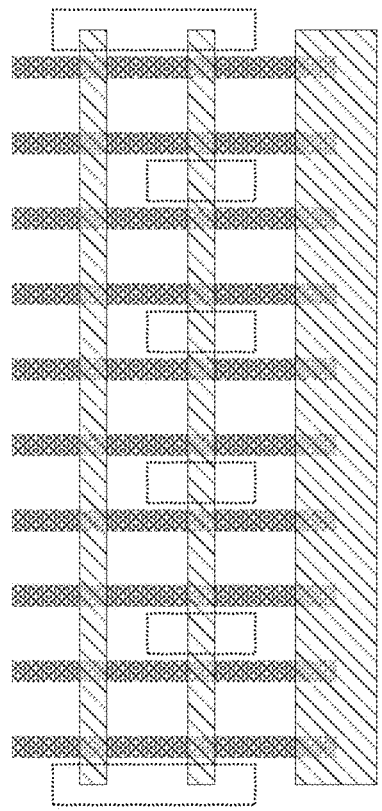
Figure 68D:
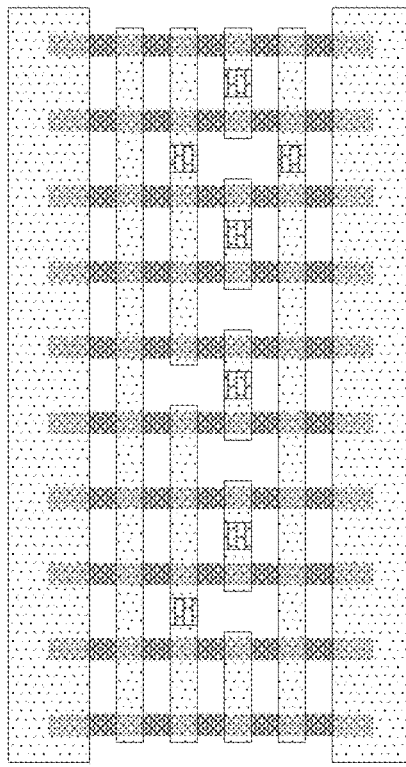
Figure 69A:
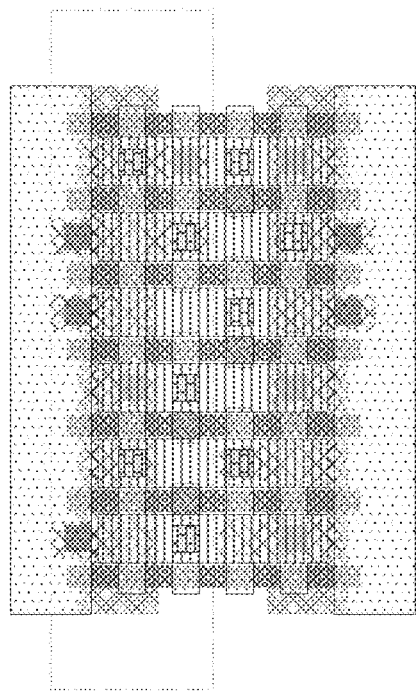
FIGS. 69A-D depict an oa21x1 cell.
Figure 69B:
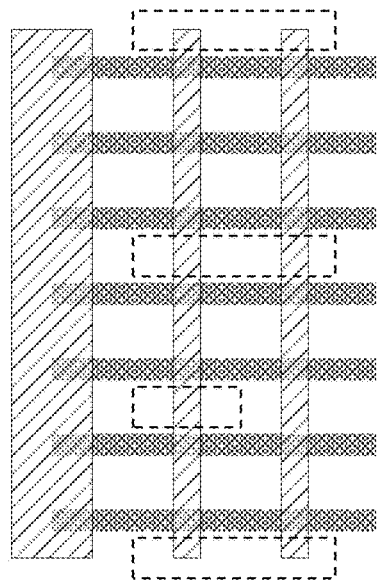
Figure 69C:
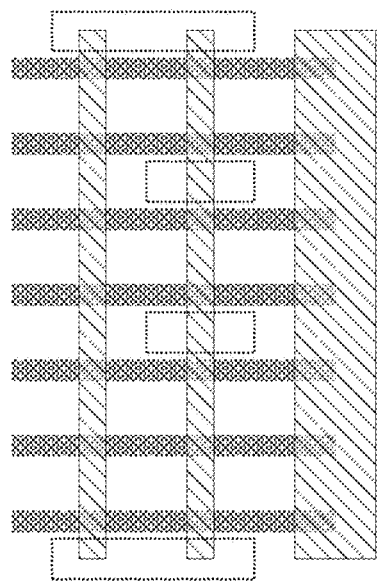
Figure 69D:
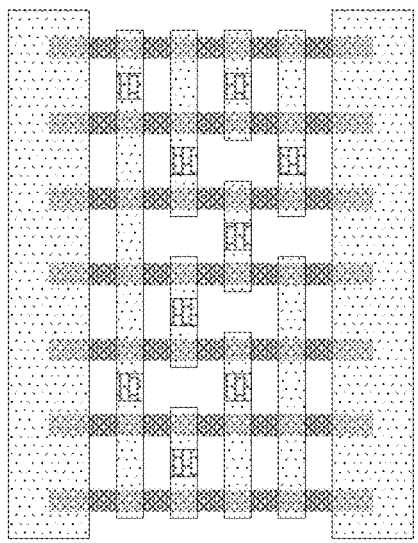
Figure 70A:
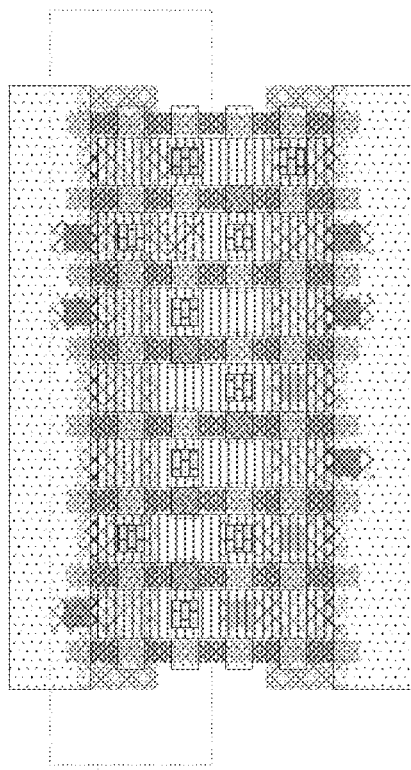
FIGS. 70A-D depict an oa31x1 cell.
Figure 70B:
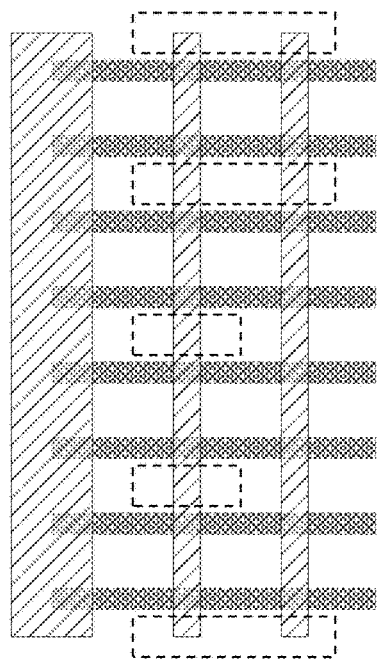
Figure 70C:
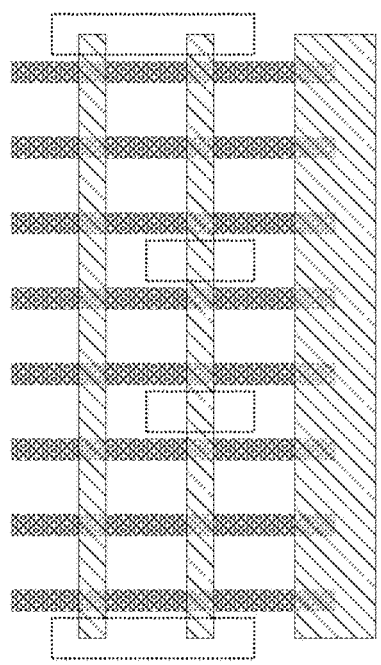
Figure 70D:
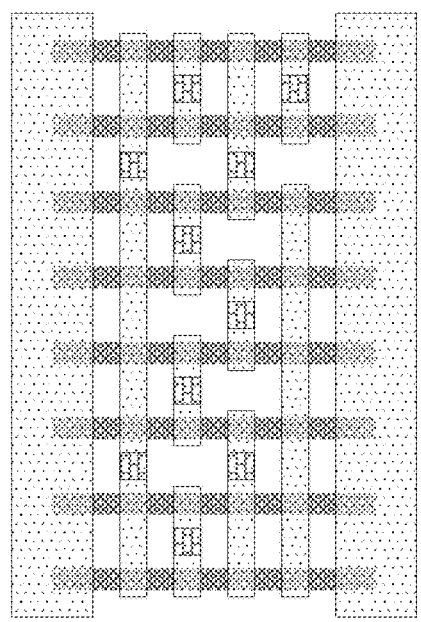
Figure 71A:
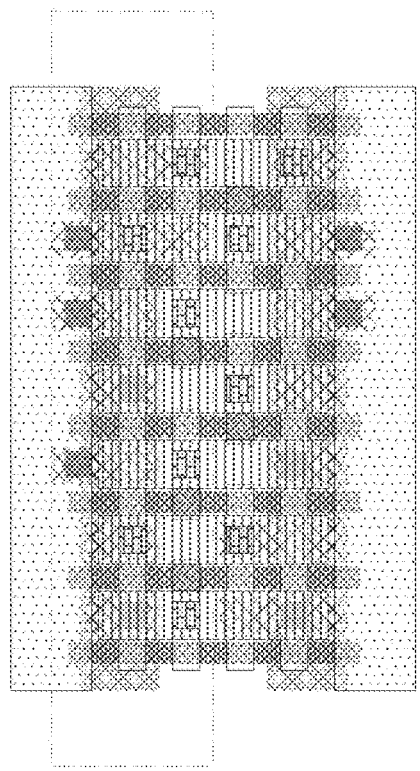
FIGS. 71A-D depict an oa211x1 cell.
Figure 71B:
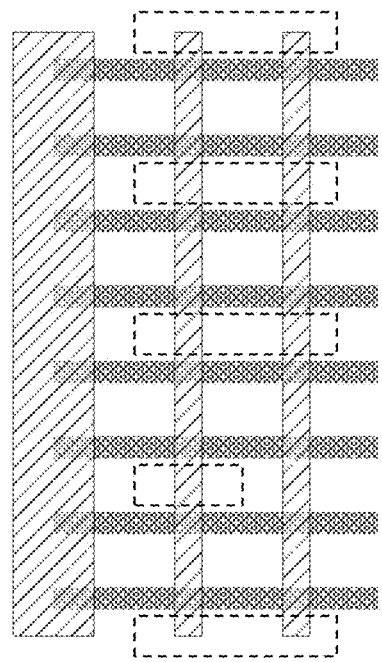
Figure 71C:
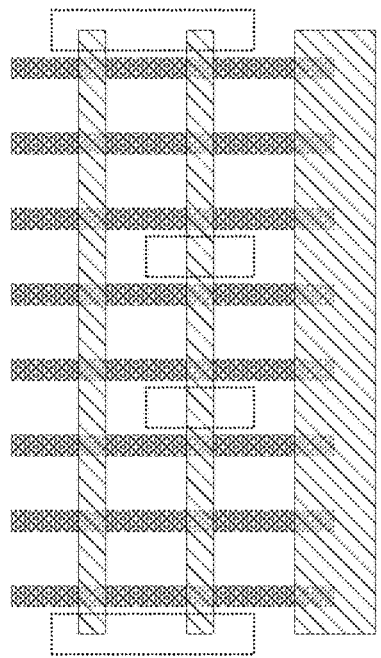
Figure 71D:
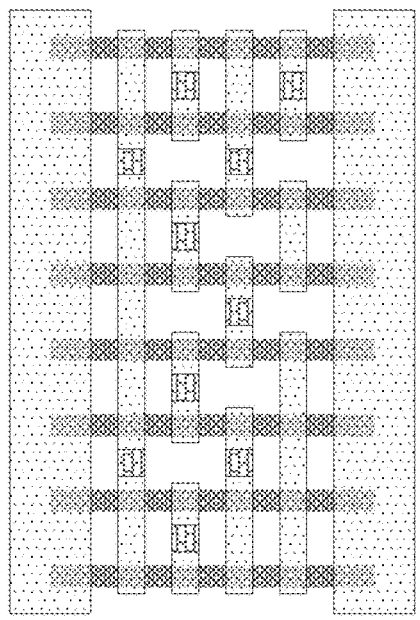
Figure 72A:
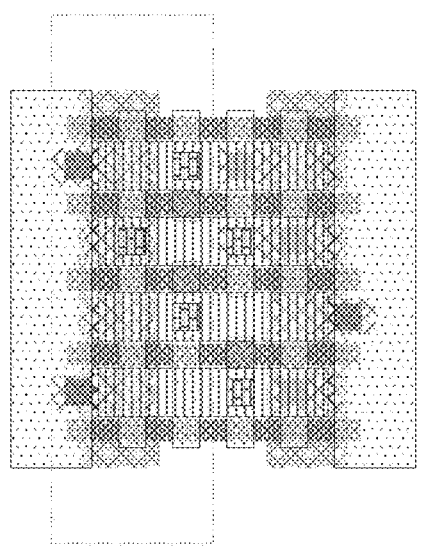
FIGS. 72A-D depict an oai21x1 cell.
Figure 72B:
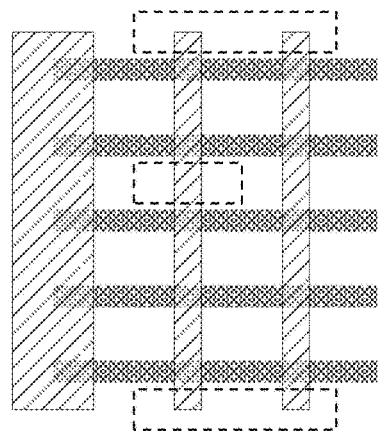
Figure 72C:
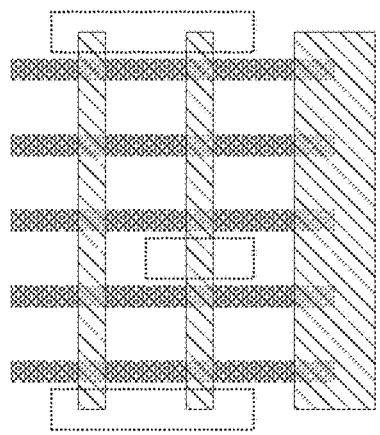
Figure 72D:
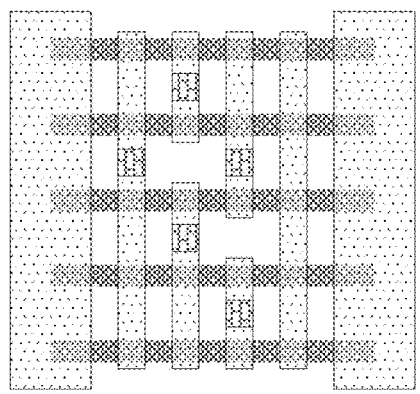
Figure 73A:
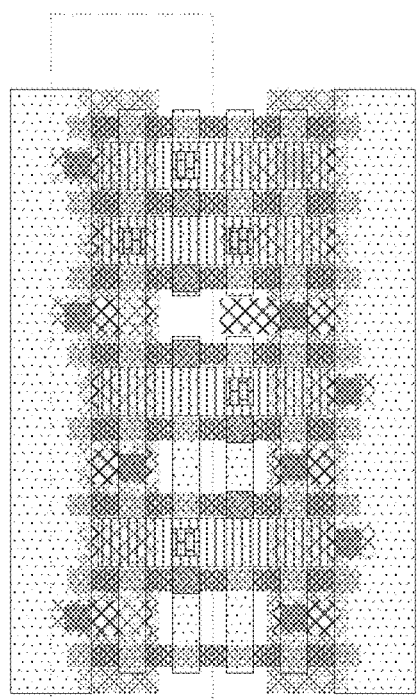
FIGS. 73A-D depict an oai21x2 cell.
Figure 73B:
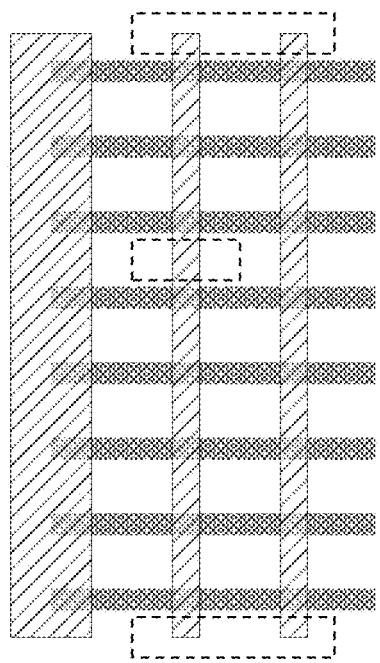
Figure 73C:
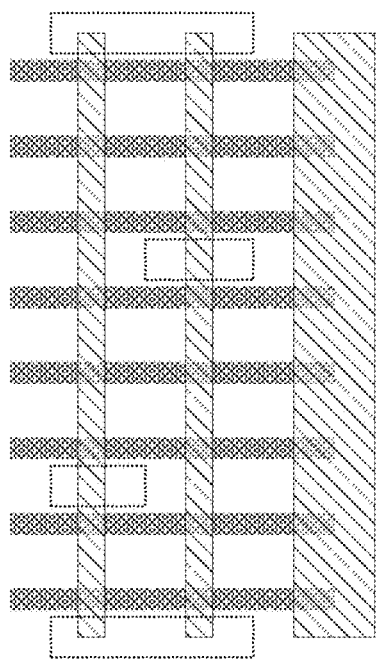
Figure 73D:
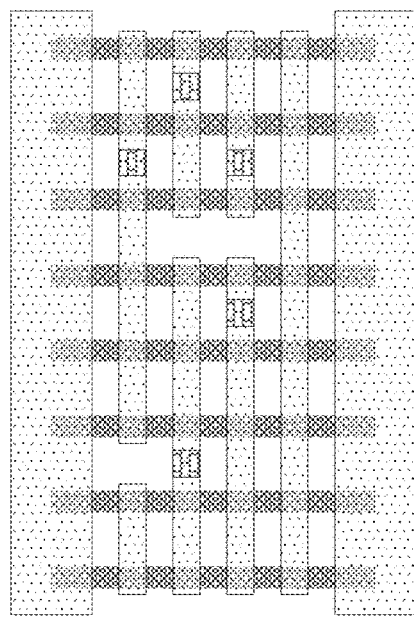
Figure 74A:
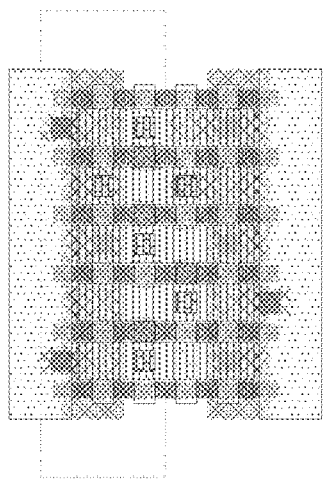
FIGS. 74A-D depict an oai22x1 cell.
Figure 74B:
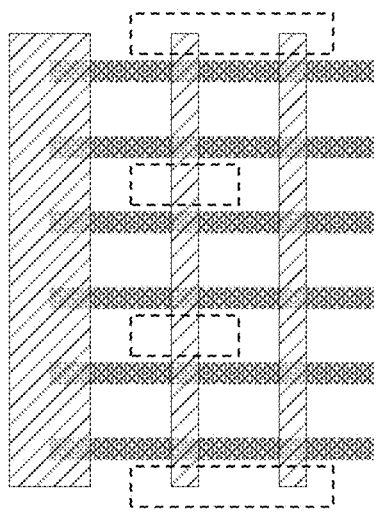
Figure 74C:
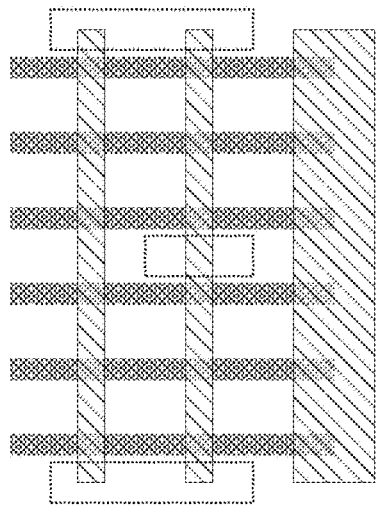
Figure 74D:
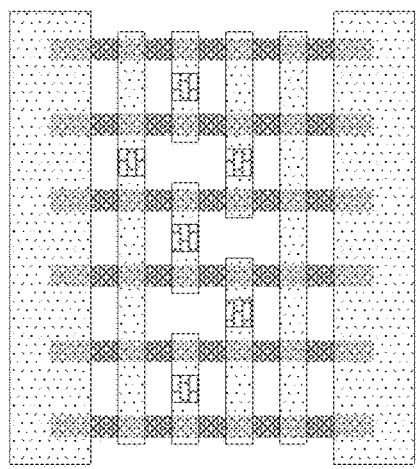
Figure 75A:
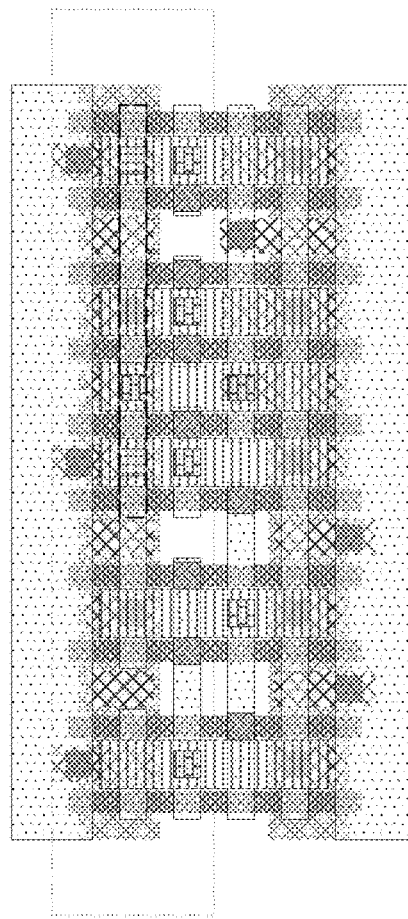
FIGS. 75A-D depict an oai22x2 cell.
Figure 75B:
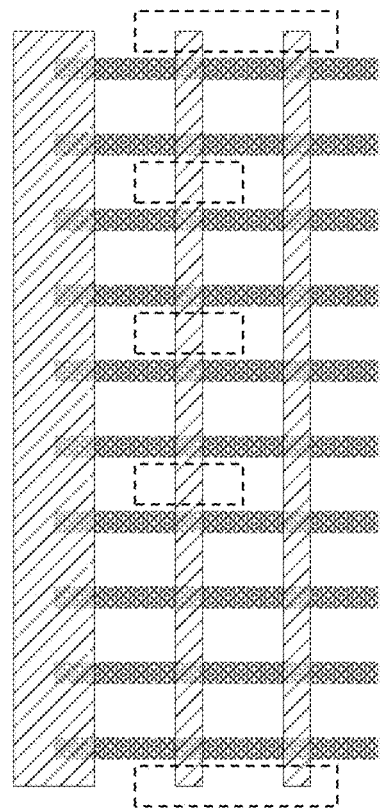
Figure 75C:
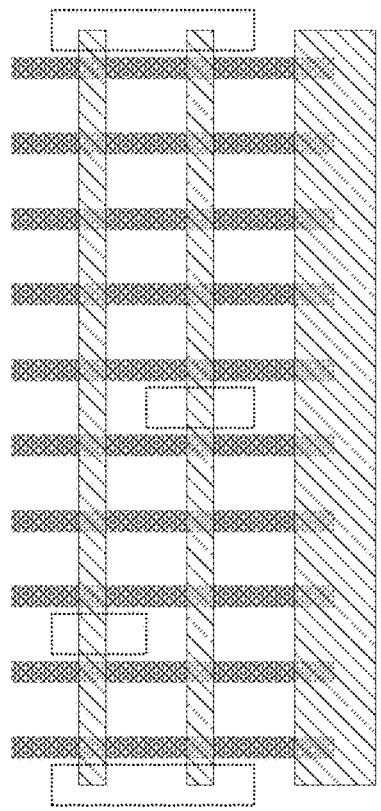
Figure 75D:
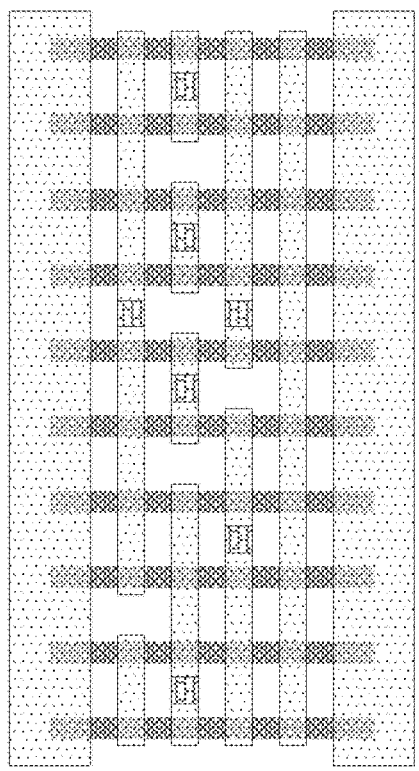
Figure 76A:
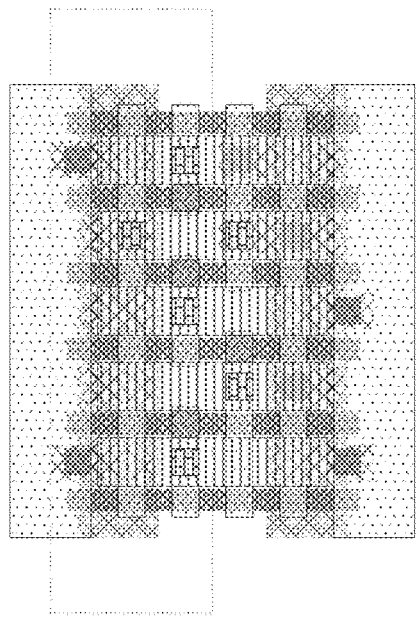
FIGS. 76A-D depict an oai31x1 cell.
Figure 76B:
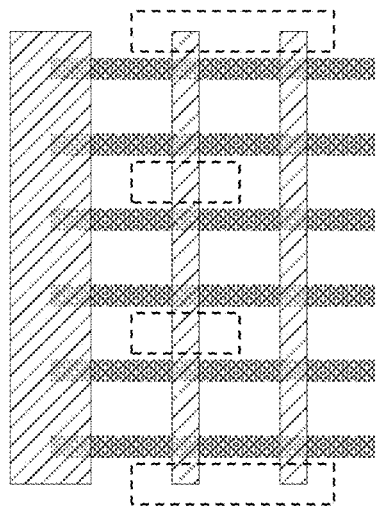
Figure 76C:
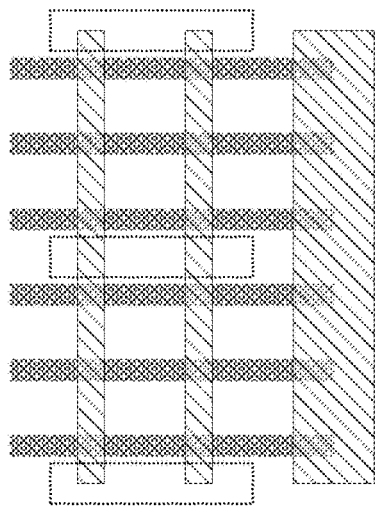
Figure 76D:
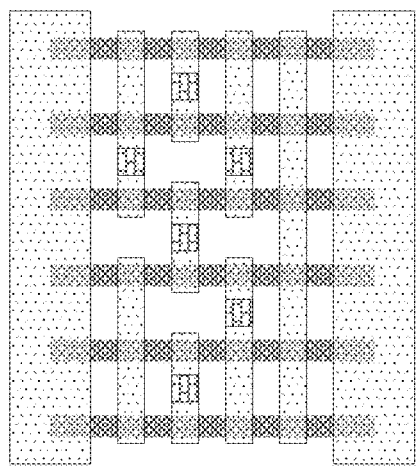
Figure 77A:
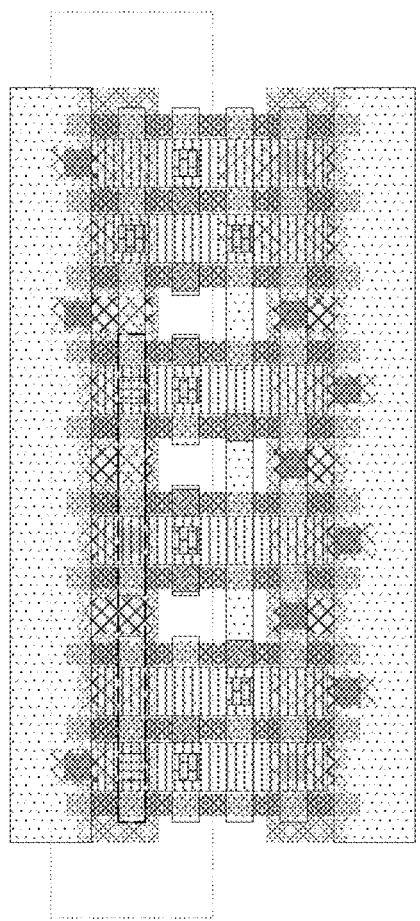
FIGS. 77A-D depict an oai31x2 cell.
Figure 77B:
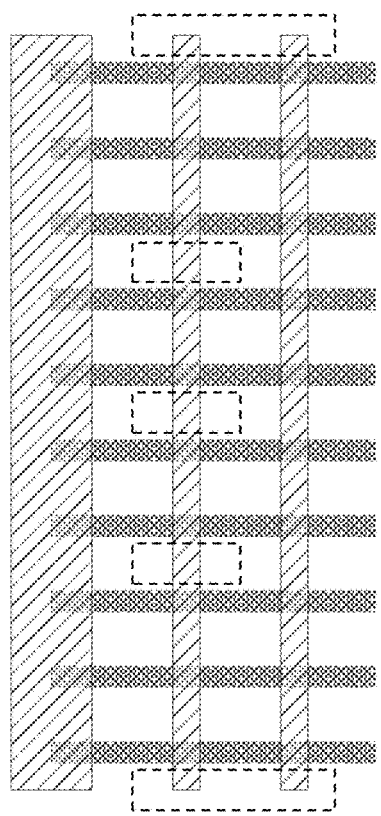
Figure 77C:
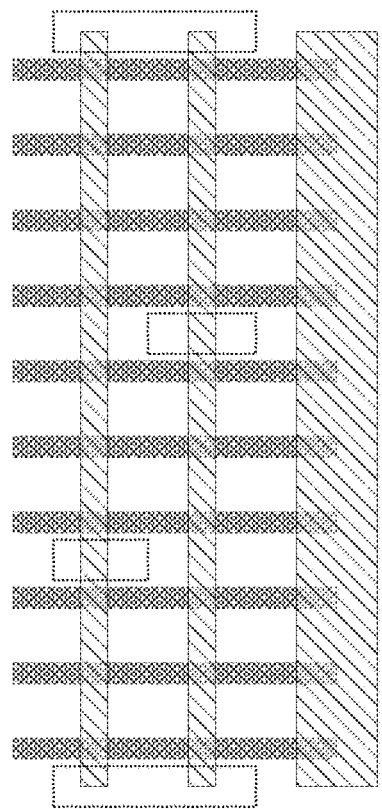
Figure 77D:
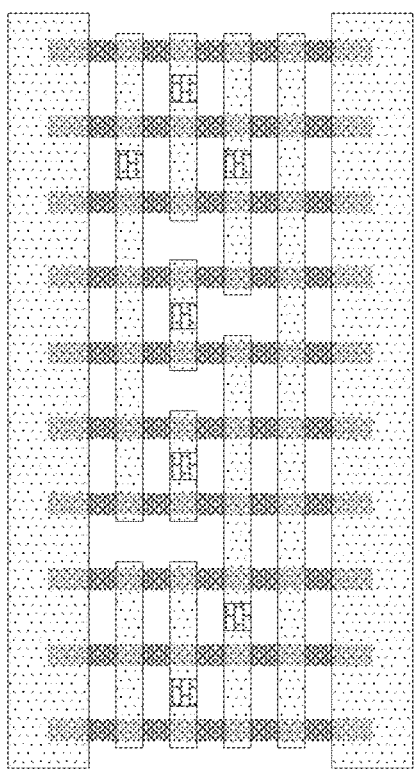
Figure 78A:
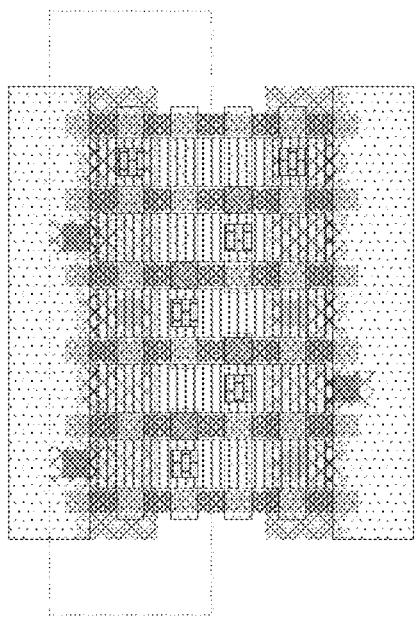
FIGS. 78A-D depict an oai211x1 cell.
Figure 78B:
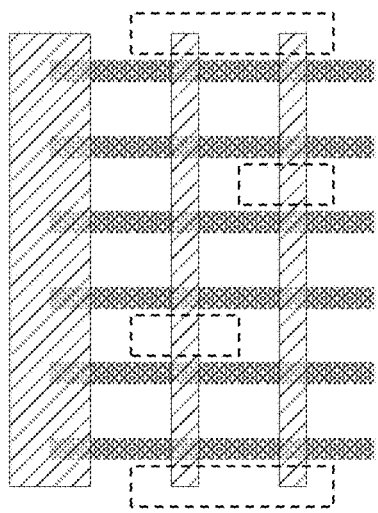
Figure 78C:
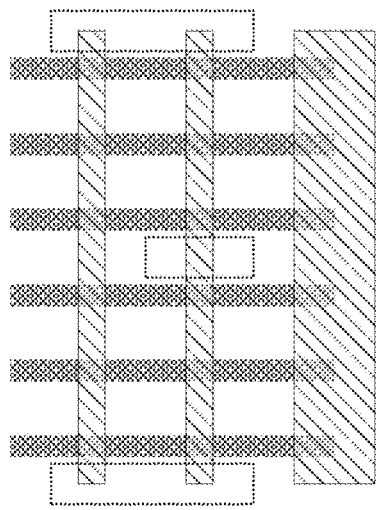
Figure 78D:
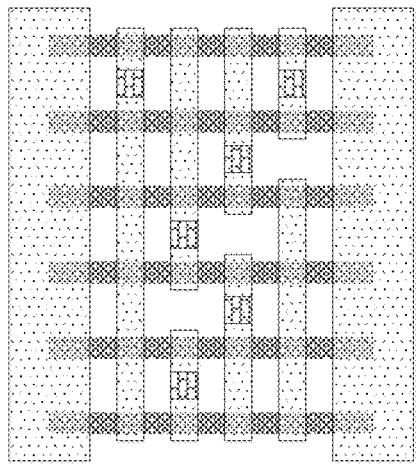
Figure 79A:
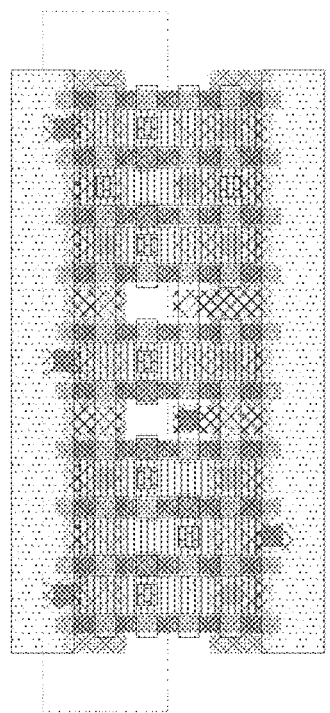
FIGS. 79A-D depict an oai222x1 cell.
Figure 79B:
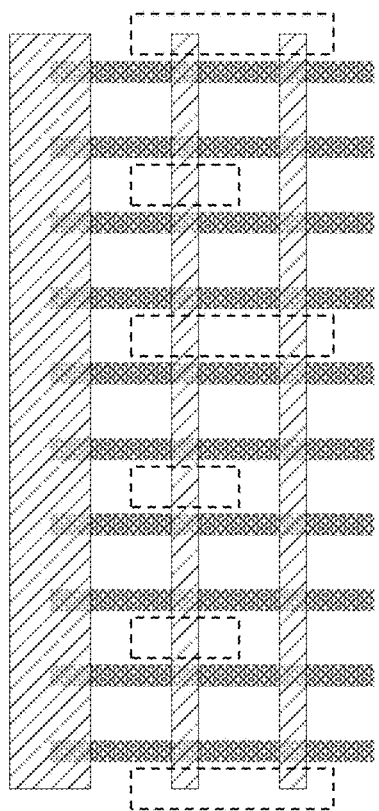
Figure 79C:
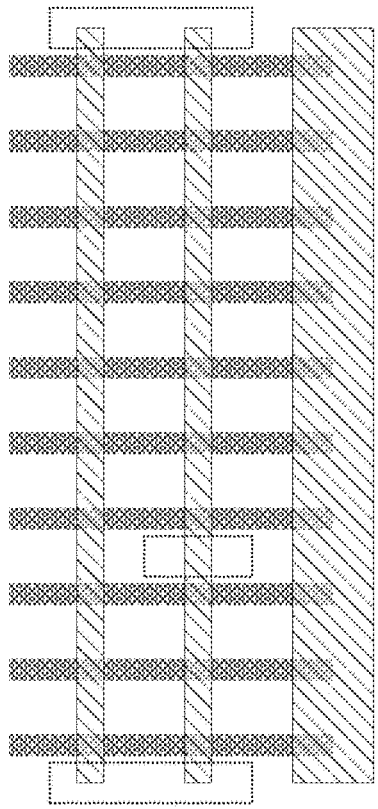
Figure 79D:
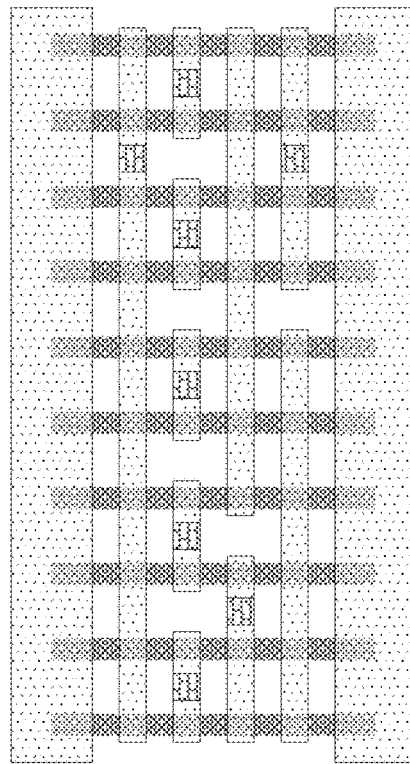
Figure 80A:
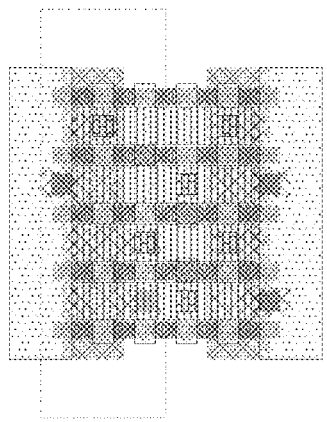
FIGS. 80A-D depict an or2x1 cell.
Figure 80B:
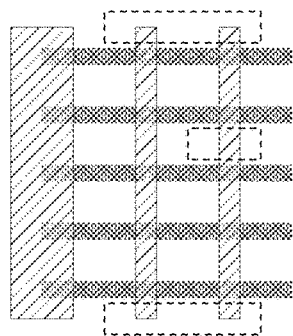
Figure 80C:
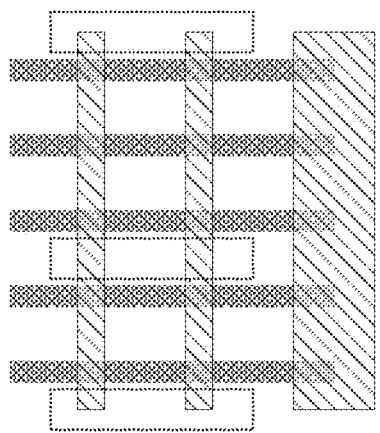
Figure 80D:
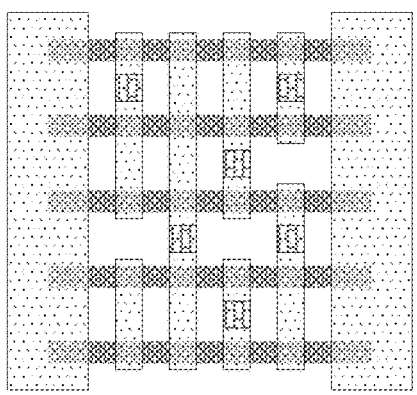
Figure 81A:
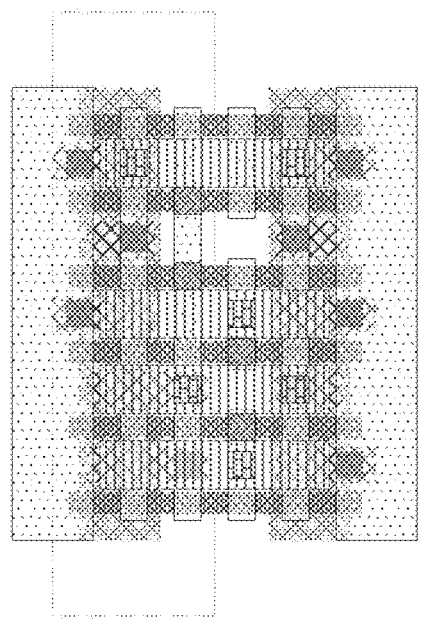
FIGS. 81A-D depict an or2x2 cell.
Figure 81B:
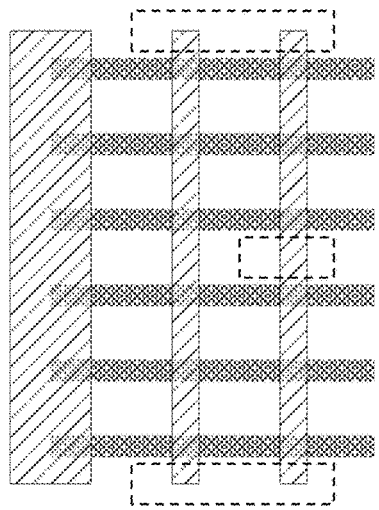
Figure 81C:
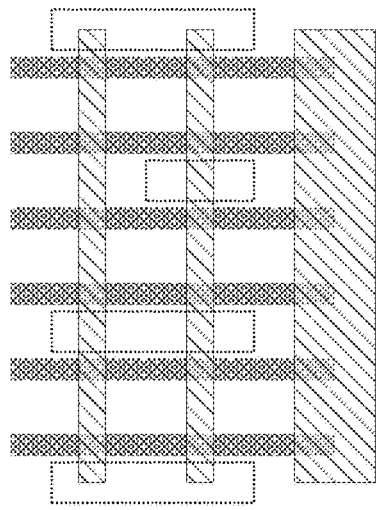
Figure 81D:
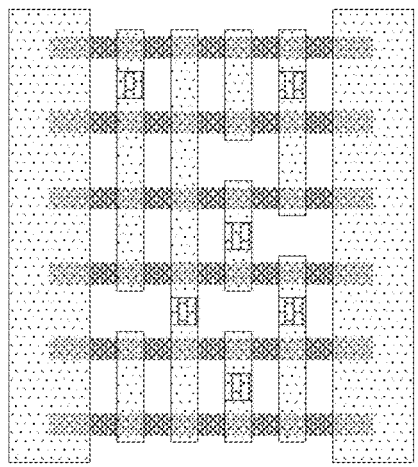
Figure 82A:
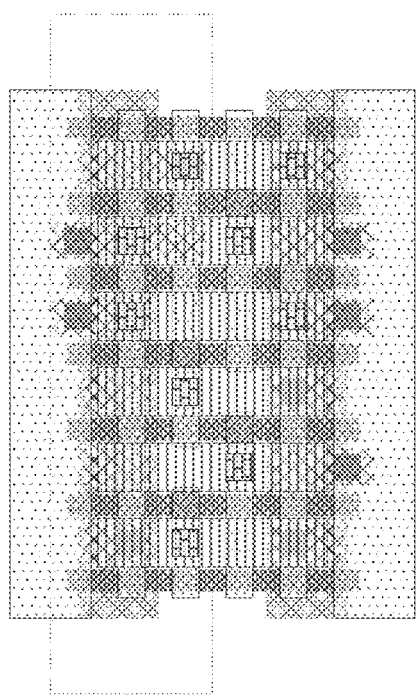
FIGS. 82A-D depict an or3x1 cell.
Figure 82B:
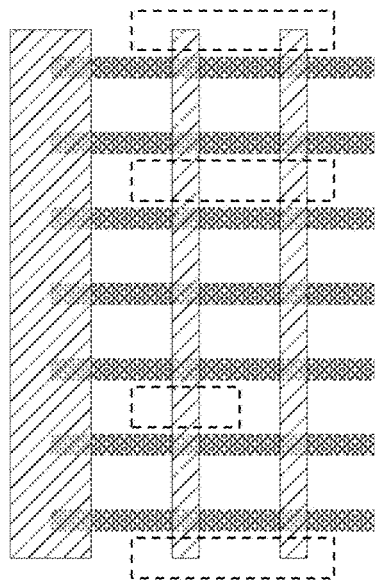
Figure 82C:
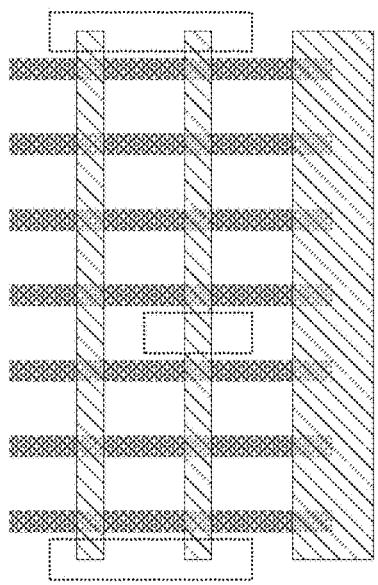
Figure 82D:
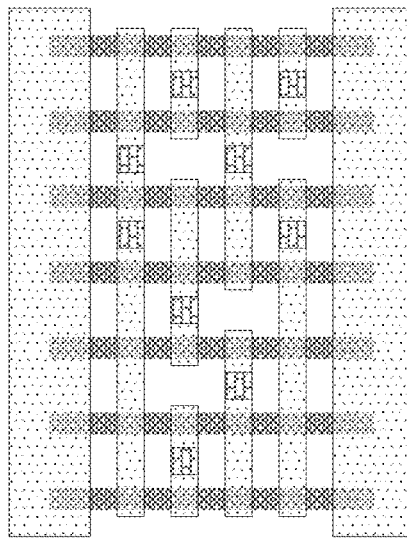
Figure 83A:
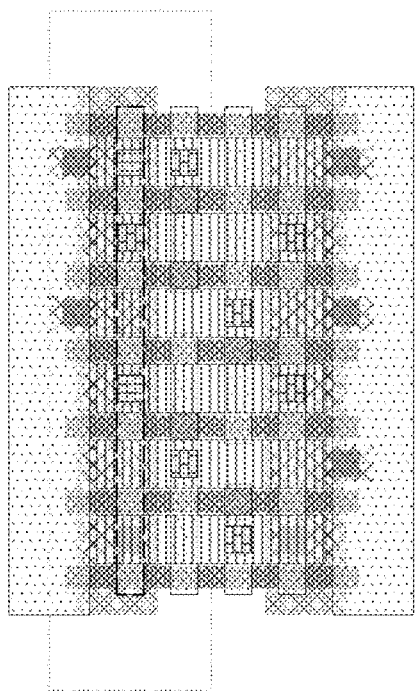
FIGS. 83A-D depict an or3x2 cell.
Figure 83B:
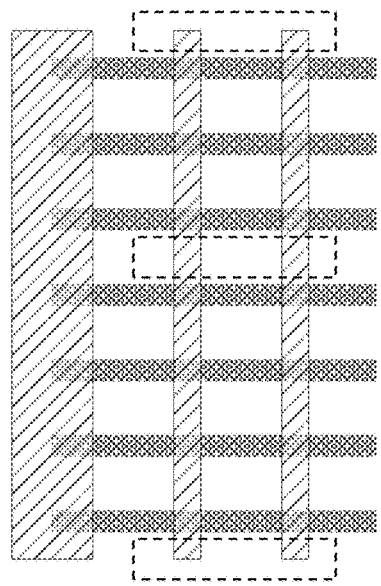
Figure 83C:
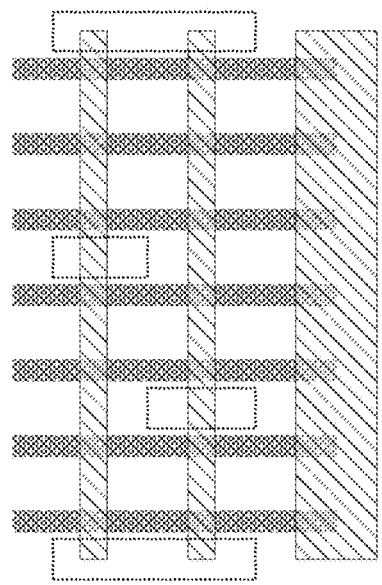
Figure 83D:
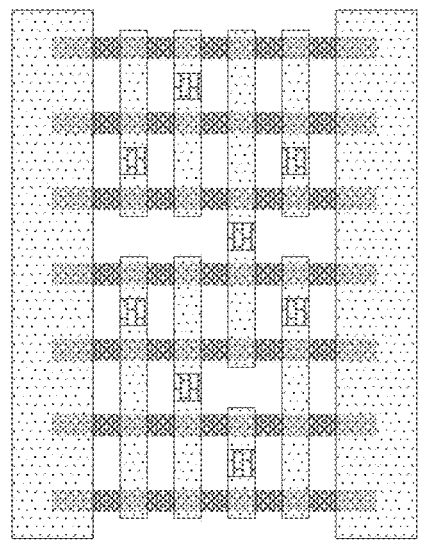
Figure 84A:
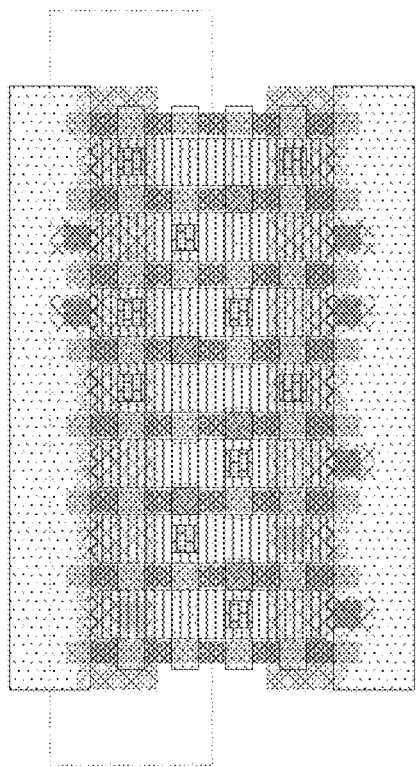
FIGS. 84A-D depict an or4x1 cell.
Figure 84B:
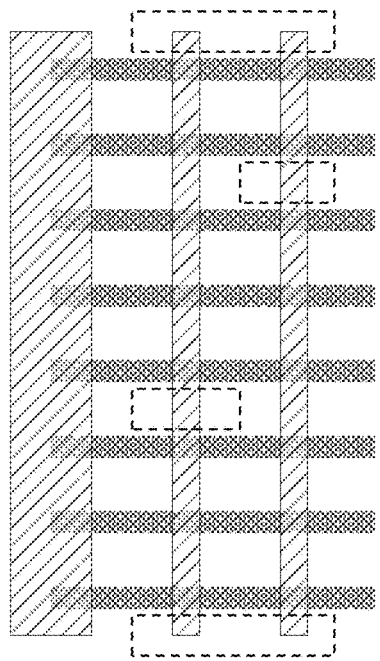
Figure 84C:
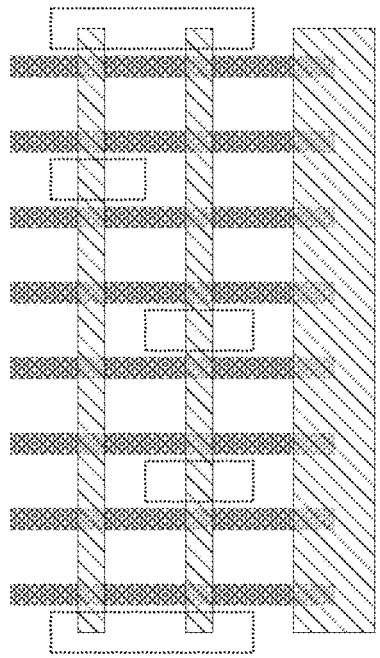
Figure 84D:
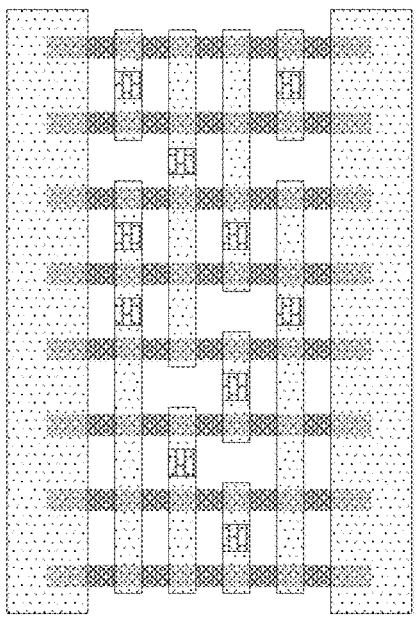
Figure 85A:
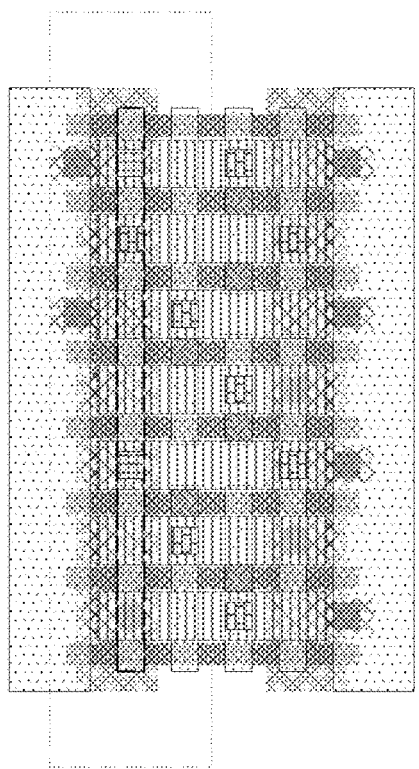
FIGS. 85A-D depict an or4x2 cell.
Figure 85B:
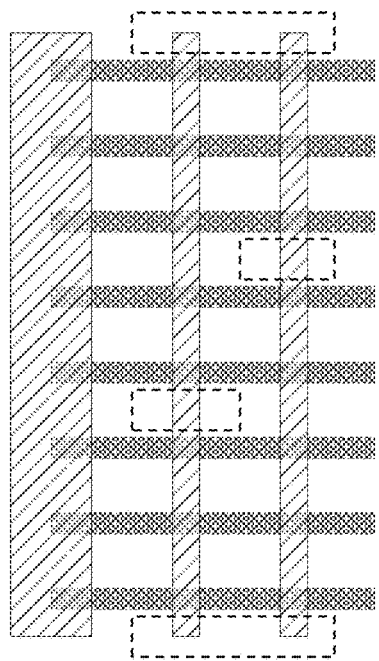
Figure 85C:
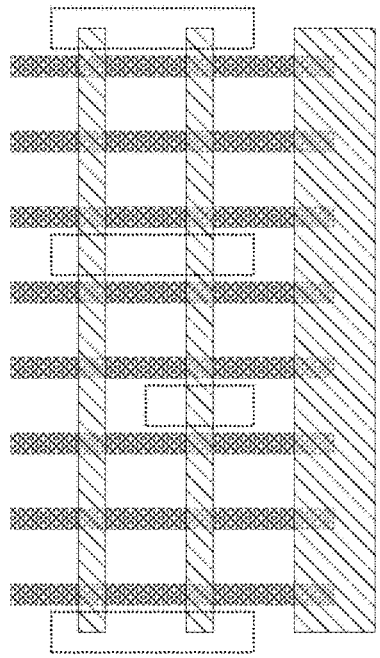
Figure 85D:
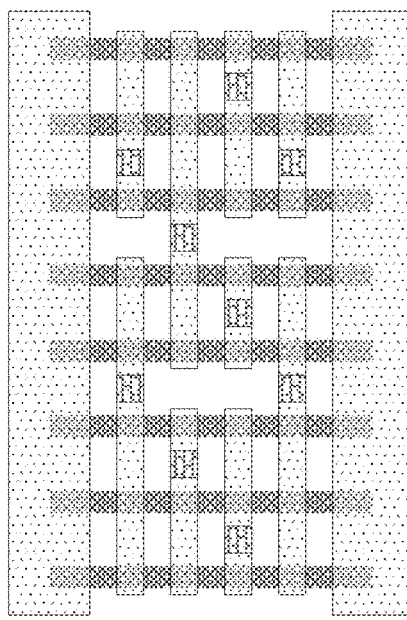
Figure 86A:
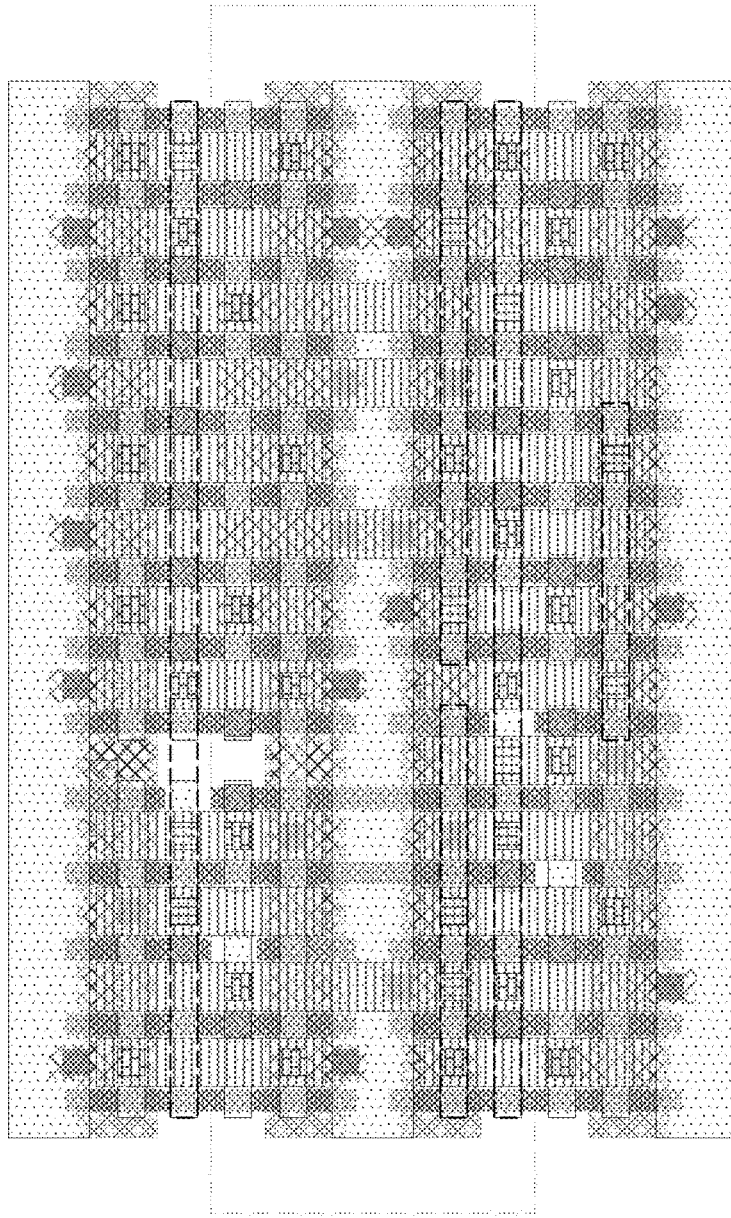
FIGS. 86A-D depict an sdffqx1 cell.
Figure 86B:
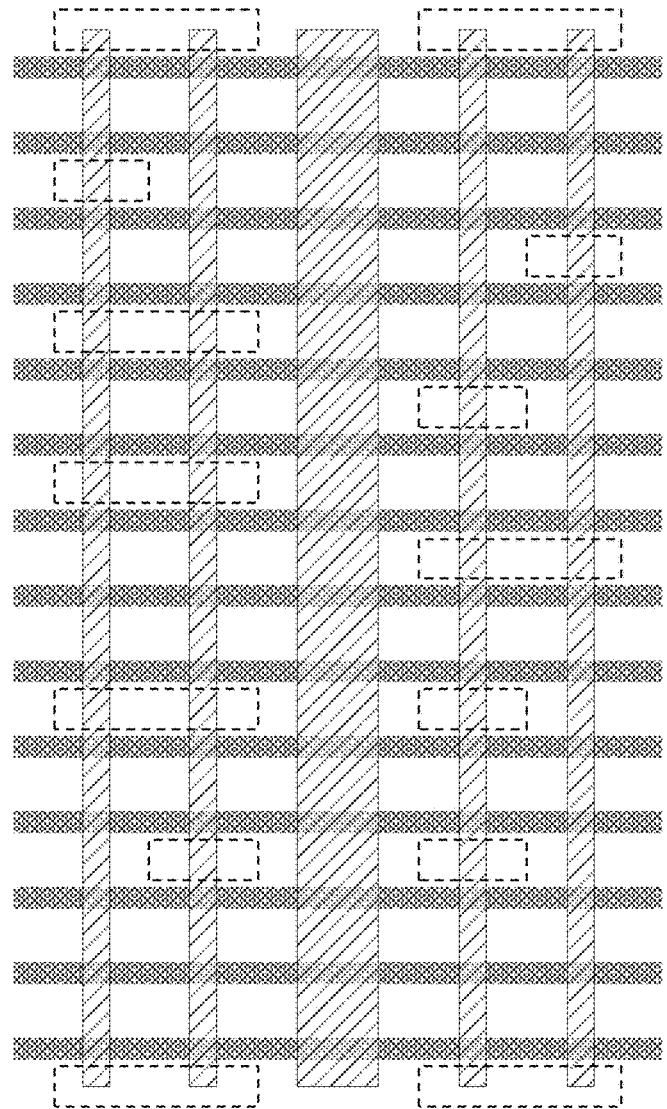
Figure 86C:
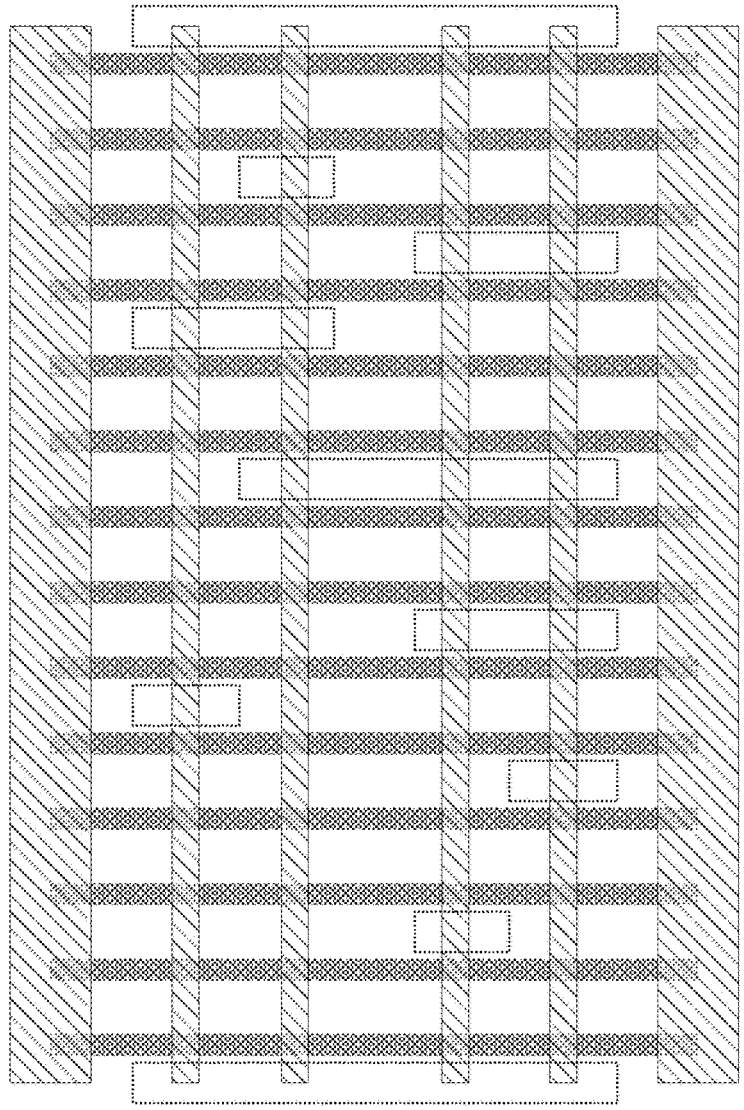
Figure 86D:
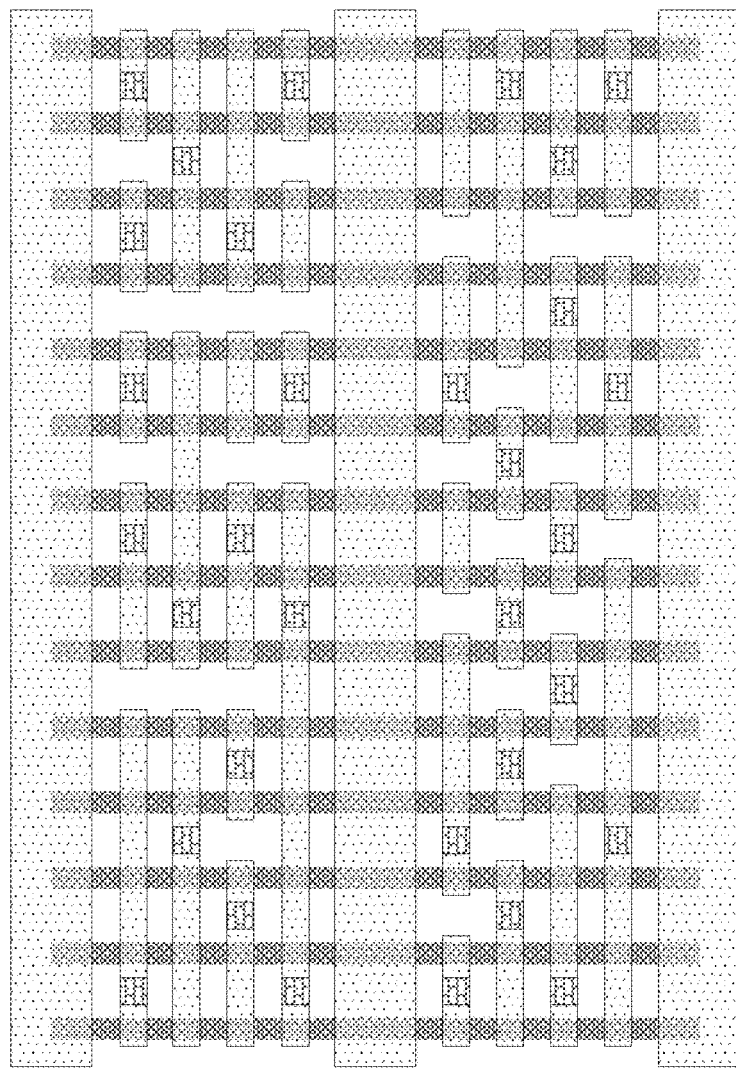
Figure 87A:
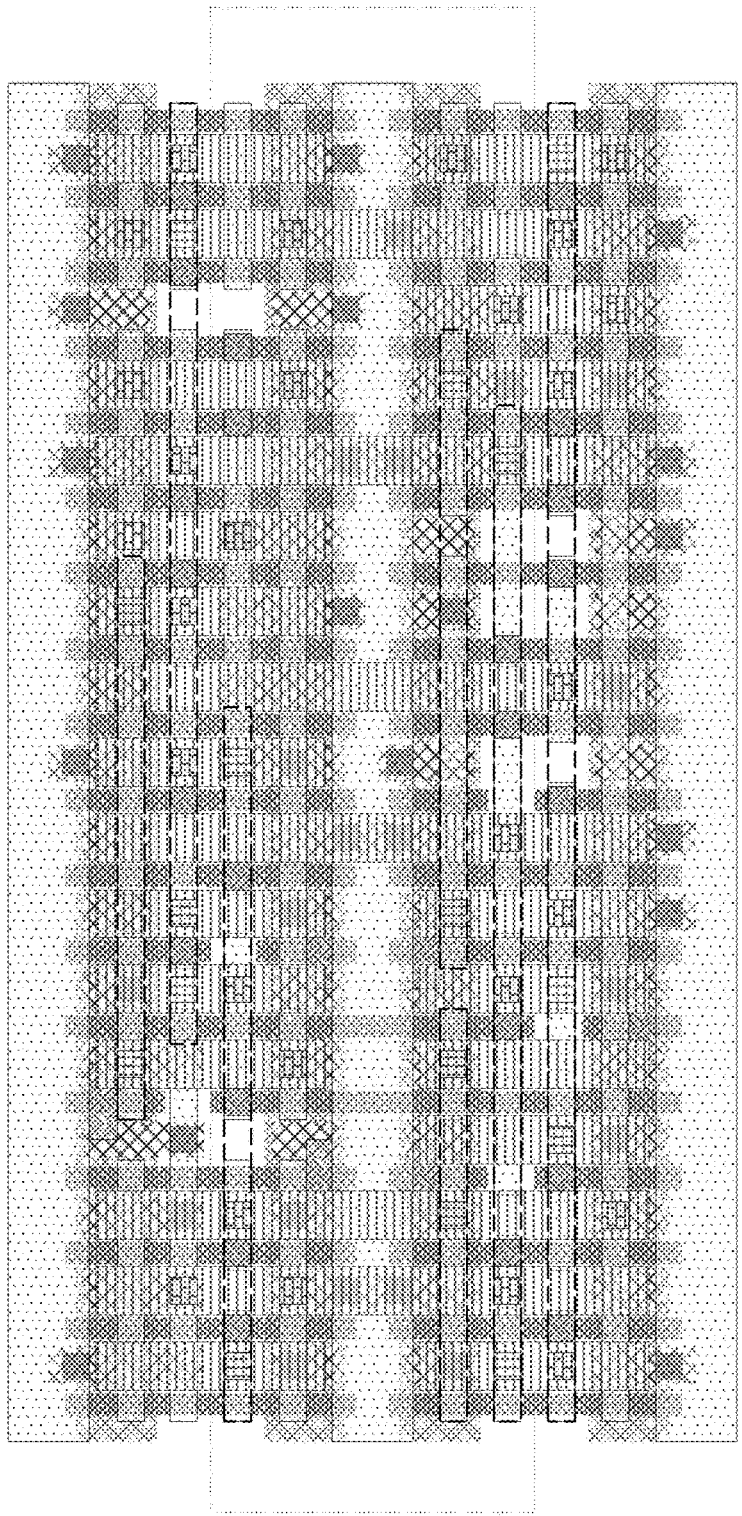
FIGS. 87A-D depict an sdffrsqx1 cell.
Figure 87B:
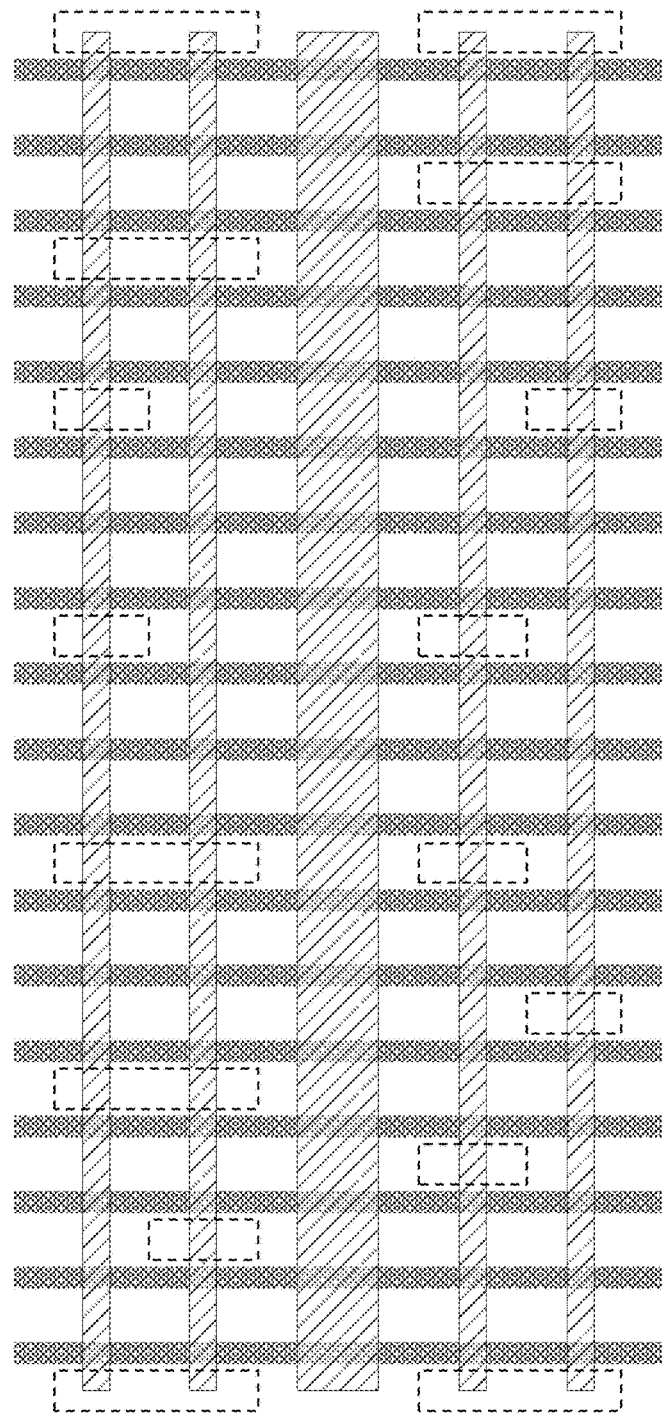
Figure 87C:
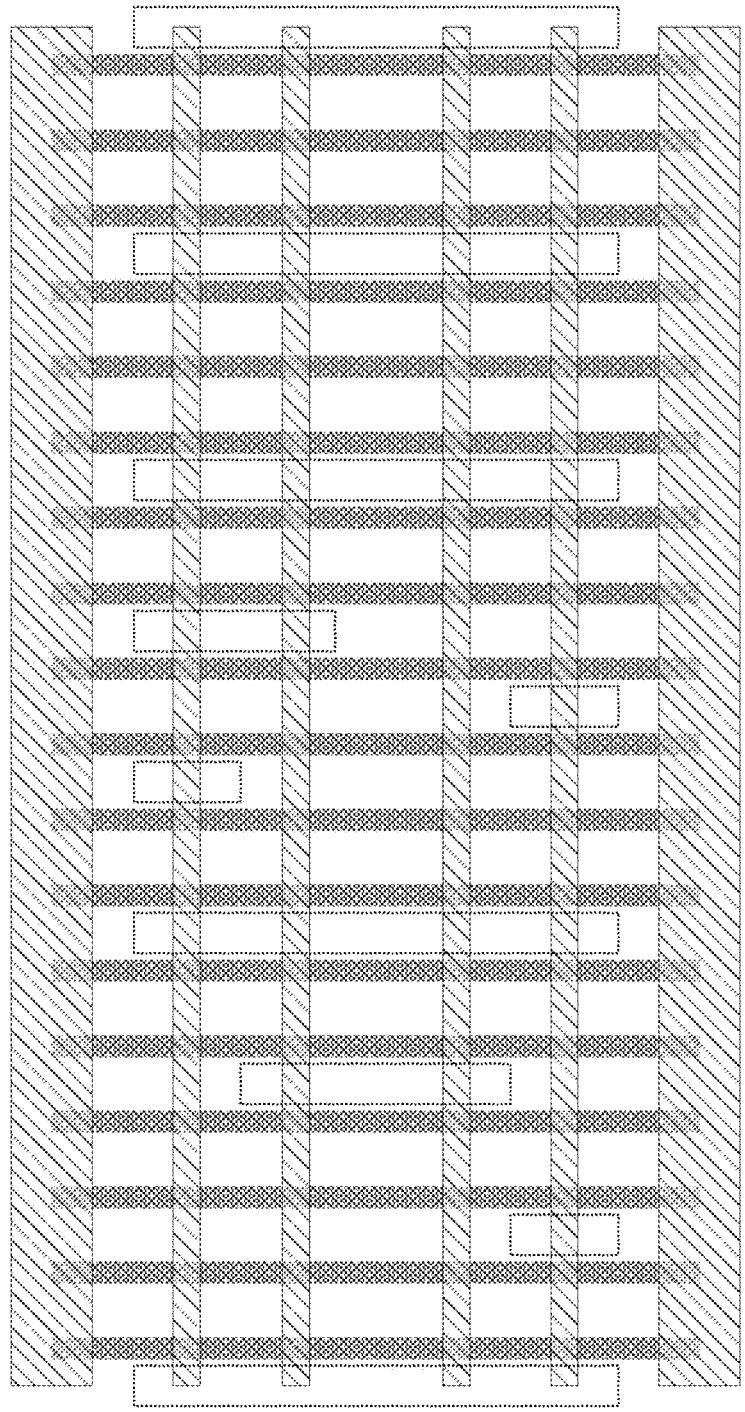
Figure 87D:
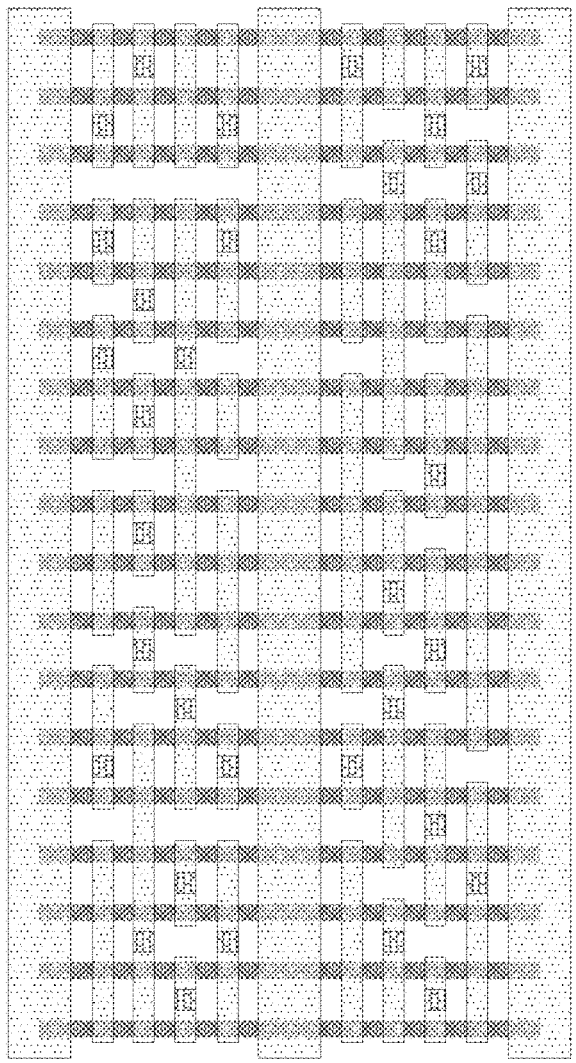
Figure 88A:
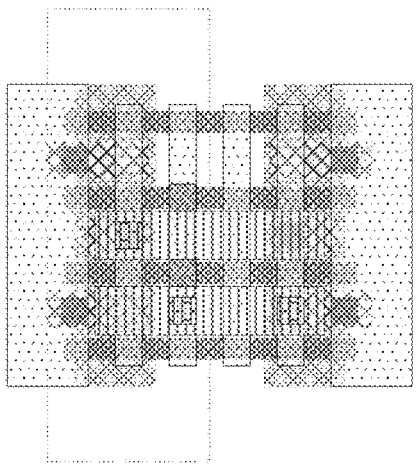
FIGS. 88A-D depict an tiehix1 cell.
Figure 88B:
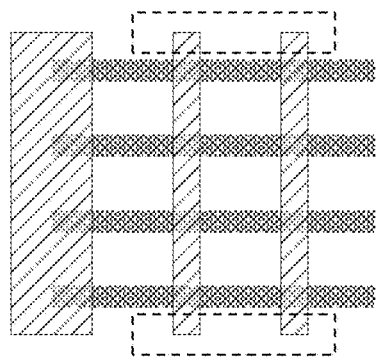
Figure 88C:
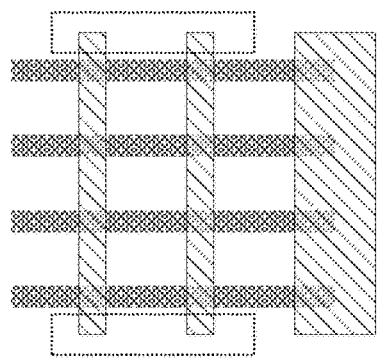
Figure 88D:
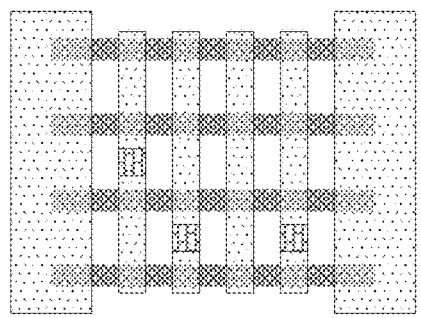
Figure 89A:
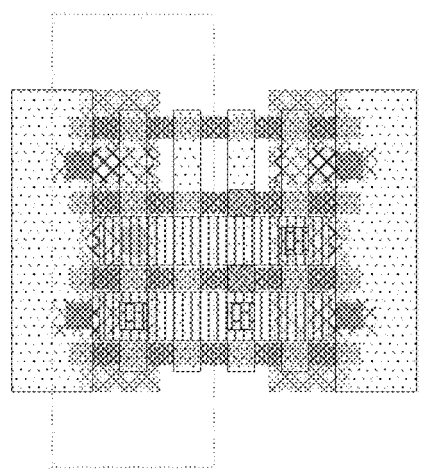
FIGS. 89A-D depict an tielox1 cell.
Figure 89B:
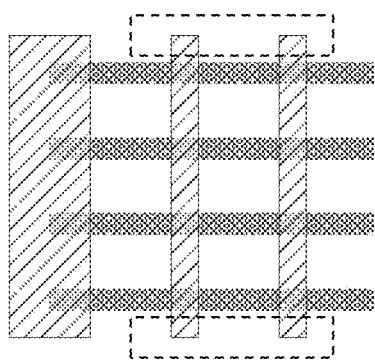
Figure 89C:
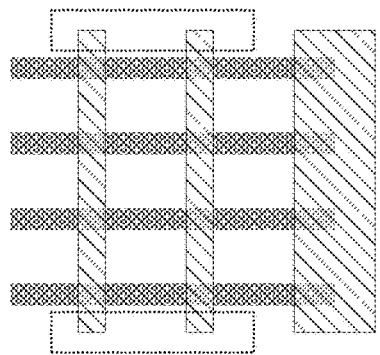
Figure 89D:
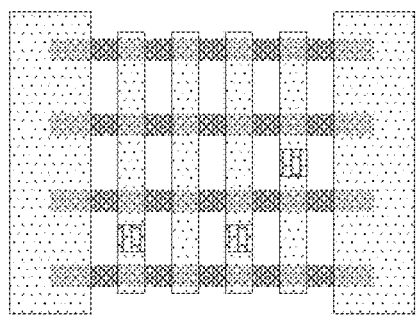
Figure 90A:
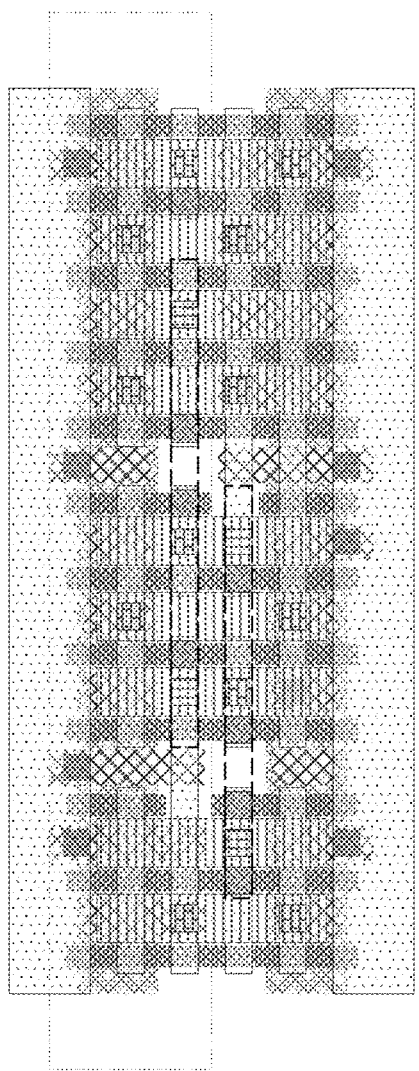
FIGS. 90A-D depict an xnr2x1 cell.
Figure 90B:
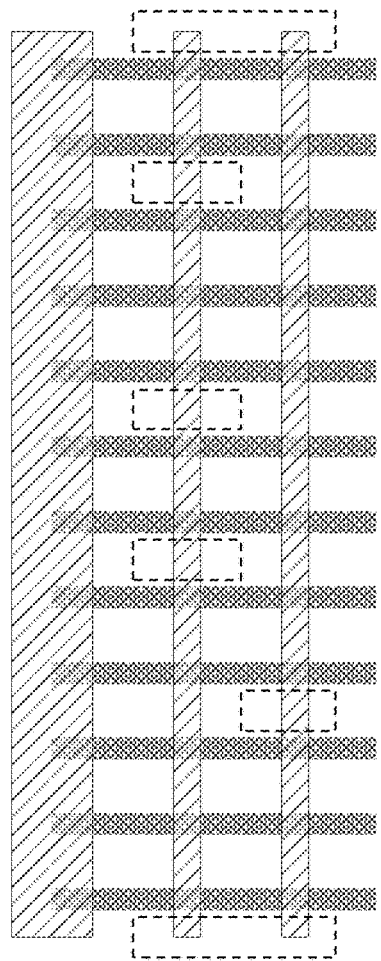
Figure 90C:
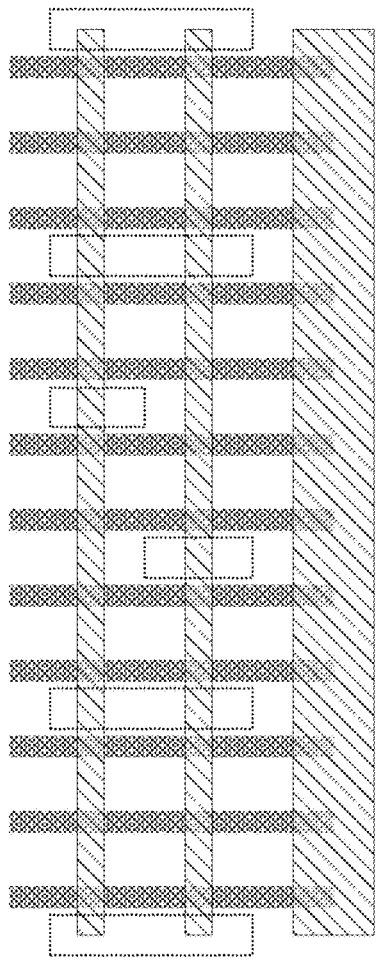
Figure 90D:
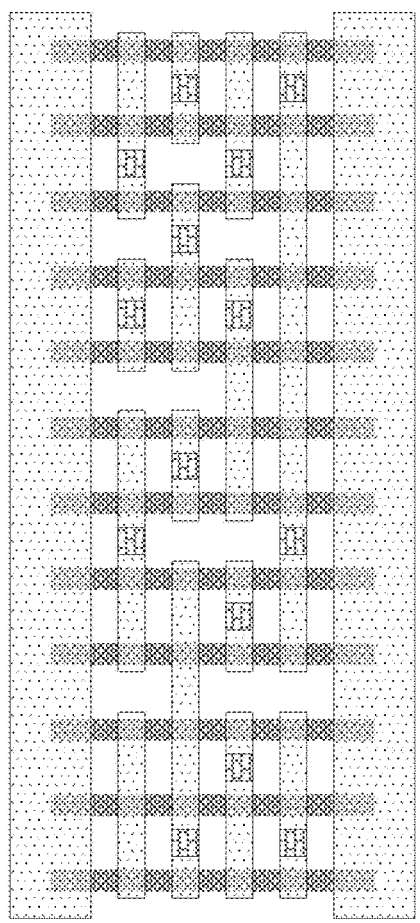
Figure 91A:
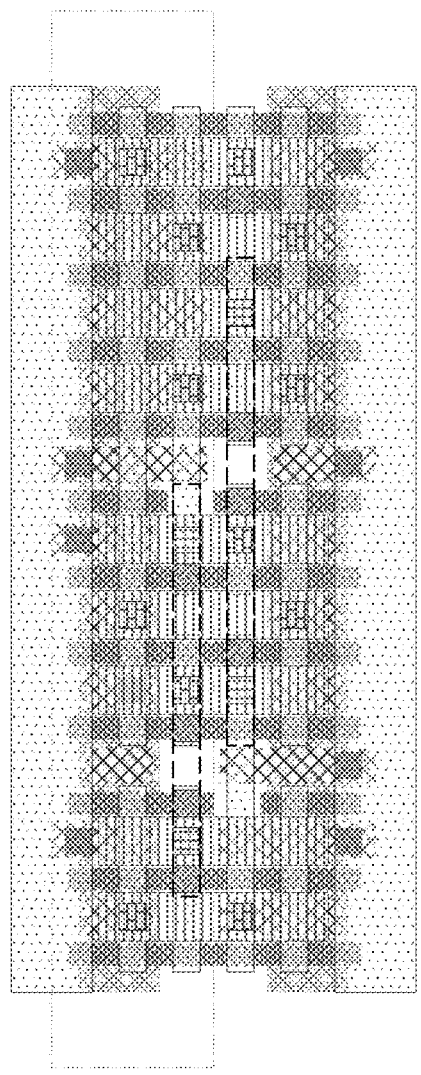
FIGS. 91A-D depict an xor2x1 cell; and,
FIG. 92 contains a layer legend for the A-labeled (i.e., 1A. 2A, 3A, etc.) figures.
Figure 91B:
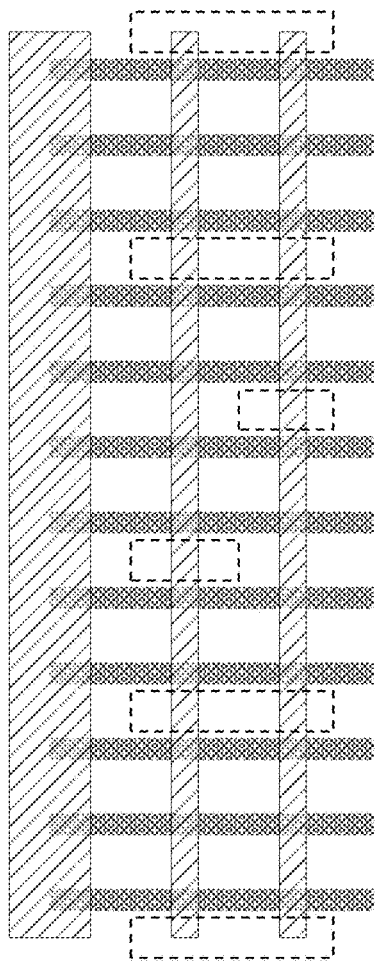
Figure 91C:
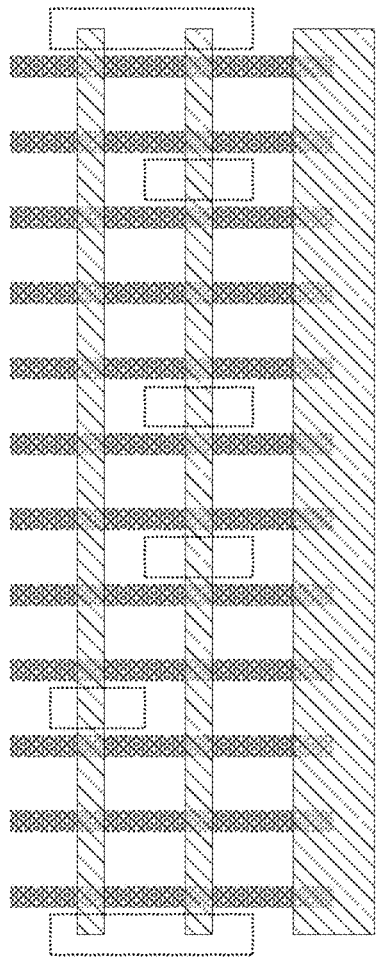
Figure 91D:
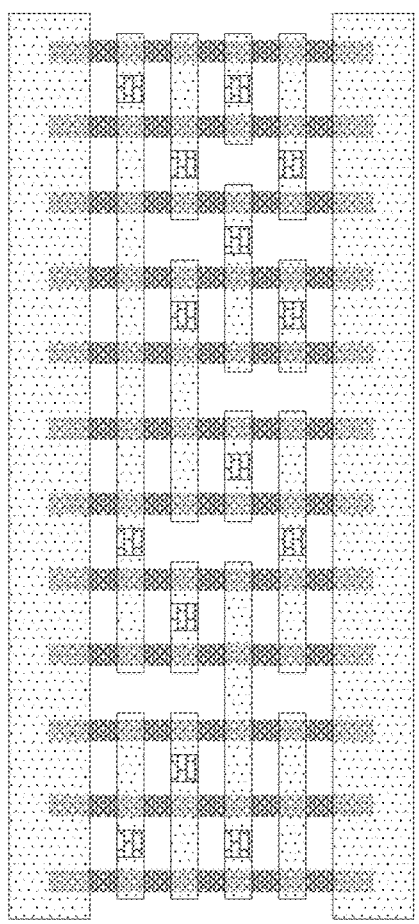

Reference is now made to FIGS. 2A-D, which depict a mux2x1 alt cell. This cell implements the logic function of a 2-input MUX, in drive strength 1. This cell is another example of a state-of-the-art layout that, nevertheless, does not meet the DFM objects of the present invention. As flagged in FIGS. 2B and 2C, this cell contains undesirable spacings between cuts in the first-exposure M0 layer (see 7 on FIG. 2B) and between cuts in the second-exposure M0 layer (see 8 and 9 in FIG. 2C). Referring now to FIG. 2D, this cell also contains undesirable configurations in the V0 layer: (i) one instance (15) of adjacent V0 vias in adjacent M0 tracks; and (ii) three instances (19-21) of V0 vias in the same M0 track, separated by an M0 cut of less than one CPP.

FIGS. 3A-D, et seq., as described below, contain examples of cells that meet the DFM objects of the present invention, and collectively comprise the exemplary, inventive library herein.

Reference is now made to FIGS. 3A-D, which depict an an2x1 cell. This cell implements the logic function of a 2-input AND, in drive strength 1. This cell is 4 CPP wide.

Reference is now made to FIGS. 4A-D, which depict an an2x2 cell. This cell implements the logic function of a 2-input AND, in drive strength 2. This cell is 5 CPP wide.

Reference is now made to FIGS. 5A-D, which depict an an3x1 cell. This cell implements the logic function of a 3-input AND, in drive strength 1. This cell is 6 CPP wide.

Reference is now made to FIGS. 6A-D, which depict an an3x2 cell. This cell implements the logic function of a 3-input AND, in drive strength 2. This cell is 7 CPP wide.

Reference is now made to FIGS. 7A-D, which depict an an4x1 cell. This cell implements the logic function of a 4-input AND, in drive strength 1. This cell is 7 CPP wide.

Reference is now made to FIGS. 8A-D, which depict an an4x2 cell. This cell implements the logic function of a 4-input AND, in drive strength 2. This cell is 8 CPP wide.

Reference is now made to FIGS. 9A-D, which depict an ao21x1 cell. This cell implements the logic function OR(AND(a,b),c), in drive strength 1. This cell is 6 CPP wide.

Reference is now made to FIGS. 10A-D, which depict an ao31x1 cell. This cell implements the logic function OR(AND(a,b,c),d), in drive strength 1. This cell is 7 CPP wide.

Reference is now made to FIGS. 11A-D, which depict an ao211x1 cell. This cell implements the logic function OR(AND(a,b),c,d), in drive strength 1. This cell is 7 CPP wide.

Reference is now made to FIGS. 12A-D, which depict an aoi21x1 cell. This cell implements the logic function NOT(OR(AND(a,b),c)), in drive strength 1. This cell is 4 CPP wide.

Reference is now made to FIGS. 13A-D, which depict an aoi21x2 cell. This cell implements the logic function NOT(OR(AND(a,b),c)), in drive strength 2. This cell is 7 CPP wide.

Reference is now made to FIGS. 14A-D, which depict an aoi22x1 cell. This cell implements the logic function NOT(OR(AND(a,b),AND(c,d))), in drive strength 1. This cell is 5 CPP wide.

Reference is now made to FIGS. 15A-D, which depict an aoi22x2 cell. This cell implements the logic function NOT(OR(AND(a,b),AND(c,d))), in drive strength 2. This cell is 9 CPP wide.

Reference is now made to FIGS. 16A-D, which depict an aoi31x1 cell. This cell implements the logic function NOT(OR(AND(a,b,c),d)), in drive strength 1. This cell is 5 CPP wide.

Reference is now made to FIGS. 17A-D, which depict an aoi31x2 cell. This cell implements the logic function NOT(OR(AND(a,b,c),d)), in drive strength 2. This cell is 9 CPP wide.

Reference is now made to FIGS. 18A-D, which depict an aoi211x1 cell. This cell implements the logic function NOT(OR(AND(a,b),c,d)), in drive strength 1. This cell is 5 CPP wide.

Reference is now made to FIGS. 19A-D, which depict an aoi222x1 cell. This cell implements the logic function NOT(OR(AND(a,b),AND(c,d),AND(e,f))), in drive strength 1. This cell is 9 CPP wide.

Reference is now made to FIGS. 20A-D, which depict an bufhx6 cell. This cell implements the logic function of a buffer, in drive strength 6. This cell is 10 CPP wide.

Reference is now made to FIGS. 21A-D, which depict an bufx1 cell. This cell implements the logic function of a buffer, in drive strength 1. This cell is 3 CPP wide.

Reference is now made to FIGS. 22A-D, which depict an bufx2 cell. This cell implements the logic function of a buffer, in drive strength 2. This cell is 4 CPP wide.

Reference is now made to FIGS. 23A-D, which depict an bufx3 cell. This cell implements the logic function of a buffer, in drive strength 3. This cell is 5 CPP wide.

Reference is now made to FIGS. 24A-D, which depict an bufx4 cell. This cell implements the logic function of a buffer, in drive strength 4. This cell is 7 CPP wide.

Reference is now made to FIGS. 25A-D, which depict an bufx6 cell. This cell implements the logic function of a buffer, in drive strength 6. This cell is 9 CPP wide.

Reference is now made to FIGS. 26A-D, which depict an bufx8 cell. This cell implements the logic function of a buffer, in drive strength 8. This cell is 12 CPP wide.

Reference is now made to FIGS. 27A-D, which depict an ckor2lban2x1 cell. This cell implements the logic function of a clock-gating latch, in drive strength 1. This cell is 17 CPP wide.

Reference is now made to FIGS. 28A-D, which depict an dlyx1 cell. This cell implements the logic function of a delay gate, in drive strength 1. This cell is 9 CPP wide.

Reference is now made to FIGS. 29A-D, which depict an fax1 cell. This cell implements the logic function of a full adder, in drive strength 1. This double-height cell is 10 CPP wide.

Reference is now made to FIGS. 30A-D, which depict an hax1 cell. This cell implements the logic function of a half adder, in drive strength 1. This double-height cell is 8 CPP wide.

Reference is now made to FIGS. 31A-D, which depict an iaoi21x1 cell. This cell implements the logic function NOT(OR(AND(a,b),c)), with one of the inputs inverted, in drive strength 1. This cell is 5 CPP wide.

Reference is now made to FIGS. 32A-D, which depict an ind2x1 cell. This cell implements the logic function of a 2-input NAND, with one of the inputs inverted, in drive strength 1. This cell is 4 CPP wide.

Reference is now made to FIGS. 33A-D, which depict an ind2x2 cell. This cell implements the logic function of a 2-input NAND, with one of the inputs inverted, in drive strength 2. This cell is 6 CPP wide.

Reference is now made to FIGS. 34A-D, which depict an ind3x1 cell. This cell implements the logic function of a 3-input NAND, with one of the inputs inverted, in drive strength 1. This cell is 5 CPP wide.

Reference is now made to FIGS. 35A-D, which depict an ind3x2 cell. This cell implements the logic function of a 3-input NAND, with one of the inputs inverted, in drive strength 2. This cell is 8 CPP wide.

Reference is now made to FIGS. 36A-D, which depict an inr2x1 cell. This cell implements the logic function of a 2-input NOR, with one of the inputs inverted, in drive strength 1. This cell is 4 CPP wide.

Reference is now made to FIGS. 37A-D, which depict an inr2x2 cell. This cell implements the logic function of a 2-input NOR, with one of the inputs inverted, in drive strength 2. This cell is 6 CPP wide.

Reference is now made to FIGS. 38A-D, which depict an inr3x1 cell. This cell implements the logic function of a 3-input NOR, with one of the inputs inverted, in drive strength 1. This cell is 5 CPP wide.

Reference is now made to FIGS. 39A-D, which depict an inr3x2 cell. This cell implements the logic function of a 3-input NOR, with one of the inputs inverted, in drive strength 2. This cell is 8 CPP wide.

Reference is now made to FIGS. 40A-D, which depict an invx1 cell. This cell implements the logic function of an inverter, in drive strength 1. This cell is 2 CPP wide.

Reference is now made to FIGS. 41A-D, which depict an invx2 cell. This cell implements the logic function of an inverter, in drive strength 2. This cell is 3 CPP wide.

Reference is now made to FIGS. 42A-D, which depict an invx4 cell. This cell implements the logic function of an inverter, in drive strength 4. This cell is 5 CPP wide.

Reference is now made to FIGS. 43A-D, which depict an invx6 cell. This cell implements the logic function of an inverter, in drive strength 6. This cell is 7 CPP wide.

Reference is now made to FIGS. 44A-D, which depict an invx8 cell. This cell implements the logic function of an inverter, in drive strength 8. This cell is 9 CPP wide.

Reference is now made to FIGS. 45A-D, which depict an ioai21x1 cell. This cell implements the logic function NOT(AND(OR(a,b),c)), with one of the inputs inverted, in drive strength 1. This cell is 5 CPP wide.

Reference is now made to FIGS. 46A-D, which depict an latqx1 cell. This cell implements the logic function of a latch, in drive strength 1. This cell is 13 CPP wide.

Reference is now made to FIGS. 47A-D, which depict an mux2x1 cell. This cell implements the logic function of a 2-input MUX, in drive strength 1. This cell is 9 CPP wide.

Reference is now made to FIGS. 48A-D, which depict an mux2x2 cell. This cell implements the logic function of a 2-input MUX, in drive strength 2. This cell is 9 CPP wide.

Reference is now made to FIGS. 49A-D, which depict an muxi2x1 cell. This cell implements the logic function of a 2-input MUX, with one of its inputs inverted, in drive strength 1. This cell is 7 CPP wide.

Reference is now made to FIGS. 50A-D, which depict an nd2x1 cell. This cell implements the logic function of a 2-input NAND, in drive strength 1. This cell is 3 CPP wide.

Reference is now made to FIGS. 51A-D, which depict an nd2x2 cell. This cell implements the logic function of a 2-input NAND, in drive strength 2. This cell is 5 CPP wide.

Reference is now made to FIGS. 52A-D, which depict an nd2x3 cell. This cell implements the logic function of a 2-input NAND, in drive strength 3. This cell is 7 CPP wide.

Reference is now made to FIGS. 53A-D, which depict an nd2x4 cell. This cell implements the logic function of a 2-input NAND, in drive strength 4. This cell is 9 CPP wide.

Reference is now made to FIGS. 54A-D, which depict an nd3x1 cell. This cell implements the logic function of a 3-input NAND, in drive strength 1. This cell is 4 CPP wide.

Reference is now made to FIGS. 55A-D, which depict an nd3x2 cell. This cell implements the logic function of a 3-input NAND, in drive strength 2. This cell is 7 CPP wide.

Reference is now made to FIGS. 56A-D, which depict an nd3x3 cell. This cell implements the logic function of a 3-input NAND, in drive strength 3. This cell is 10 CPP wide.

Reference is now made to FIGS. 57A-D, which depict an nd3x4 cell. This cell implements the logic function of a 3-input NAND, in drive strength 4. This cell is 13 CPP wide.

Reference is now made to FIGS. 58A-D, which depict an nd4x1 cell. This cell implements the logic function of a 4-input NAND, in drive strength 1. This cell is 5 CPP wide.

Reference is now made to FIGS. 59A-D, which depict an nd4x2 cell. This cell implements the logic function of a 4-input NAND, in drive strength 2. This cell is 9 CPP wide.

Reference is now made to FIGS. 60A-D, which depict an nr2x1 cell. This cell implements the logic function of a 2-input NOR, in drive strength 1. This cell is 3 CPP wide.

Reference is now made to FIGS. 61A-D, which depict an nr2x2 cell. This cell implements the logic function of a 2-input NOR, in drive strength 2. This cell is 5 CPP wide.

Reference is now made to FIGS. 61.1A-D, which depict an nr2x3 cell. This cell implements the logic function of a 2-input NOR, in drive strength 3. This cell is 7 CPP wide.

Reference is now made to FIGS. 62A-D, which depict an nr2x4 cell. This cell implements the logic function of a 2-input NOR, in drive strength 4. This cell is 9 CPP wide.

Reference is now made to FIGS. 63A-D, which depict an nr3x1 cell. This cell implements the logic function of a 3-input NOR, in drive strength 1. This cell is 4 CPP wide.

Reference is now made to FIGS. 64A-D, which depict an nr3x2 cell. This cell implements the logic function of a 3-input NOR, in drive strength 2. This cell is 7 CPP wide.

Reference is now made to FIGS. 65A-D, which depict an nr3x3 cell. This cell implements the logic function of a 3-input NOR, in drive strength 3. This cell is 10 CPP wide.

Reference is now made to FIGS. 66A-D, which depict an nr3x4 cell. This cell implements the logic function of a 3-input NOR, in drive strength 4. This cell is 13 CPP wide.

Reference is now made to FIGS. 67A-D, which depict an nr4x1 cell. This cell implements the logic function of a 4-input NOR, in drive strength 1. This cell is 5 CPP wide.

Reference is now made to FIGS. 68A-D, which depict an nr4x2 cell. This cell implements the logic function of a 4-input NOR, in drive strength 2. This cell is 9 CPP wide.

Reference is now made to FIGS. 69A-D, which depict an oa21x1 cell. This cell implements the logic function AND(OR(a,b),c), in drive strength 1. This cell is 6 CPP wide.

Reference is now made to FIGS. 70A-D, which depict an oa31x1 cell. This cell implements the logic function AND(OR(a,b,c),d), in drive strength 1. This cell is 7 CPP wide.

Reference is now made to FIGS. 71A-D, which depict an oa211x1 cell. This cell implements the logic function AND(OR(a,b),c,d), in drive strength 1. This cell is 7 CPP wide.

Reference is now made to FIGS. 72A-D, which depict an oai21x1 cell. This cell implements the logic function NOT(AND(OR(a,b),c)), in drive strength 1. This cell is 4 CPP wide.

Reference is now made to FIGS. 73A-D, which depict an oai21x2 cell. This cell implements the logic function NOT(AND(OR(a,b),c)), in drive strength 2. This cell is 7 CPP wide.

Reference is now made to FIGS. 74A-D, which depict an oai22x1 cell. This cell implements the logic function NOT(AND(OR(a,b),OR(c,d))), in drive strength 1. This cell is 5 CPP wide.

Reference is now made to FIGS. 75A-D, which depict an oai22x2 cell. This cell implements the logic function NOT(AND(OR(a,b),OR(c,d))), in drive strength 2. This cell is 9 CPP wide.

Reference is now made to FIGS. 76A-D, which depict an oai31x1 cell. This cell implements the logic function NOT(AND(OR(a,b,c),d)), in drive strength 1. This cell is 5 CPP wide.

Reference is now made to FIGS. 77A-D, which depict an oai31x2 cell. This cell implements the logic function NOT(AND(OR(a,b,c),d)), in drive strength 2. This cell is 9 CPP wide.

Reference is now made to FIGS. 78A-D, which depict an oai211x1 cell. This cell implements the logic function NOT(AND(OR(a,b),c,d)), in drive strength 1. This cell is 5 CPP wide.

Reference is now made to FIGS. 79A-D, which depict an oai222x1 cell. This cell implements the logic function NOT(AND(OR(a,b),OR(c,d),OR(e,f))), in drive strength 1. This cell is 9 CPP wide.

Reference is now made to FIGS. 80A-D, which depict an or2x1 cell. This cell implements the logic function of a 2-input OR, in drive strength 1. This cell is 4 CPP wide.

Reference is now made to FIGS. 81A-D, which depict an or2x2 cell. This cell implements the logic function of a 2-input OR, in drive strength 2. This cell is 5 CPP wide.

Reference is now made to FIGS. 82A-D, which depict an or3x1 cell. This cell implements the logic function of a 3-input OR, in drive strength 1. This cell is 6 CPP wide.

Reference is now made to FIGS. 83A-D, which depict an or3x2 cell. This cell implements the logic function of a 3-input OR, in drive strength 2. This cell is 7 CPP wide.

Reference is now made to FIGS. 84A-D, which depict an or4x1 cell. This cell implements the logic function of a 4-input OR, in drive strength 1. This cell is 7 CPP wide.

Reference is now made to FIGS. 85A-D, which depict an or4x2 cell. This cell implements the logic function of a 4-input OR, in drive strength 2. This cell is 8 CPP wide.

Reference is now made to FIGS. 86A-D, which depict an sdffqx1 cell. This cell implements the logic function of a scan-enabled D flip-flop, in drive strength 1. This double-height cell is 13 CPP wide.

Reference is now made to FIGS. 87A-D, which depict an sdffrsqx1 cell. This cell implements the logic function of a scan-enabled D flip-flop, with set and reset, in drive strength 1. This double-height cell is 17 CPP wide.

Reference is now made to FIGS. 88A-D, which depict an tiehix1 cell. This cell implements the logic function 1, in drive strength 1. This cell is 3 CPP wide.

Reference is now made to FIGS. 89A-D, which depict an tielox1 cell. This cell implements the logic function 0, in drive strength 1. This cell is 3 CPP wide.

Reference is now made to FIGS. 90A-D, which depict an xnr2x1 cell. This cell implements the logic function of a 2-input XNOR, in drive strength 1. This cell is 11 CPP wide.

Reference is now made to FIGS. 91A-D, which depict an xor2x1 cell. This cell implements the logic function of a 2-input XOR, in drive strength 1. This cell is 11 CPP wide.

What is claimed in this application is:

1. A scan-enabled, D flip-flop cell, implemented in a double-height standard cell form, said flip-flop comprising:
   three rectangular power rails, including a top rail, middle rail, and bottom rail, each of the rails formed in a first metal (M0) layer, with the top and bottom rails patterned using a different M0 mask than the middle rail, each of the rails extending uncut, horizontally across the entire cell, each of the rails having a vertical width at least twice a minimum permitted width for M0 patterning;
   a plurality of at least thirteen parallel, evenly-spaced, minimum width gate stripes, each formed in a gate (PC) layer, and each extending vertically between the top and bottom rails, adjacent gate stripes separated by a center-to-center spacing CPP;
   positioned vertically between the top and middle rails, two first-exposure M0 tracks, each of the first-exposure M0 tracks having the minimum permitted M0 width and extending horizontally across the cell, said first-exposure M0 tracks patterned, in part, by portion(s) of a first-exposure M0 mask (M0_color1) and, in part, by portion(s) of a first-exposure M0 cut mask (M0CUT1);
   positioned vertically between the top and middle rails, two second-exposure M0 tracks, each of the second-exposure M0 tracks having the minimum permitted M0 width and extending horizontally across the cell, said second-exposure M0 tracks patterned, in part, by portion(s) of a second-exposure M0 mask (M0_color2) and, in part, by portion(s) of a second-exposure M0 cut mask (M0CUT2);
   positioned vertically between the bottom and middle rails, two first-exposure M0 tracks, each of the first-exposure M0 tracks having the minimum permitted M0 width and extending horizontally across the cell, said first-exposure M0 tracks patterned, in part, by portion(s) of the M0_color1 mask and, in part, by portion(s) of the M0CUT1 mask;
   positioned vertically between the bottom and middle rails, two second-exposure M0 tracks, each of the second-exposure M0 tracks having the minimum permitted M0 width and extending horizontally across the cell, said second-exposure M0 tracks patterned, in part, by portion(s) of the M0_color2 mask and, in part, by portion(s) of the M0CUT2 mask;
   a plurality of vias, patterned in a V0 (via to interconnect) layer, each of said plurality of vias instantiated on an M0 track;
   additional patterned features, in NW (N-well), TS (trench silicide), RX (active), CA (contact to active), GO (gate open), and M1 (first-level interconnect) layers, configured to realize the D flip-flop logical behavior of the cell;
   characterized in that:
      none of the M0 cuts overlaps a gate stripe; and,
      the separation between the V0 vias is greater than the gap between adjacent M0 tracks.

2. The flip-flop cell of claim 1, wherein said flip-flop cell is thirteen CPP wide.

3. The flip-flop cell of claim 1, wherein said flip-flop cell is seventeen CPP wide.

4. The flip-flop cell of claim 1, wherein:
   all M0CUT1 features are rectangular in shape, with a left edge, right edge, top edge, and bottom edge, and as between any two first and second M0CUT1 features within the cell, there is at least 1.7×CPP of spacing between all points at which the left edge of the first M0CUT1 feature intersects an M0color1 feature and all points at which the left edge of the second M0CUT1 feature intersects an M0color1 feature, and there is at least 1.7×CPP of spacing between all points at which the right edge of the first M0CUT1 feature intersects an M0color1 feature and all points at which the right edge of the second M0CUT1 feature intersects an M0color1 feature; and,
   all M0CUT2 features are rectangular in shape, with a left edge, right edge, top edge, and bottom edge, and as between any two first and second M0CUT2 features within the cell, there is at least 1.7×CPP of spacing between all points at which the left edge of the first M0CUT2 feature intersects an M0color2 feature and all points at which the left edge of the second M0CUT2 feature intersects an M0color2 feature, and there is at least 1.7×CPP of spacing between all points at which the right edge of the first M0CUT2 feature intersects an M0color2 feature and all points at which the right edge of the second M0CUT2 feature intersects an M0color2 feature.

5. The flip-flop cell of claim 1, wherein:
each of said plurality of vias is spaced at least 0.8×CPP from the nearest cut in the M0 track in which said via is instantiated, where said spacing is measured as the horizontal distance between the center of the via and the center of the cut.

6. The flip-flop cell of claim 5, wherein:
each of said plurality of vias is spaced at least 0.9×CPP from the nearest cut in the M0 track in which said via is instantiated, where said spacing is measured as the horizontal distance between the center of the via and the center of the cut.

7. The flip-flop cell of claim 1, instantiated on a silicon chip.

8. The flip-flop cell of claim 1, instantiated as instructions for patterning features on a silicon wafer.

9. The flip-flop cell of claim 8, wherein the instructions are contained in a non-transient, computer-readable medium in GDSII format.

10. A flip-flop cell, comprising:
means for implementing the logical behavior of scan-enabled D flip-flop, using:
three rectangular power rails, including a top rail, middle rail, and bottom rail, each of the rails formed in a first metal (M0) layer;
exactly thirteen parallel, evenly-spaced, minimum width gate stripes, each formed in a gate (PC) layer, and each extending vertically between the top and bottom rails, adjacent gate stripes separated by a center-to-center spacing CPP;
positioned vertically between the top and middle rails, exactly two first-exposure M0 tracks, each of the first-exposure M0 tracks having a minimum permitted M0 width and extending horizontally across the cell, said first-exposure M0 tracks patterned, in part, by portion(s) of a first-exposure M0 mask (M0_color1) and, in part, by portion(s) of a first-exposure M0 cut mask (M0CUT1);
positioned vertically between the top and middle rails, exactly two second-exposure M0 tracks, each of the second-exposure M0 tracks having the minimum permitted M0 width and extending horizontally across the cell, said second-exposure M0 tracks patterned, in part, by portion(s) of a second-exposure M0 mask (M0_color2) and, in part, by portion(s) of a second-exposure M0 cut mask (M0CUT2);
positioned vertically between the bottom and middle rails, exactly two first-exposure M0 tracks, each of the first-exposure M0 tracks having the minimum permitted M0 width and extending horizontally across the cell, said first-exposure M0 tracks patterned, in part, by portion(s) of the M0_color1 mask and, in part, by portion(s) of the M0CUT1 mask;
positioned vertically between the bottom and middle rails, exactly two second-exposure M0 tracks, each of the second-exposure M0 tracks having the minimum permitted M0 width and extending horizontally across the cell, said second-exposure M0 tracks patterned, in part, by portion(s) of the M0_color2 mask and, in part, by portion(s) of the M0CUT2 mask;
a plurality of vias, patterned in a V0 (via to interconnect) layer, each of said plurality of vias instantiated on an M0 track; and,
additional patterned features, in NW (N-well), TS (trench silicide), RX (active), CA (contact to active), GO (gate open), and M1 (first-level interconnect) layers, configured to realize the D flip-flop logical behavior of the cell;
characterized in that:
none of the M0 cuts overlaps a gate stripe; and,
the separation between the V0 vias is greater than the gap between adjacent M0 tracks.

11. The flip-flop cell of claim 10, wherein the top and bottom rails are patterned using a different M0 mask than the middle rail, and each of the rails extends uncut, horizontally across the entire cell.

12. The flip-flop cell of claim 11, wherein each of the rails has a vertical width exactly three times the vertical width of the M0 tracks.

13. The flip-flop cell of claim 10, wherein:
all M0CUT1 features are rectangular in shape, with a left edge, right edge, top edge, and bottom edge, and as between any two first and second M0CUT1 features within the cell, there is at least 1.7×CPP of spacing between all points at which the left edge of the first M0CUT1 feature intersects an M0color1 feature and all points at which the left edge of the second M0CUT1 feature intersects an M0color1 feature, and there is at least 1.7×CPP of spacing between all points at which the right edge of the first M0CUT1 feature intersects an M0color1 feature and all points at which the right edge of the second M0CUT1 feature intersects an M0color1 feature; and,
all M0CUT2 features are rectangular in shape, with a left edge, right edge, top edge, and bottom edge, and as between any two first and second M0CUT2 features within the cell, there is at least 1.7×CPP of spacing between all points at which the left edge of the first M0CUT2 feature intersects an M0color2 feature and all points at which the left edge of the second M0CUT2 feature intersects an M0color2 feature, and there is at least 1.7×CPP of spacing between all points at which the right edge of the first M0CUT2 feature intersects an M0color2 feature and all points at which the right edge of the second M0CUT2 feature intersects an M0color2 feature.

14. The flip-flop cell of claim 10, wherein:
each of said plurality of vias is spaced at least 0.8×CPP from the nearest cut in the M0 track in which said via is instantiated, where said spacing is measured as the horizontal distance between the center of the via and the center of the cut.

15. The flip-flop cell of claim 14, wherein:
each of said plurality of vias is spaced at least 0.9×CPP from the nearest cut in the M0 track in which said via is instantiated, where said spacing is measured as the horizontal distance between the center of the via and the center of the cut.

16. The flip-flop cell of claim 10, instantiated on a silicon chip.

17. The flip-flop cell of claim 10, instantiated as instructions for patterning features on a silicon wafer.

18. The flip-flop of claim 17, wherein the instructions are contained in a non-transient, computer-readable medium in GDSII format.

19. A flip-flop cell, comprising:
means for implementing the logical behavior of scan-enabled D flip-flop, with set and reset, using:
three rectangular power rails, including a top rail, middle rail, and bottom rail, each of the rails formed in a first metal (M0) layer;

exactly seventeen parallel, evenly-spaced, minimum width gate stripes, each formed in a gate (PC) layer, and each extending vertically between the top and bottom rails, adjacent gate stripes separated by a center-to-center spacing CPP;

positioned vertically between the top and middle rails, exactly two first-exposure M0 tracks, each of the first-exposure M0 tracks having a minimum permitted M0 width and extending horizontally across the cell, said first-exposure M0 tracks patterned, in part, by portion(s) of a first-exposure M0 mask (M0_color1) and, in part, by portion(s) of a first-exposure M0 cut mask (M0CUT1);

positioned vertically between the top and middle rails, exactly two second-exposure M0 tracks, each of the second-exposure M0 tracks having the minimum permitted M0 width and extending horizontally across the cell, said second-exposure M0 tracks patterned, in part, by portion(s) of a second-exposure M0 mask (M0_color2) and, in part, by portion(s) of a second-exposure M0 cut mask (M0CUT2);

positioned vertically between the bottom and middle rails, exactly two first-exposure M0 tracks, each of the first-exposure M0 tracks having the minimum permitted M0 width and extending horizontally across the cell, said first-exposure M0 tracks patterned, in part, by portion(s) of the M0_color1 mask and, in part, by portion(s) of the M0CUT1 mask;

positioned vertically between the bottom and middle rails, exactly two second-exposure M0 tracks, each of the second-exposure M0 tracks having the minimum permitted M0 width and extending horizontally across the cell, said second-exposure M0 tracks patterned, in part, by portion(s) of the M0_color2 mask and, in part, by portion(s) of the M0CUT2 mask;

a plurality of vias, patterned in a V0 (via to interconnect) layer, each of said plurality of vias instantiated on an M0 track; and, additional patterned features, in NW (N-well), TS (trench silicide), RX (active), CA (contact to active), GO (gate open), and M1 (first-level interconnect) layers, configured to realize the D flip-flop logical behavior of the cell;

characterized in that:
none of the M0 cuts overlaps a gate stripe; and,
the separation between the V0 vias is greater than the gap between adjacent M0 tracks.

20. The flip-flop cell of claim 19, wherein the top and bottom rails are patterned using a different M0 mask than the middle rail, and each of the rails extends uncut, horizontally across the entire cell.

21. The flip-flop cell of claim 20, wherein each of the rails has a vertical width exactly three times the vertical width of the M0 tracks.

22. The flip-flop cell of claim 19, wherein:
all M0CUT1 features are rectangular in shape, with a left edge, right edge, top edge, and bottom edge, and as between any two first and second M0CUT1 features within the cell, there is at least 1.7×CPP of spacing between all points at which the left edge of the first M0CUT1 feature intersects an M0color1 feature and all points at which the left edge of the second M0CUT1 feature intersects an M0color1 feature, and there is at least 1.7×CPP of spacing between all points at which the right edge of the first M0CUT1 feature intersects an M0color1 feature and all points at which the right edge of the second M0CUT1 feature intersects an M0color1 feature; and, all M0CUT2 features are rectangular in shape, with a left edge, right edge, top edge, and bottom edge, and as between any two first and second M0CUT2 features within the cell, there is at least 1.7×CPP of spacing between all points at which the left edge of the first M0CUT2 feature intersects an M0color2 feature and all points at which the left edge of the second M0CUT2 feature intersects an M0color2 feature, and there is at least 1.7×CPP of spacing between all points at which the right edge of the first M0CUT2 feature intersects an M0color2 feature and all points at which the right edge of the second M0CUT2 feature intersects an M0color2 feature.

23. The flip-flop cell of claim 19, wherein:
each of said plurality of vias is spaced at least 0.8×CPP from the nearest cut in the M0 track in which said via is instantiated, where said spacing is measured as the horizontal distance between the center of the via and the center of the cut.

24. The flip-flop cell of claim 23, wherein:
each of said plurality of vias is spaced at least 0.9×CPP from the nearest cut in the M0 track in which said via is instantiated, where said spacing is measured as the horizontal distance between the center of the via and the center of the cut.

25. The flip-flop cell of claim 19, instantiated on a silicon chip.

26. The flip-flop cell of claim 19, instantiated as instructions for patterning features on a silicon wafer.

27. The flip-flop of claim 26, wherein the instructions are contained in a non-transient, computer-readable medium in GDSII format.

* * * * *